(12) United States Patent
Hatakeyama

(10) Patent No.: US 10,996,378 B2
(45) Date of Patent: May 4, 2021

(54) ANTIREFLECTIVE FILM, METHOD OF PRODUCING ANTIREFLECTIVE FILM, AND EYEGLASS TYPE DISPLAY

(71) Applicant: SHIN-ETSU CHEMICAL CO., LTD., Tokyo (JP)

(72) Inventor: Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 233 days.

(21) Appl. No.: 16/223,252

(22) Filed: Dec. 18, 2018

(65) Prior Publication Data

US 2019/0196066 A1 Jun. 27, 2019

(30) Foreign Application Priority Data

Dec. 21, 2017 (JP) .............................. JP2017-245565

(51) Int. Cl.
*G02B 1/11* (2015.01)
*G02B 1/118* (2015.01)
(Continued)

(52) U.S. Cl.
CPC .............. *G02B 1/118* (2013.01); *C03C 17/32* (2013.01); *C03C 17/328* (2013.01); *G03F 7/0005* (2013.01); *G03F 7/0007* (2013.01); *G03F 7/0042* (2013.01); *G03F 7/0046* (2013.01); *G03F 7/039* (2013.01); *G03F 7/0392* (2013.01); *G03F 7/0397* (2013.01); *G03F 7/091* (2013.01); *G03F 7/11* (2013.01); *C03C 2217/73* (2013.01); *C03C 2217/732* (2013.01); *C03C 2218/328* (2013.01); *C03C 2218/33* (2013.01)

(58) Field of Classification Search
CPC ..... G02B 1/118; G03F 7/0042; G03F 7/0007; G03F 7/0397; G03F 7/0005; G03F 7/0392; G03F 7/0046; G03F 7/039; G03F 7/11; G03F 7/091; C03C 17/32; C03C 17/328; C03C 2217/732; C03C 2218/328; C03C 2218/33; C03C 2217/73
USPC ....................................... 359/601, 580, 582
See application file for complete search history.

(56) References Cited

U.S. PATENT DOCUMENTS 6,054,991 A    4/2000 Crane et al.
9,905,168 B1 *  2/2018 Richards ............ G02B 27/0172
(Continued)

FOREIGN PATENT DOCUMENTS

DE    202011110173 U1    3/2013
JP    H05-204157 A       8/1993
(Continued)

OTHER PUBLICATIONS

Aug. 27, 2019 Office Action issued in Korean Patent Application No. 10-2018-0165970.
(Continued)

*Primary Examiner* — Audrey Y Chang
(74) *Attorney, Agent, or Firm* — Oliff PLC

(57) ABSTRACT

The present invention is an antireflective film, including: a support base, and a pattern composed of a photoresist material formed on the support base, the index at a point closer to the support base. The present invention provides an antireflective film that is able to give antireflection effect to decrease the reflection of light, a method of producing the same, and an eyeglass type display.

16 Claims, 3 Drawing Sheets

(51) Int. Cl.
  *G03F 7/039* (2006.01)
  *G03F 7/11* (2006.01)
  *C03C 17/32* (2006.01)
  *G03F 7/09* (2006.01)
  *G03F 7/004* (2006.01)
  *G03F 7/00* (2006.01)

(56) References Cited

U.S. PATENT DOCUMENTS

| | | |
|---|---|---|
| 2002/0161148 A1 | 10/2002 | Harada et al. |
| 2005/0227173 A1 | 10/2005 | Hatakeyama et al. |
| 2005/0227174 A1 | 10/2005 | Hatakeyama et al. |
| 2006/0199103 A1* | 9/2006 | Neisser .................. G03F 7/095 430/270.1 |
| 2007/0072115 A1 | 3/2007 | Hatakeyama et al. |
| 2007/0231738 A1 | 10/2007 | Kaneko et al. |
| 2008/0037124 A1 | 2/2008 | Ohmi et al. |
| 2008/0090172 A1 | 4/2008 | Hatakeyama et al. |
| 2008/0118860 A1 | 5/2008 | Harada et al. |
| 2008/0129933 A1 | 6/2008 | Nishida et al. |
| 2008/0227037 A1 | 9/2008 | Hatakeyama et al. |
| 2008/0241736 A1 | 10/2008 | Kobayashi et al. |
| 2010/0203457 A1 | 8/2010 | Hatakeyama |
| 2010/0227273 A1 | 9/2010 | Hatakeyama et al. |
| 2010/0227274 A1 | 9/2010 | Hatakeyama et al. |
| 2010/0244169 A1* | 9/2010 | Maeda .............. H01L 27/14685 257/432 |
| 2012/0069443 A1* | 3/2012 | Taguchi ................ G02B 1/118 359/601 |
| 2013/0021392 A1 | 1/2013 | Travis |
| 2014/0170563 A1 | 6/2014 | Hatakeyama |
| 2016/0370505 A1* | 12/2016 | Koo .................. H01L 27/14685 |
| 2019/0191560 A1* | 6/2019 | Lopez .................. G03F 7/0002 |

FOREIGN PATENT DOCUMENTS

| | | |
|---|---|---|
| JP | H05-215908 A | 8/1993 |
| JP | H05-264802 A | 10/1993 |
| JP | H06-236432 A | 8/1994 |
| JP | 2002-107933 A | 4/2002 |
| JP | 2002-119659 A | 4/2002 |
| JP | 2002-234916 A | 8/2002 |
| JP | 2004-077632 A | 3/2004 |
| JP | 3632771 B2 | 3/2005 |
| JP | 2005-320516 A | 11/2005 |
| JP | 2005-321765 A | 11/2005 |
| JP | 2007-071917 A | 3/2007 |
| JP | 2007-114728 A | 5/2007 |
| JP | 2007-297590 A | 11/2007 |
| JP | 2008-111103 A | 5/2008 |
| JP | 2008-122932 A | 5/2008 |
| JP | 2008-239918 A | 10/2008 |
| JP | 2008-257166 A | 10/2008 |
| JP | 2008-257188 A | 10/2008 |
| JP | 2010-186064 A | 8/2010 |
| JP | 2010-237661 A | 10/2010 |
| JP | 2010-237662 A | 10/2010 |
| JP | 2011-138107 A | 7/2011 |
| JP | 2011-141471 A | 7/2011 |
| JP | 2011-150103 A | 8/2011 |
| JP | 2014-119659 A | 6/2014 |
| JP | 2015-200805 A | 11/2015 |
| TW | 200844475 A | 11/2008 |
| WO | 2005096037 A1 | 10/2005 |

OTHER PUBLICATIONS

Jul. 22, 2019 Office Action issued in Taiwanese Patent Application No. 107145568.

Wilson, S. J. and Hutley, M.C. "The optical properties of 'moth eye' antireflection surfaces". Optica Acta, vol. 29, pp. 993-1009, 1982.

* cited by examiner

[FIG. 1]
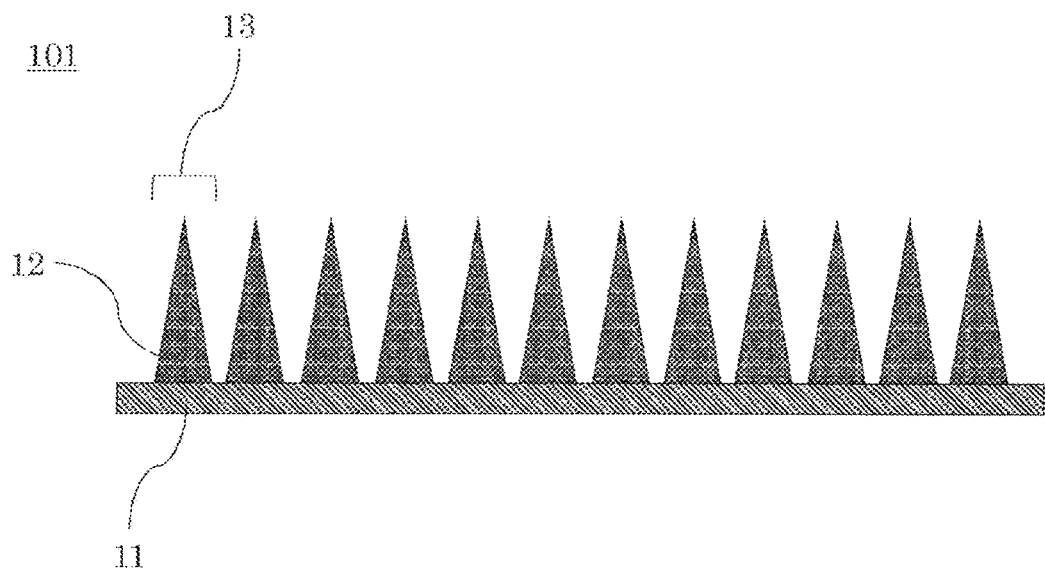
[FIG. 2]
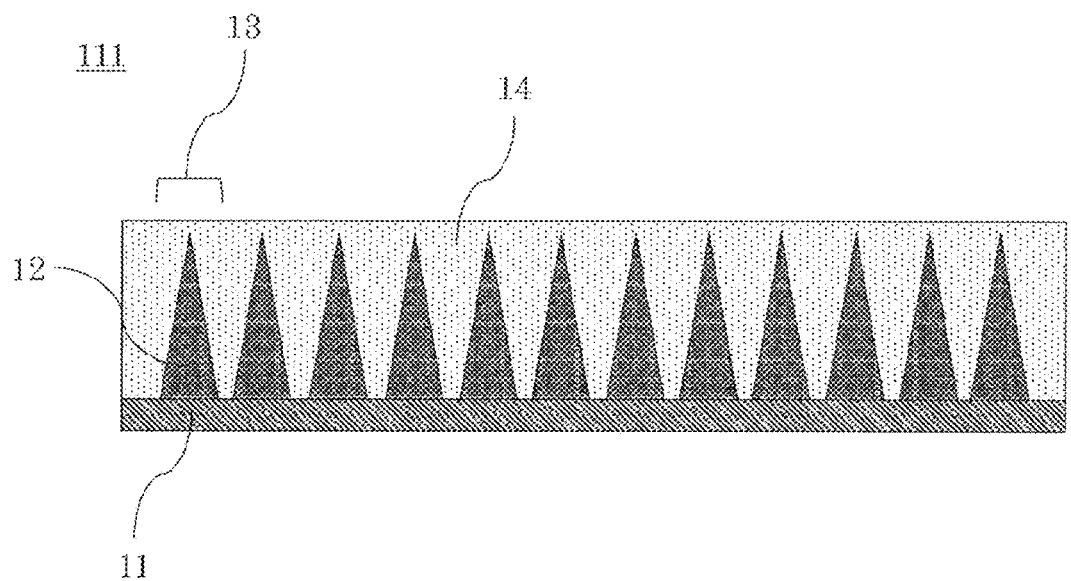

[FIG. 3]
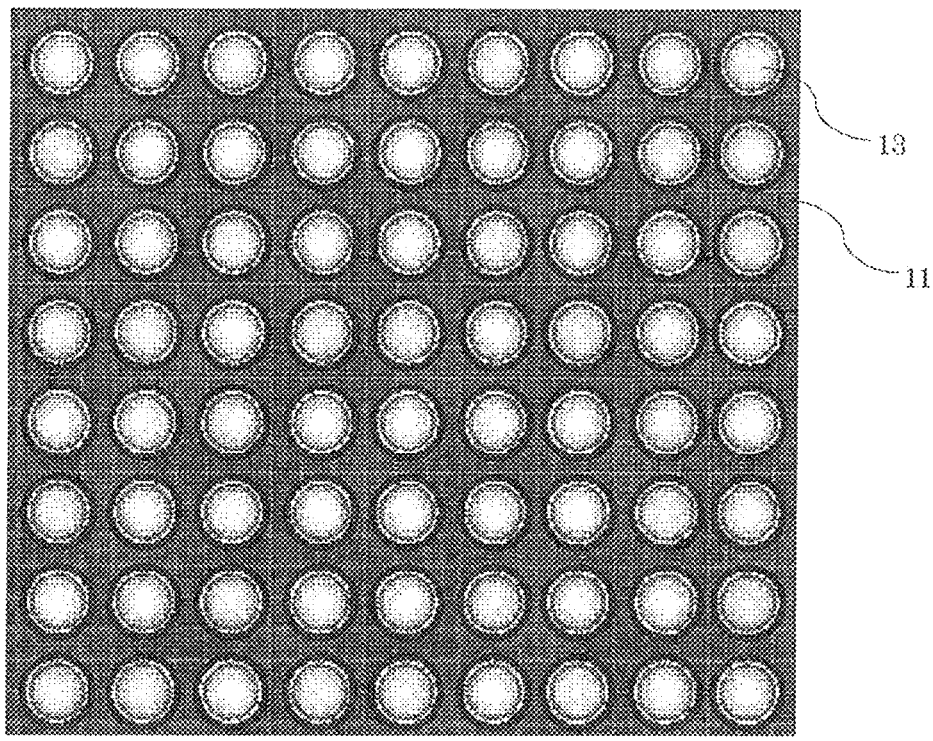
[FIG. 4]
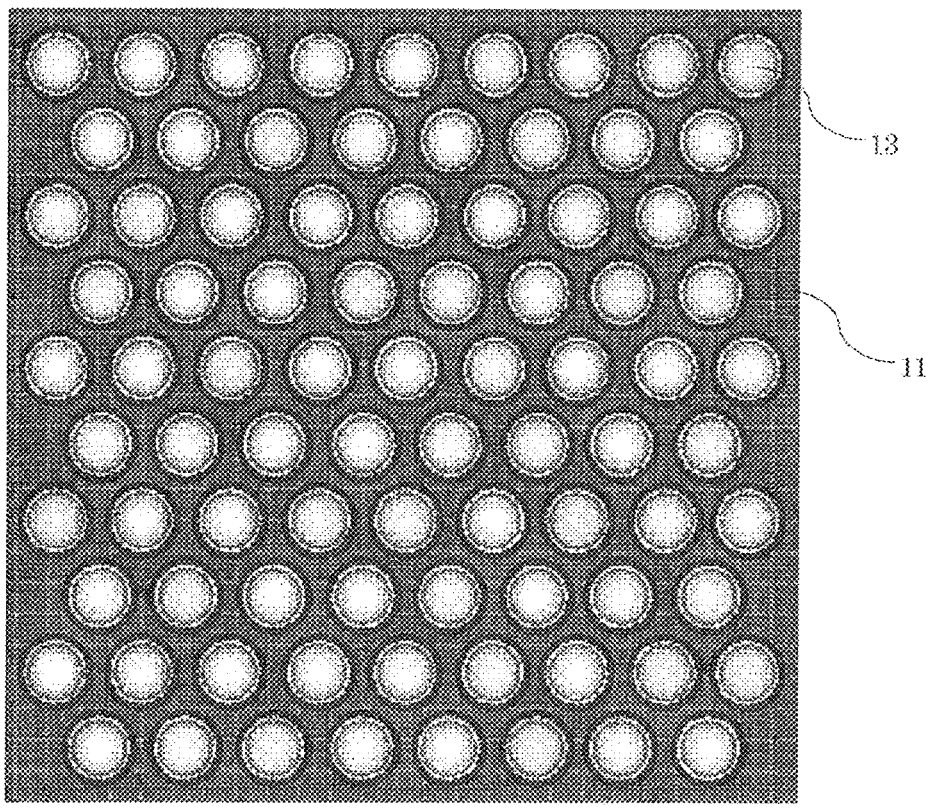

[FIG. 5]
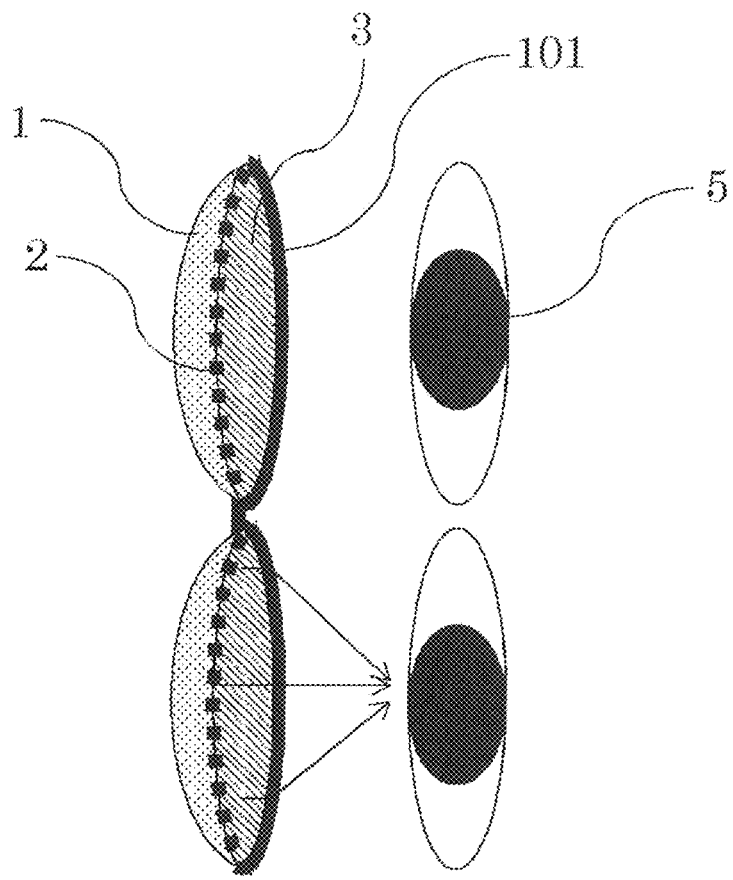
[FIG. 6]
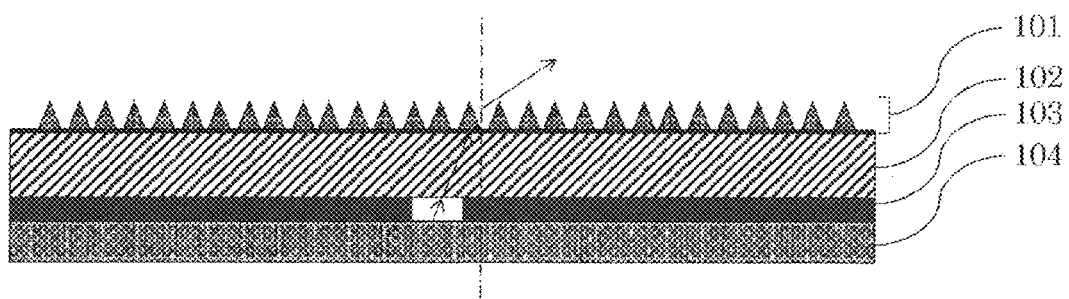

ANTIREFLECTIVE FILM, METHOD OF PRODUCING ANTIREFLECTIVE FILM, AND EYEGLASS TYPE DISPLAY

TECHNICAL FIELD

The present invention relates to an antireflective film for collecting visible light with a shallow incidence angle without reflecting it and for emitting visible light at a shallow angle without reflecting it, a method of producing the antireflective film, and an eyeglass type display using the antireflective film.

BACKGROUND ART

The development of devices for virtual reality (VR) has been advancing. Wearing a goggles type VR, it is possible to watch a movie and to converse with a person remote from each other as if being adjacent to (PATENT LITERATURE 1). It becomes familiar to experience images as if to go beyond space-time, which were shown in SF movies in the past.

In order to obtain real feeling of virtual reality, it has been investigated to reduce the weight and the thickness of the goggles. It is also necessary to replace the pair of goggles itself to an eyeglass type (glasses type), which is lighter in weight, and it will become necessary to contrive devices that enable to experience VR without having glasses. As a technique to form images in space, holography has been known. This makes it possible to experience VR without having goggles or glasses. In the holography, linages in space are formed by highly coherent laser Interference. Due to the weight reduction, miniaturization, price reduction, quality improvement, and increased intensity of laser apparatuses, holography has become familiar recently. It has been proposed a technique to let light through a propagation layer for light to the vertical direction, which is projected using holography (PATENT LITERATURE 2). This is constructed such that light is propagated to the horizontal direction to an eyeglass, and is diffracted to project images to the vertical direction, which is the direction to an eye.

In the holography, resolution and contrast of images are changed due to differences in accuracy and resolution of a pattern to be diffracted. At present, liquid crystal displays and organic EL displays are much better in resolution and contrast of images.

If a head mount display is replaced with an eyeglass type display, which is light in weight, it is possible to reduce the weight substantially. In this case, it becomes necessary to provide a technique to project oblique incident light that is extremely thin, a thin constitution of lenses to focus on an object at a short distance, and a high quality antireflective film material to project light with a shallow incidence angle without reflecting it.

It has long been proposed to provide a display with an antireflective film at the side of eyes (PATENT LITERATURE 3). This allows images projected from a display to be seen in a highly contrast state without losing the intensity. It has also been demonstrated that a multi-layer antireflective film is effective as the antireflective film (PATENT LITERATURE 4). To prevent reflections with respect to visible lights with various wavelength and lights at various angles, multi-layer antireflective films are favorable.

An antireflective film with a moth eye structure has been proposed (NON-PATENT LITERATURE 1). The reason why moths can detect light with high efficiency even in darkness Is that the surface of their eye has a structure with repeated minute projections. This structure is artificially formed in an antireflection film, which has been proposed (PATENT LITERATURE 5). In this film, massed pillars with higher refractive index are formed in which the pillar is finer than the wavelength, finer at the tip and thicker at the substrate side, thereby making the refractive index be lower at the tip and higher at the substrate side. The moth eye structure can realize effect that is similar in the case of multilayer antireflective film.

The antireflective film with a moth eye structure is formed by imprint technique in which a printing block is pushed against resin, and the resin is trans formed while heating under certain circumstances. The imprint method involves a drawback of wearing of the printing block, which makes it impossible to form a pattern. The moth eye structure itself involves a problem that the antireflective function lowers when a foreign matter sticks to the pillars or the pillar breaks.

As for the moth eye structure, PATENT LITERATURE 6 proposes use of a fluorine-containing resin at the top portion of the pattern. In this case, fluorination is performed to increase the fluorine content of the film surface by means of treatment with fluorine gas.

Fluorine-containing lower refractive index-resists have been proposed (PATENT LITERATURES 7, 8, 9). Among fluorine-containing groups, fluoroalcohol groups are acidic and have merits of higher affinity for alkali to prevent swelling in development.

PATENT LITERATURE 10 proposes an immersion lithography resist with the water repellency being improved by blending a polymer containing many fluorine and a polymer with no fluorine or low fluorine content, spin coating the same, followed by segregating the polymer containing many fluorine at the film surface.

CITATION LIST

Patent Literature

PATENT LITERATURE 1: Japanese Patent Laid-Open Publication (Kokai) No. H06-236432
PATENT LITERATURE 2: US 2013/0021392A1
PATENT LITERATURE 3: Japanese Patent Laid-Open Publication (Kokai) No. H05-215908
PATENT LITERATURE 1: Japanese Patent Laid-Open Publication (Kokai) No. H05-264802
PATENT LITERATURE 5: Japanese Patent Laid-Open Publication (Kokai) No. 2004-77632
PATENT LITERATURE 6: WO 2005/096037A1
PATENT LITERATURE 7: Japanese Patent Laid-Open Publication (Kokai) No. 2005-321765
PATENT LITERATURE 8: Japanese Patent Laid-Open Publication (Kokai) No. 2005-320516
PATENT LITERATURE 9: Japanese Patent Laid-Open Publication (Kokai) No. 2002-234916
PATENT LITERATURE 10: Japanese Patent Laid-Open Publication (Kokai) No. 2007-297590

Non Patent Literature

NON-PATENT LITERATURE 1: Optica Acta: International Journal of Optics, Vol. 29, p 993-1009 (1982)

SUMMARY OF INVENTION

Technical Problem

The present invention was accomplished in view of the above-described problems. It is an object of the present invention to provide an antireflective film that is able to give antireflection effect to decrease the reflection of light, a method of producing the same, and an eyeglass type display.

Solution to Problem

To solve the above problems, the present invention provides an antireflective film, comprising:

a support base, and a pattern composed of a photoresist material formed on the support base, the pattern having a larger size and a larger refractive index at a point closer to the support base.

The inventive antireflective film is able to give antireflection effect to decrease the reflection of light.

It is preferable that the pattern have a pitch of 400 nm or less.

The antireflective film having such a pattern pitch is able to prevent diffuse reflection on the pattern.

It is preferable that the photoresist material contain an aromatic group-containing polymer compound and a fluorine-containing polymer compound, and the fluorine-containing polymer compound be segregated at, or oriented to the distant side from the support base. Incidentally, "the fluorine-containing polymer compound is oriented to the distant side from the support base" means, for example, that the fluorine-containing polymer compound is mainly disposed or located to the distant side from the support base.

It is also preferable that the aromatic group-containing polymer compound have a refractive index of 1.6 or more with respect to visible light having a wavelength of 590 to 610 nm, and the fluorine-containing polymer compound have a refractive index of 1.5 or less with respect to visible light having a wavelength of 590 to 610 nm.

The photoresist material preferably contains a polymer compound that contains 85% or more of a repeating unit having at least one structure selected from the group consisting of naphthalene, fluorene, anthracene, and cyclopentadienyl complexes.

The photoresist material preferably contains a polymer compound that contains 50% or more of a repeating unit having any of styrene substituted with iodine or bromine, benzene (meth)acrylate substituted with iodine or bromine, and benzene (meth)acrylamide substituted with iodine or bromine.

When the photoresist material is as described above, the moth eye pattern is readily produced, and the antireflective film can give more enhanced antireflection effect.

It is preferable that the pattern be covered with a low-refractive-index material having a refractive index of 1.45 or less with respect to visible light having a wavelength of 530 to 610 nm.

In the antireflective film like this, it is possible to prevent lowering of antireflection effect due to pattern collapse.

The antireflective film is preferably such that the transmittance of visible light having a wavelength of 400 to 300 nm is 80% or more.

The antireflective film with such transmittance can be preferably used for a light-weight and thin eyeglass-type head mount display by which light with higher brightness and higher contrast can be seen.

The present invention also provides an eyeglass type display, comprising:

a self-emitting display selected from the group consisting of liquid crystal, organic EL, and micro LED installed on a substrate at the side of an eyeball of the eyeglass type display, and a convex lens for focusing installed on the side of an eyeball of the self-emitting display, wherein the antireflective film described above is formed on a surface of the convex lens.

The inventive eyeglass type display can be preferably used as a light-weight and thin eyeglass-type head mount display by which light with higher brightness and higher contrast can be seen.

The present invention also provides a method of producing an antireflective film, comprising:

coating a support base with a photoresist material that contains an aromatic group-containing polymer compound and a fluorine-containing polymer compound, baking the photoresist material to segregate, or orient the fluorine-containing polymer compound to a film surface, and subsequently exposing and developing the photoresist material to form a pattern having a larger size and a larger refractive index at a point closer to the support base.

The inventive method of producing an antireflective film facilitates manufacturing an antireflective film that is allowed to have antireflective effect to exhibit lower reflection of light. Incidentally, "to orient the fluorine-containing polymer compound to a film surface" means, for example, disposing the fluorine-containing polymer compound mainly to the distant side from the support base, that is, the surface side of the coating film.

It is preferable to set the pattern to have a pitch of 400 nm or less.

With the pattern pitch like this, it is possible to manufacture an antireflective film capable of preventing diffuse reflection on the pattern.

It is preferable that the aromatic group-containing polymer compound have a refractive index of 1.6 or more with respect to visible light having a wavelength of 530 to 610 nm, and the fluorine-containing polymer compound have a refractive index of 1.5 or less with respect to visible light having a wavelength of 590 to 610 nm.

It is preferable to use the photoresist material containing a polymer compound that contains 85% or more of a repeating unit having at least one structure selected from the group consisting of naphthalene, fluorene, anthracene, and cyclopentadienyl complexes.

It is preferable to use the photoresist material containing a polymer compound that contains 50% or more of a repeating unit having any of styrene substituted with iodine or bromine, benzene (meth)acrylate substituted with iodine or bromine, and benzene (meth)acrylamide substituted with iodine or bromine.

Using the photoresist material described above, it becomes easier to manufacture an antireflective film that can give still more enhanced antireflective effect.

After forming the pattern, it is preferable to cover the pattern with a low-refractive-index material having a refractive index of 1.45 or less with respect to visible light having a wavelength of 590 to 610 nm.

Including the step like this, the production method makes it possible to manufacture an antireflective film that is prevented from lowering of antireflection effect due to pattern collapse.

Advantageous Effects of Invention

As described above, in the antireflective film of the present invention, a moth eye-type antireflective film is successfully formed with a pattern in a tapered profile formed by exposure and development using a photoresist based on a highly refractive polymer. This makes it possible to obtain antireflective effect, which exhibits lower reflection of visible light even to incident light and emitted light with a shallow angle. Accordingly, when it is combined, with a lens(es) with a high refractive index, light emitted from liquid crystal, organic EL, and micro LED that are installed near eyes can be seen in the state of higher contrast and higher brightness. The inventive method of producing an antireflective film makes it possible to form the inventive antireflective film easily. Moreover, using the inventive antireflective film, it is possible to realize an eyeglass type display which is substantially light in weight and thin compared to previous head mount displays.

BRIEF DESCRIPTION OF DRAWINGS

FIG. 1 is at schematic sectional view showing an example ox the inventive antireflective film after forming a highly refractive resist pattern;

FIG. 2 is a schematic sectional view showing an example of the inventive antireflective film after forming a highly refractive resist pattern and forming a lower refractive film thereon;

FIG. 3 is a schematic top view showing an example of a pattern layout of the inventive antireflective film after forming a highly refractive resist pattern;

FIG. 4 is a schematic top view showing another example of a pattern layout of the inventive antireflective film after forming a highly refractive resist pattern;

FIG. 5 is a schematic sectional view showing an example of the case of wearing the inventive eyeglass type display;

FIG. 6 is a schematic sectional view showing a method of measuring light transmittance of the inventive antireflective film in Examples.

DESCRIPTION OF EMBODIMENTS

As described above, it has been known that excellent antireflective effect can be obtained by installing a film with a lower refractive index at the side of air (eyes), a film with a higher refractive index at the side of generating light, which is opposite to the eye, and a multilayer film therebetween in which the refractive Index alters gradually. However, the refractive index is an intrinsic value of each material. Accordingly, to change the refractive index gradually, it is necessary to laminate films of materials with the refractive indexes being different from each other, and it has been difficult to adjust the refractive index. It is also conceivable to alter the refractive index of the film to be laminated by blending a material with a higher refractive index and a material with a lower refractive index, together with altering the ratio of blending. However, the material with a higher refractive index and the material with a lower refractive index are largely different in polarity in many cases, and are not mixed after blending thereby. Accordingly, this method is not popular either. Hence, it is also conceivable to use a film in which the moth eye pattern described above is formed as an antireflective film. In general, the moth eye pattern is formed by imprint technique to process a resin film by pressing a mold called stamper while heating the resin film.

The present inventors diligently investigated to achieve the foregoing objects and consequently found that the moth eye pattern is successfully improved greatly in the throughput if it can be formed by exposure and development, and still more enhanced antireflection effect can be obtained using a highly refractive material that tends to segregate as a photoresist to form the moth eye pattern; thereby bringing the present invention to completion.

That is, the present invention is an antireflective film, comprising:

a support base, and a pattern composed of a photoresist material formed on the support base, the pattern having a larger size and a larger refractive index at a point closer to the support base.

Hereinafter, the present invention will be specifically described by referring to FIGS., but the present invention is not limited thereto.

<Antireflective Film>

The present invention provides an antireflective film in which a pattern composed of a photoresist material is formed on a support base, and the pattern has a larger size and a larger refractive index at a point closer to the support base, that is, the pattern is flared toward the support base.

An example of the inventive antireflective film is shown in FIG. 1 as a schematic sectional view. The antireflective film 101 of FIG. 1 is a film in which a pattern 13 (moth eye pattern) composed of a photoresist material 12 is formed on a support base 11, with the pattern 13 having a larger size sit a point closer to the support base 11. In the moth eye pattern 13, the refractive index also enlarges toward the support base 11.

The moth eye pattern may have any layout, when it is observed from the above, such as a crosswise arrangement as shown in FIG. 3, an arrangement shown in FIG. 4, and other arrangement, but the pattern is preferably in the same pitch and the same size. With the pattern in the same size and pitch, the refractive index of the film becomes uniform and is favorable.

In the antireflective film of the present invention, the transmittance of visible light having a wavelength of 400 to 800 nm is preferably 80% or more.

[Pattern Having a Larger Size at a Point Closer to Support Base (Moth Eye Pattern)]

The moth eye pattern 13 is preferably set to have a pitch smaller than the wavelength of the visible light. This successfully prevents diffuse reflection on the moth eye pattern 13. Since the shortest wavelength in the visible light is about 400 nm, the pitch of the pattern is preferably 400 nm or less, more preferably 300 nm or less.

The height of the moth eye pattern 13 is preferably 50 nm or more and 1000 nm or less, more preferably 100 nm or more and 800 nm or less.

The resin film formed by common imprint method has a refractive index of about 1.5, but with a photoresist material as in the present invention, it is possible to form a moth eye pattern in which the refractive index is higher than the above at the support base side, and the refractive index lowers with receding from the support base. The pattern like this makes it possible to achieve higher antireflection effect to emit or introduce shallower light. Accordingly, at the support base side, the photoresist material preferably has a refractive index of 1.6 or more, more preferably 1.65 or more, still more preferably 1.7 or more with respect to visible light having a wavelength of 590 to 610 nm. Additionally, at the side distant from the support base, the refractive index is preferably 1.5 or less with respect to visible light having a wavelength of 590 to 610 nm.

The moth eye pattern 13 have to be formed such that the upper part has a smaller size, and the face adjoined to the underneath support base has a larger size as shown in FIG. 1. Although the profile of the moth eye pattern 13 shown in FIG. 1 has a triangular shape, it may be a trapezoid shape, in which the upper part is planer, or a shape of halved oval.

In any shape, this makes the refractive index at the upper part lower and the refractive index at the lower part higher. The methods to form a pattern with a tapered shape like this include a method using a resist material with higher absorption and a method using a resist material with a lower dissolution contrast. For example, the resist material having a naphthalene-containing structure has appropriate absorption of KrF excimer laser at a wavelength of 248 nm and ArF excimer laser at a wavelength of 193 nm, thereby being preferable since a moth eye pattern can be formed by lithography using these excimer laser.

The photoresist material is a material in which the refractive index enlarges with approaching to the support base, and is not limited to particular ones. For example, the photoresist material can be a mixture of a high-refractive-index polymer compound and a low-refractive-index polymer compound, in which the low-refractive-index polymer compound is segregated at the film surface. In this case, it is preferable that the high-refractive-index polymer compound be an aromatic group-containing polymer compound, and the low-refractive-index polymer compound be a fluorine-containing polymer compound since the low-refractive-index fluorine-containing polymer compound is segregated at the film surface by baking. The aromatic group-containing polymer compound preferably has a refractive index of 1.6 or more, and the fluorine-containing polymer compound preferably has a refractive index of 1.5 or less.

As the aromatic group-containing polymer compound, a polymer compound having a condensed aromatic ring is more preferable due to the higher refractive index. For example, as the resist material having a condensed aromatic ring with higher refractive index, a resist material having an acid-labile group of condensed aromatic ring is exemplified in JP 2010-237662A, JP 2010-237661A, JP 2011-150103A, JP 2011-138107A, and JP 2011-141471A. The preferable examples thereof also include a resist material that contains any of acenaphthylene described in JP 2002-119659A, vinylferrocene described in JP 2014-119659A, hydroxyvinylnaphthalene described in JP 2002-107933A, and hydroxynaphthalene methacrylate described in JP 2007-114728A since they have a higher refractive index. The resist material described in JP H05-204157A, which contains hydroxystyrene substituted with bromine or iodine, has higher refractive index and is preferable thereby.

The following are exemplified as a monomer that contains an acid-labile group of condensed aromatic ring.

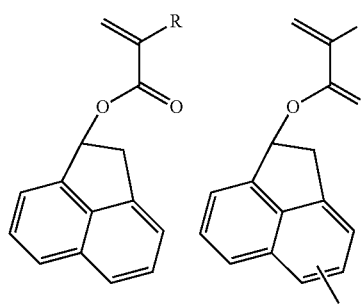

-continued

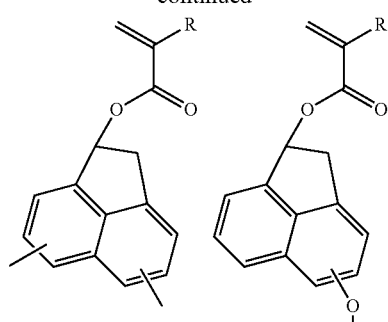

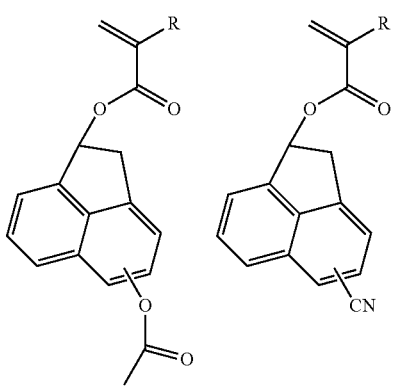

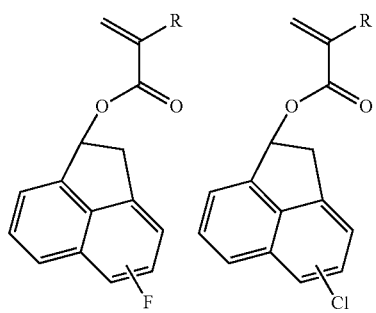

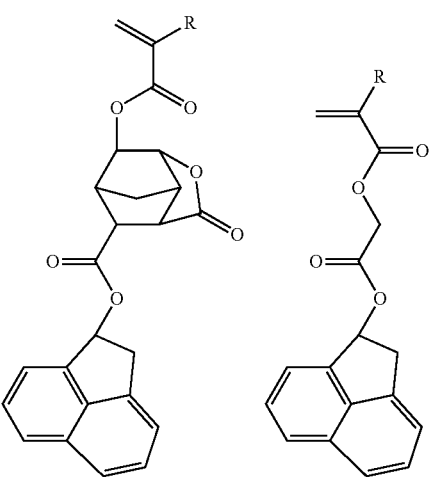

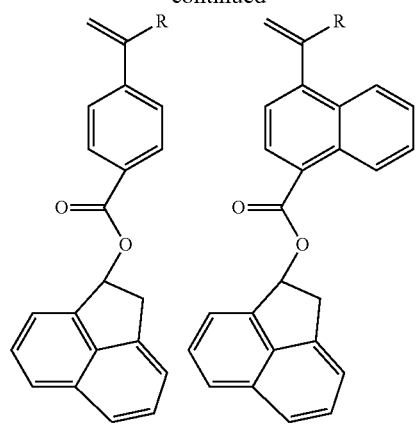
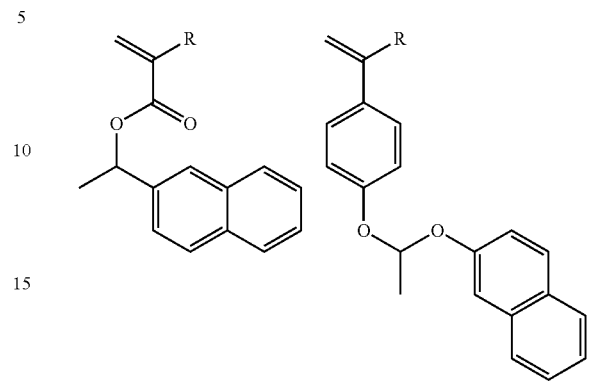
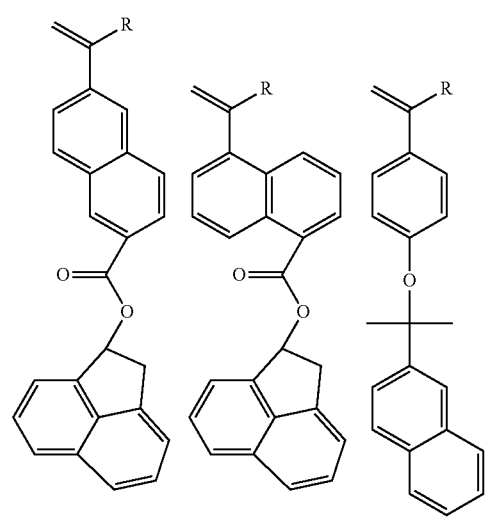
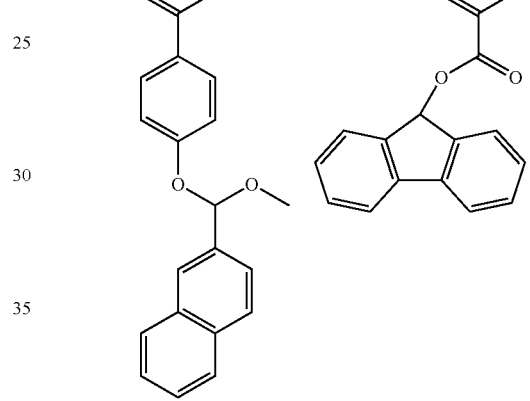
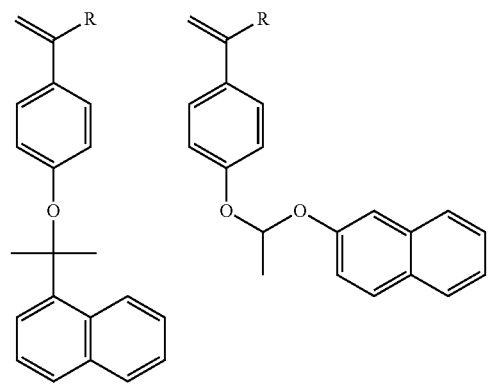
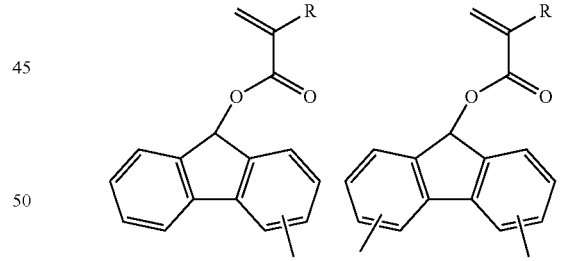
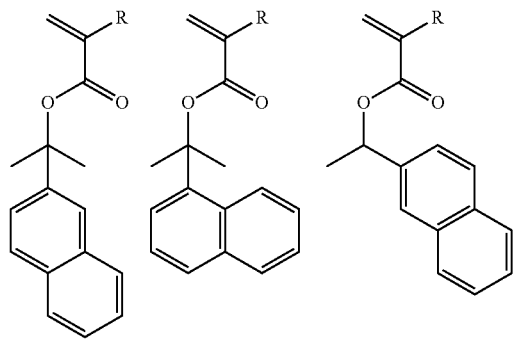
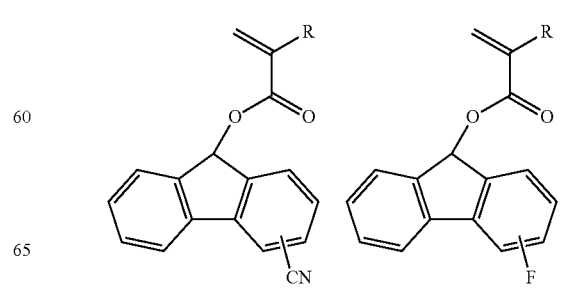

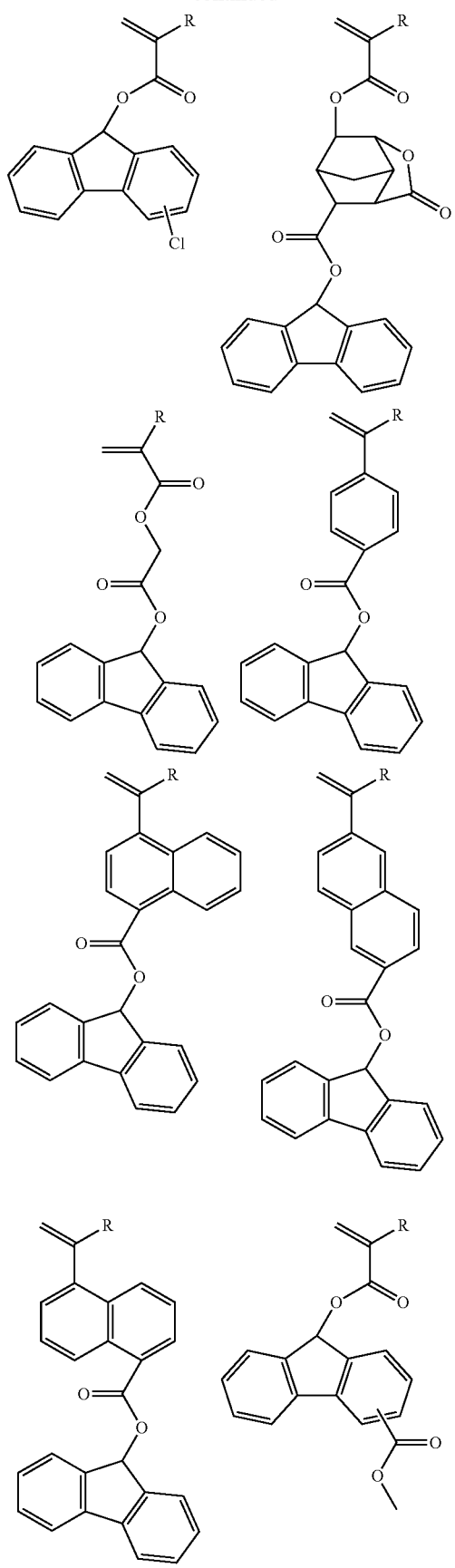
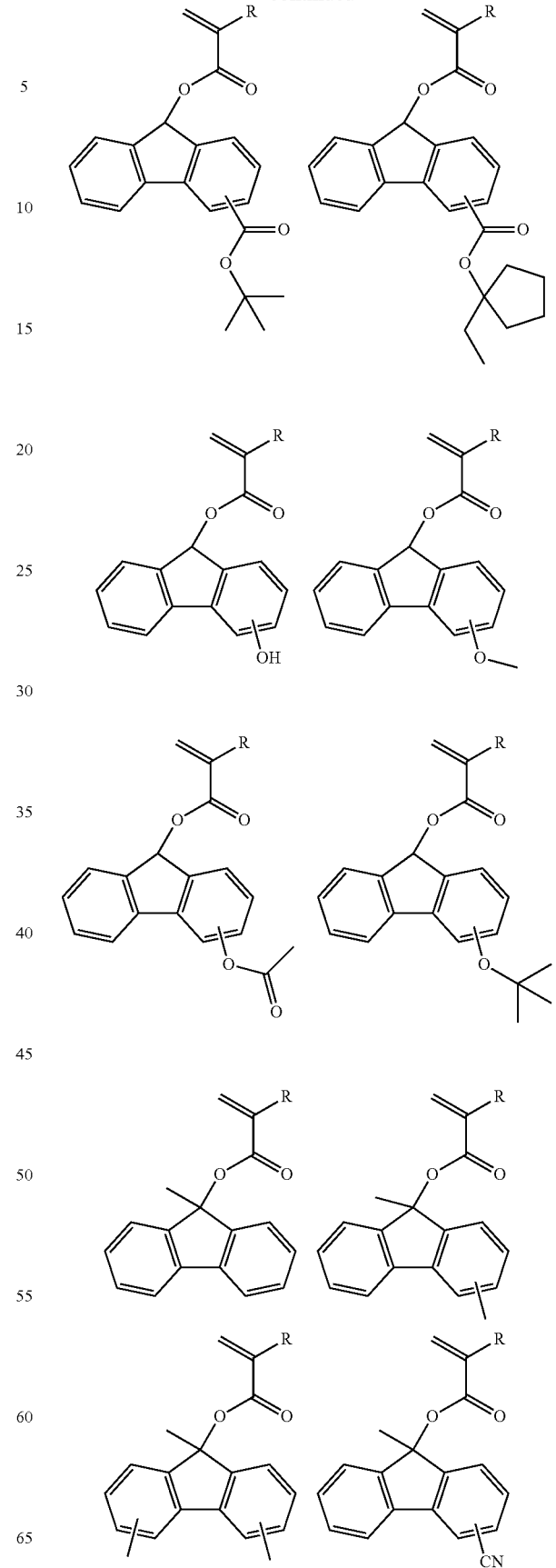

-continued
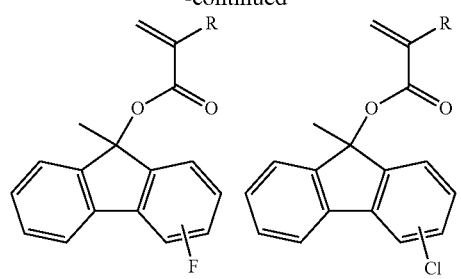
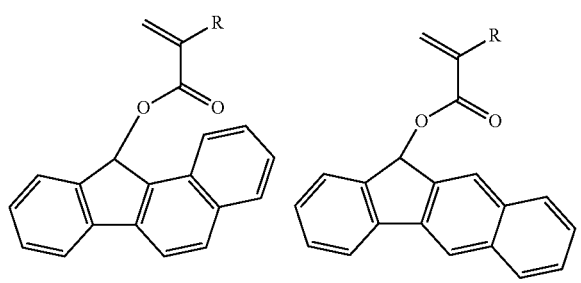
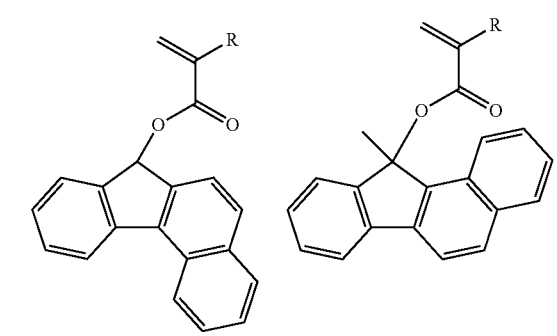
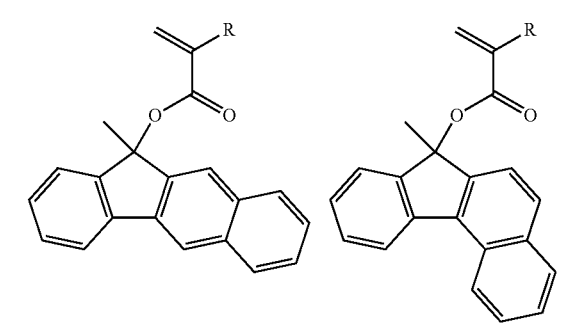
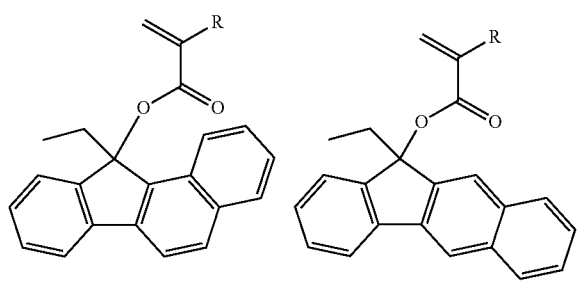
-continued
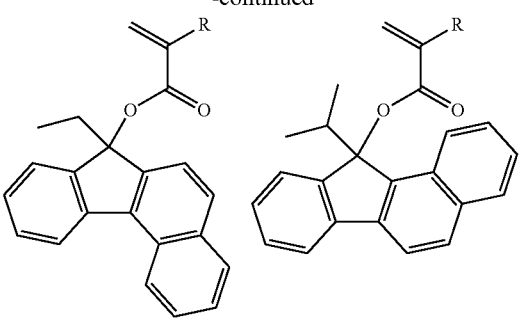
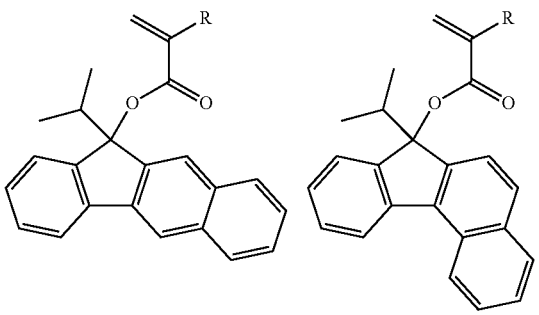
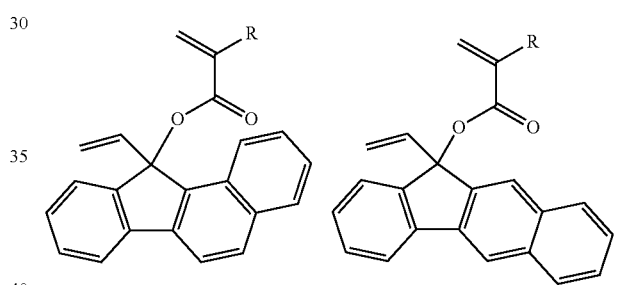
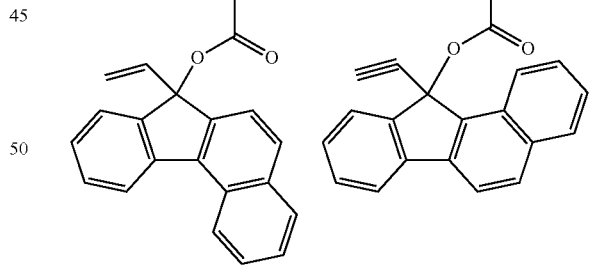
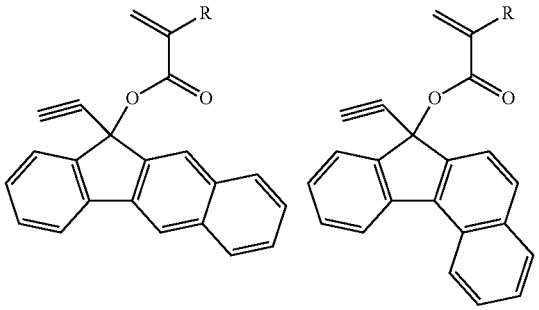

-continued
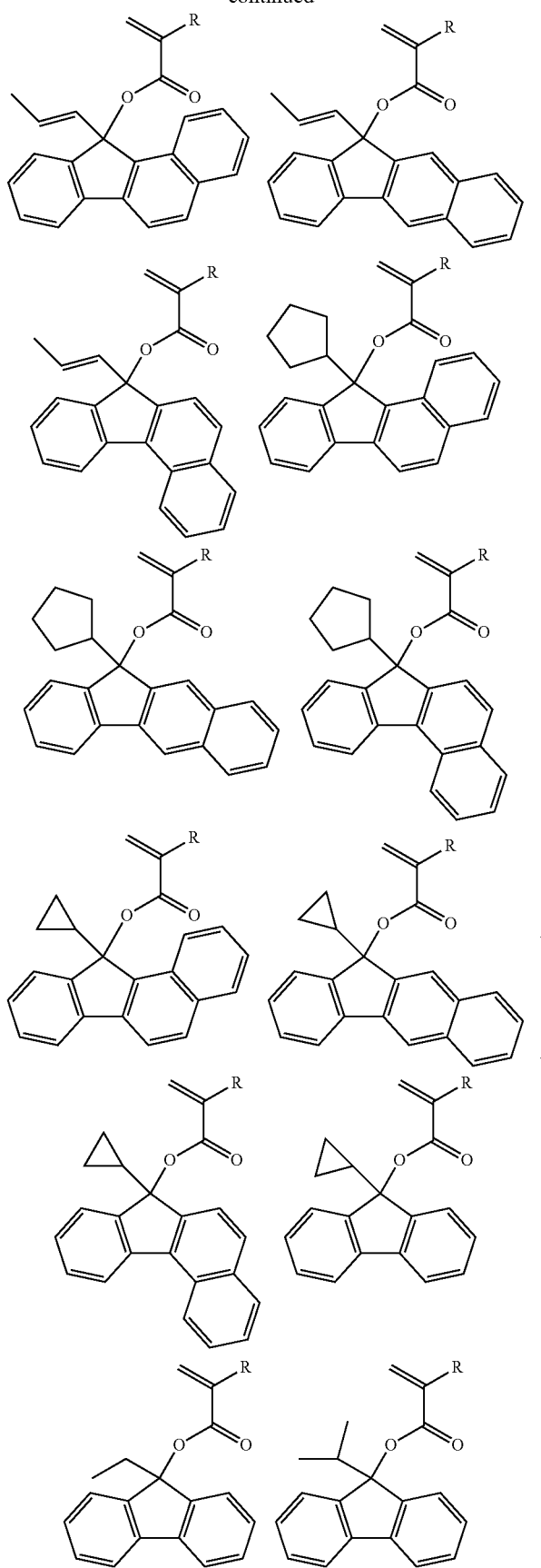
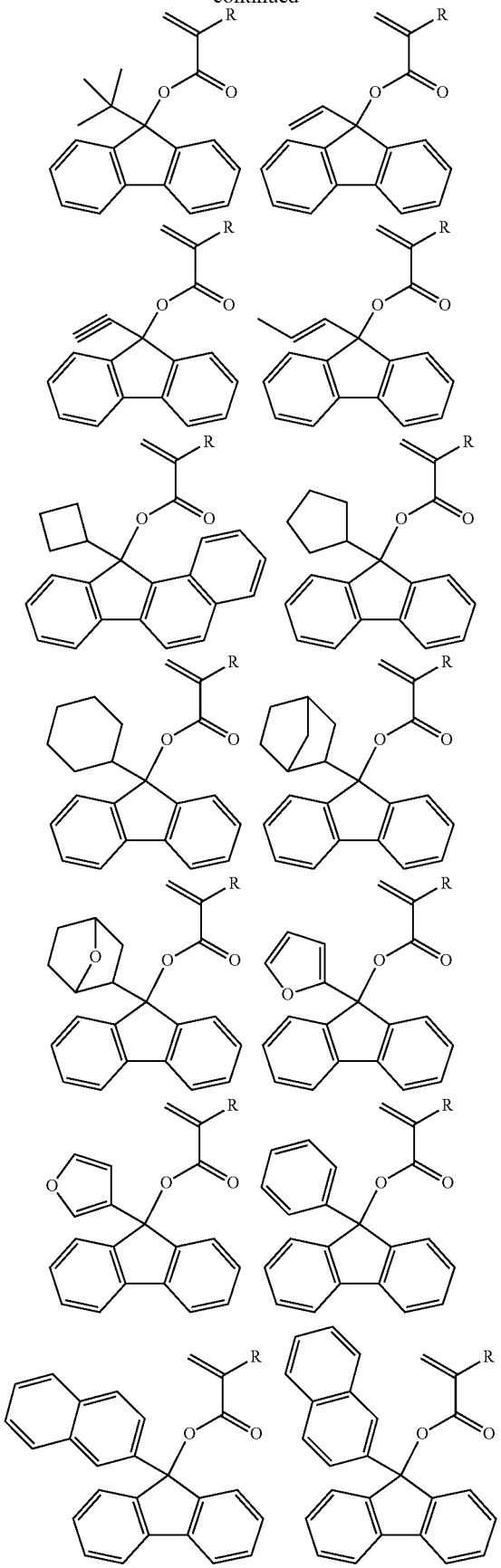

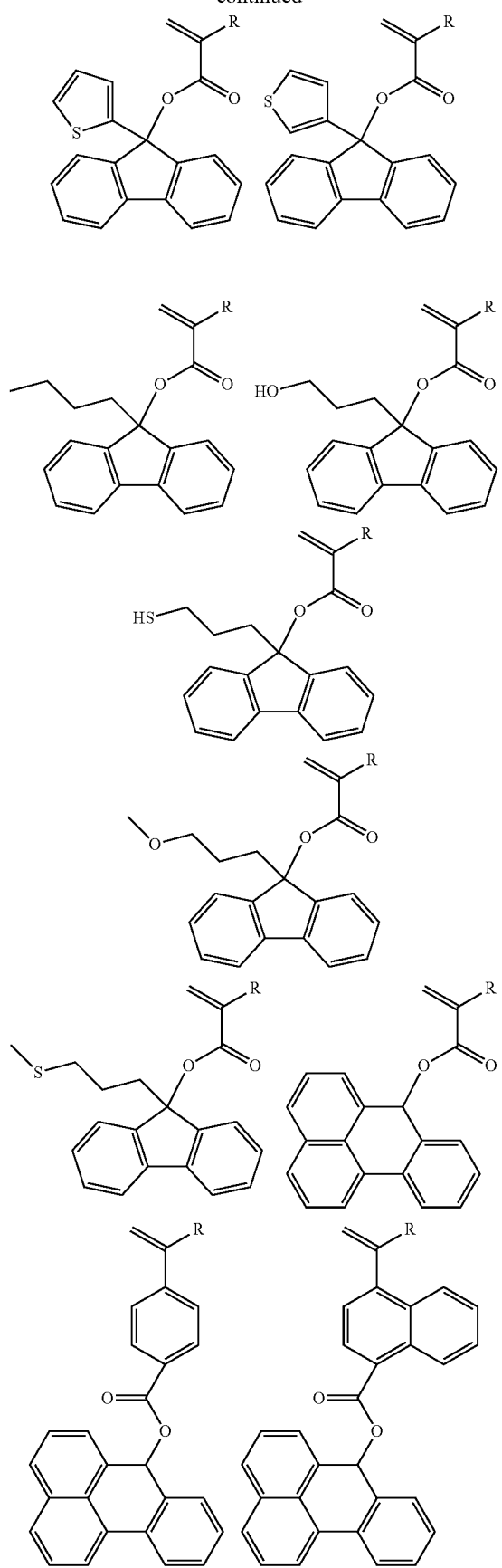
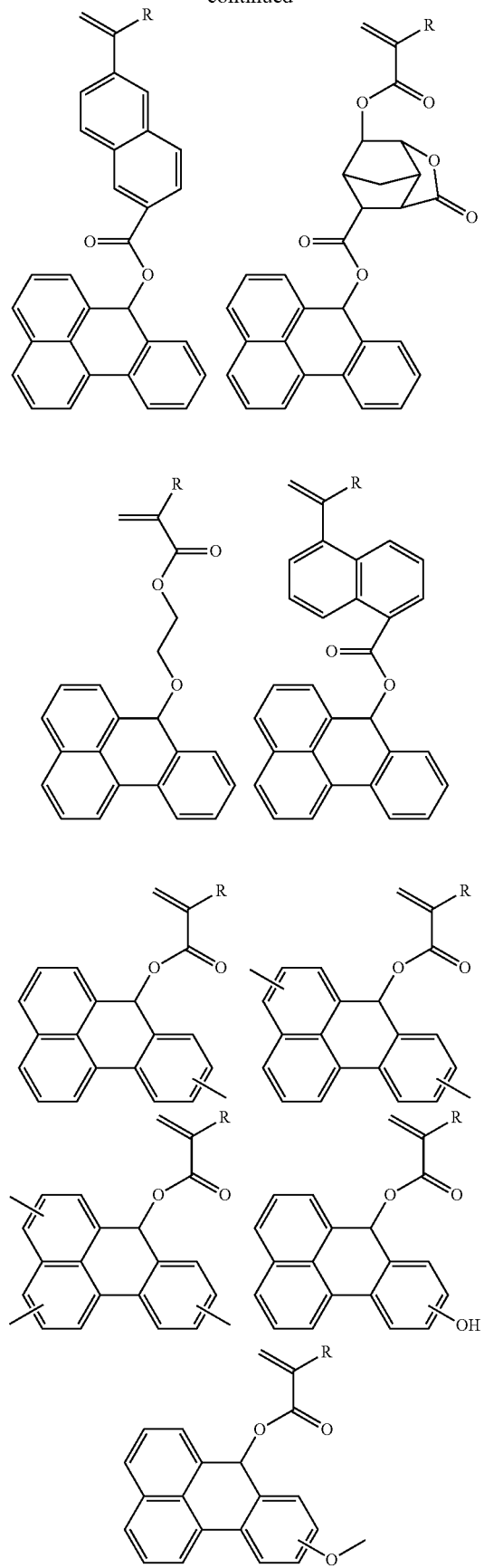

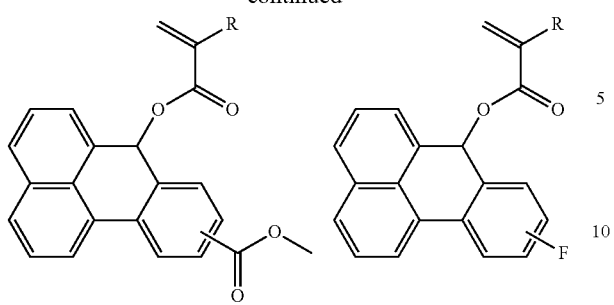
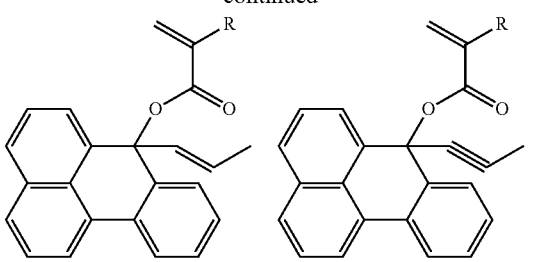
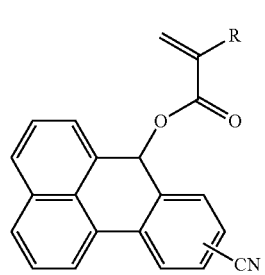
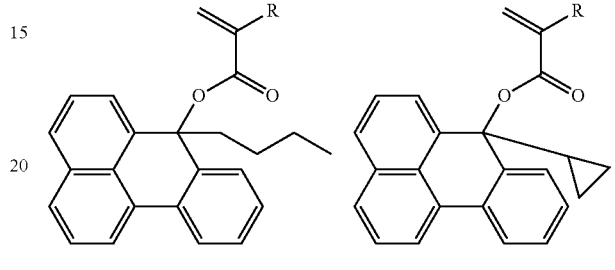
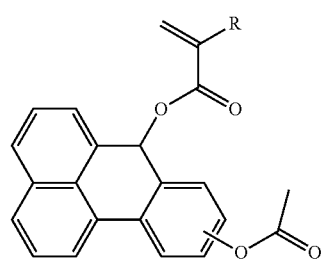
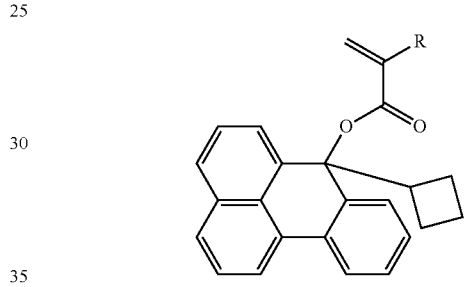
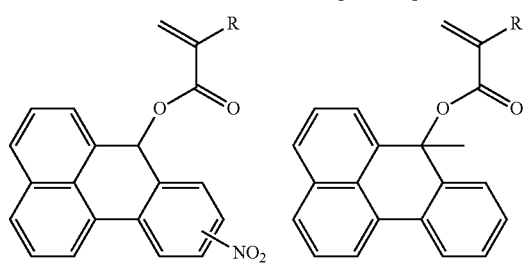
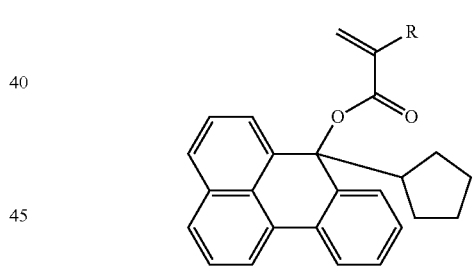
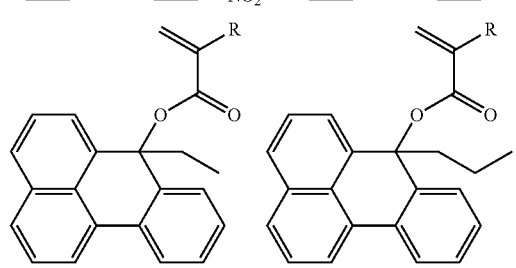
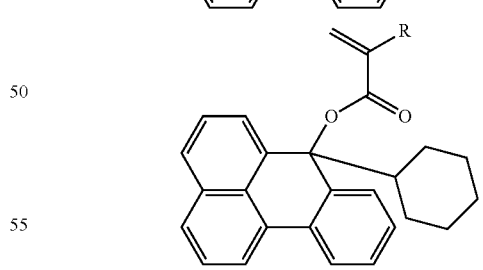
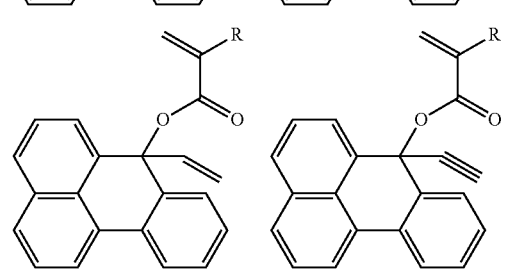
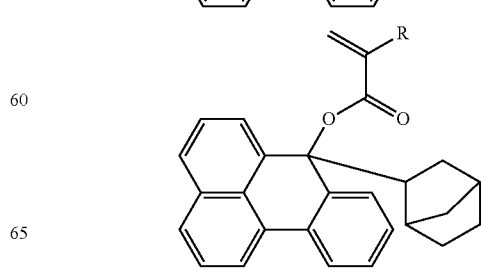

-continued
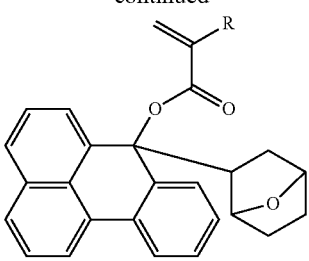
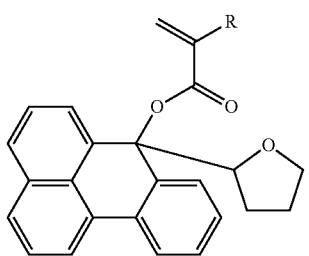
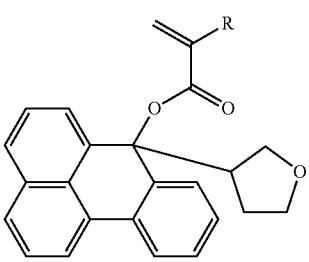
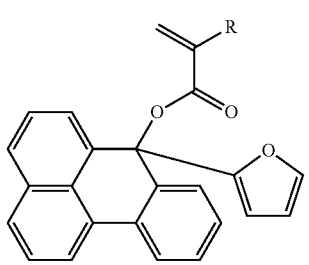
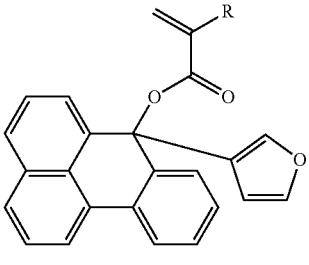
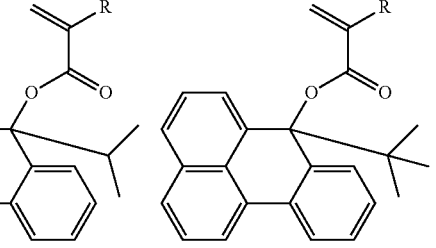
-continued
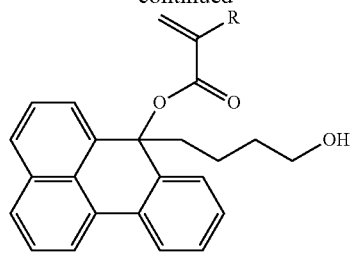
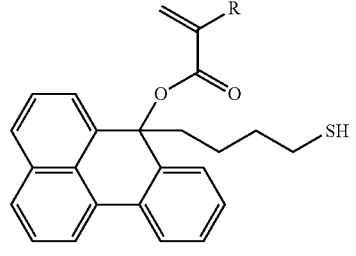
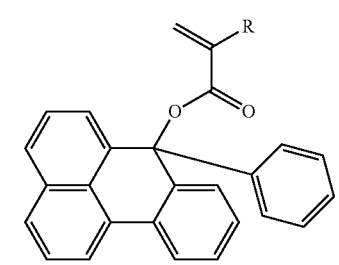
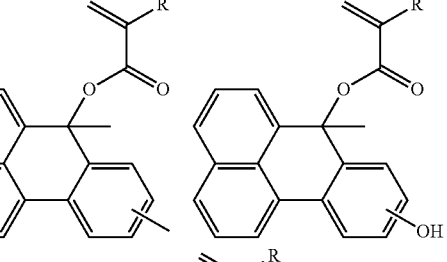
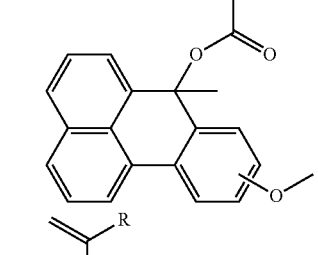
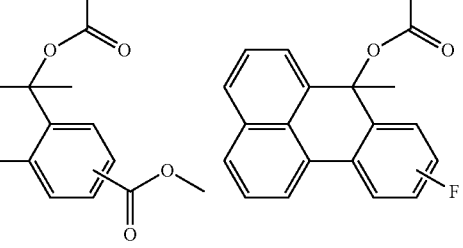

-continued
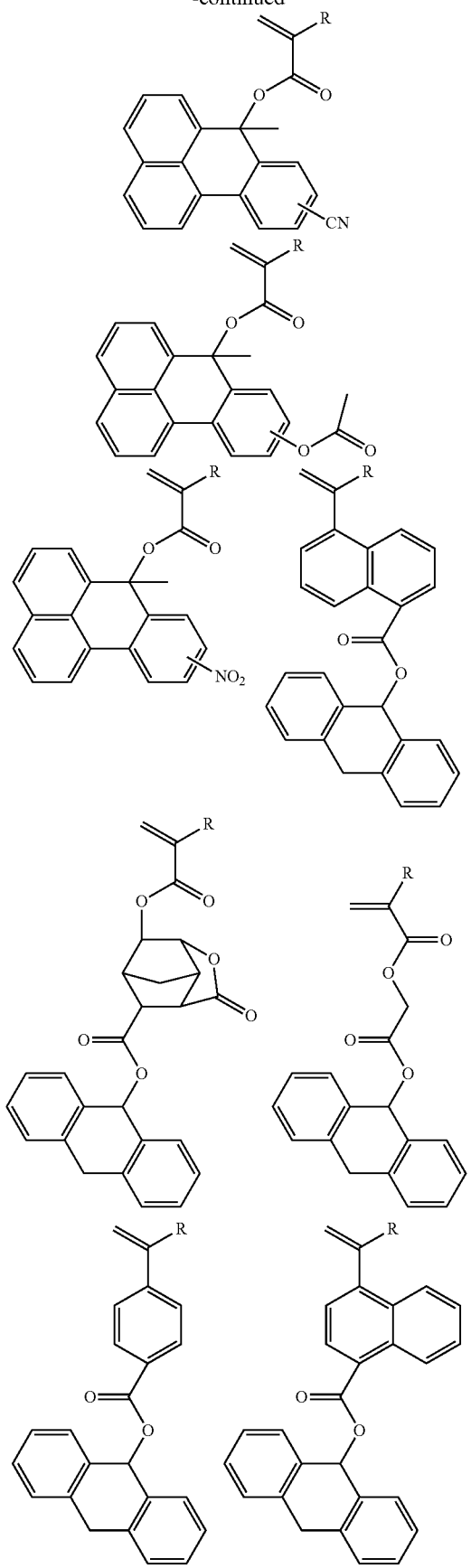
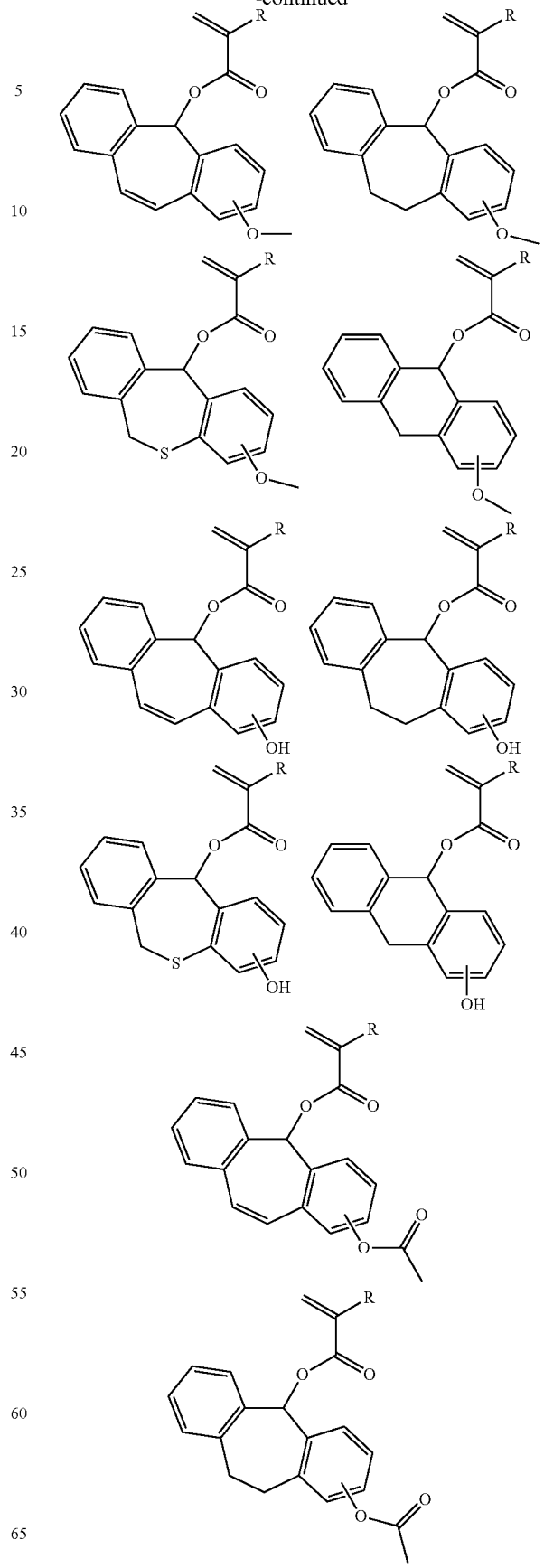

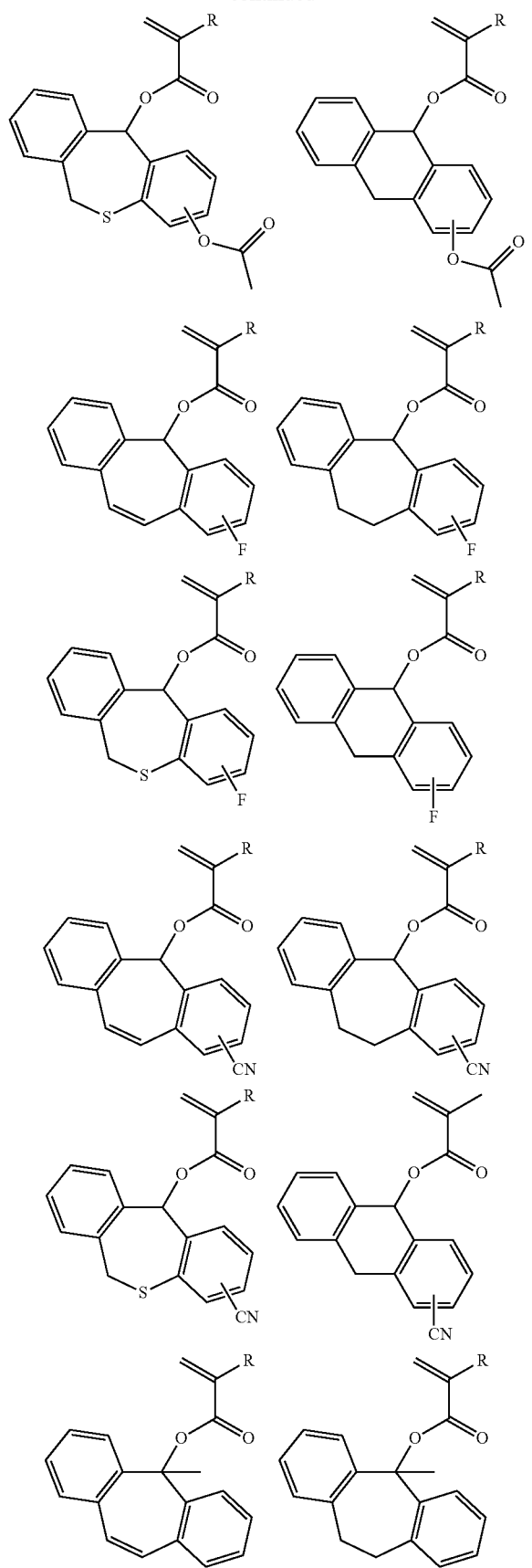
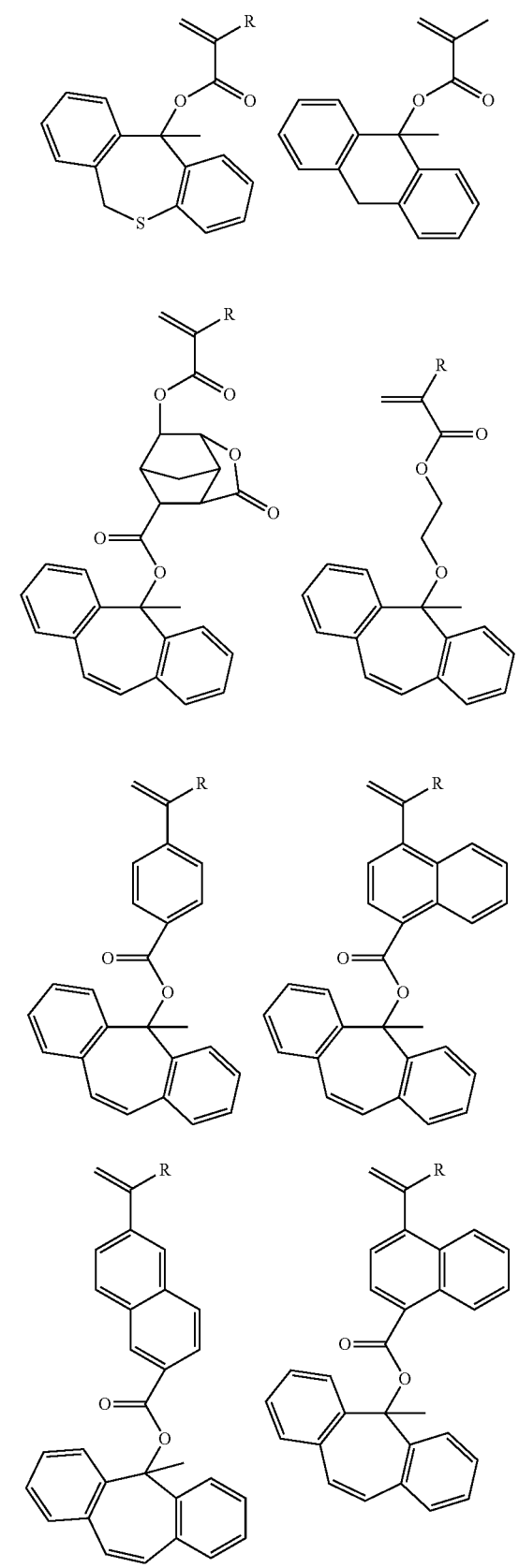

-continued
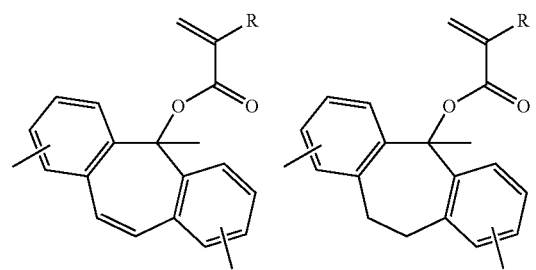
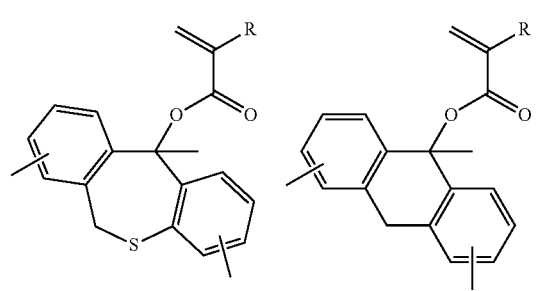
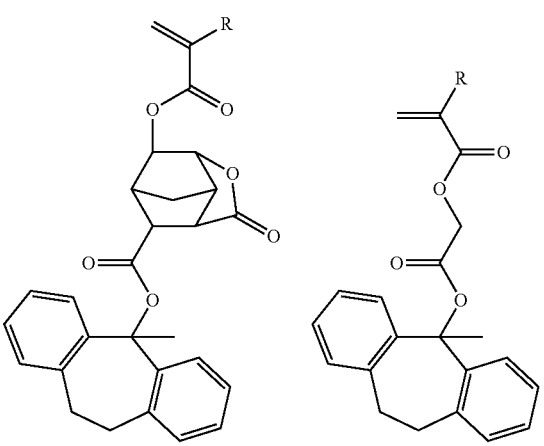
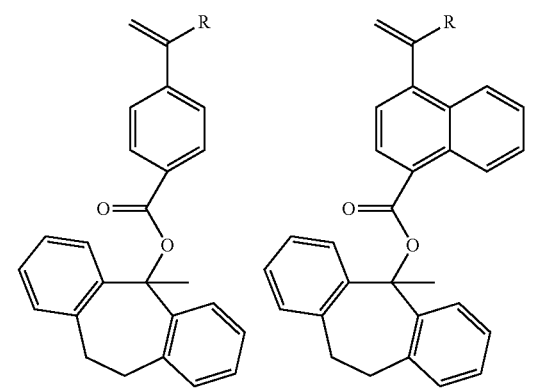
-continued
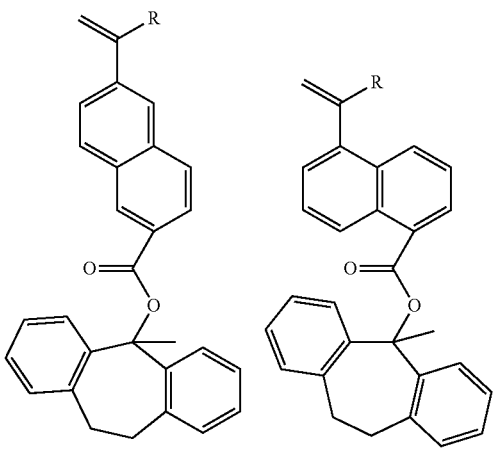
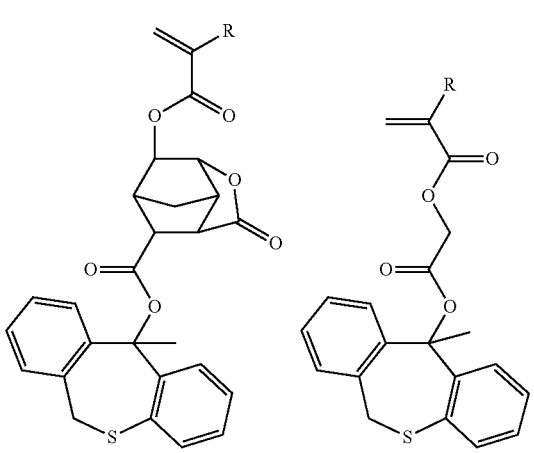
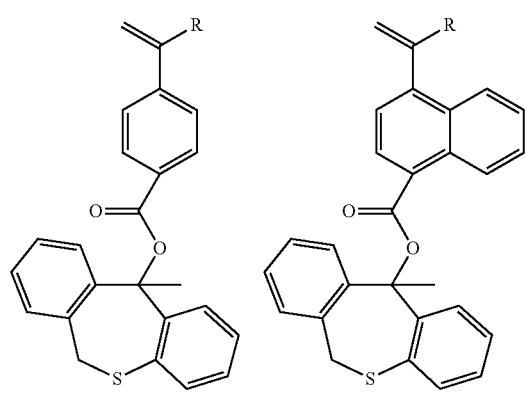
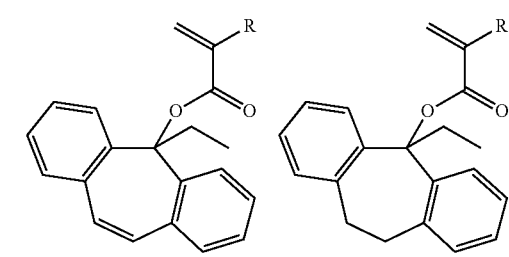

-continued
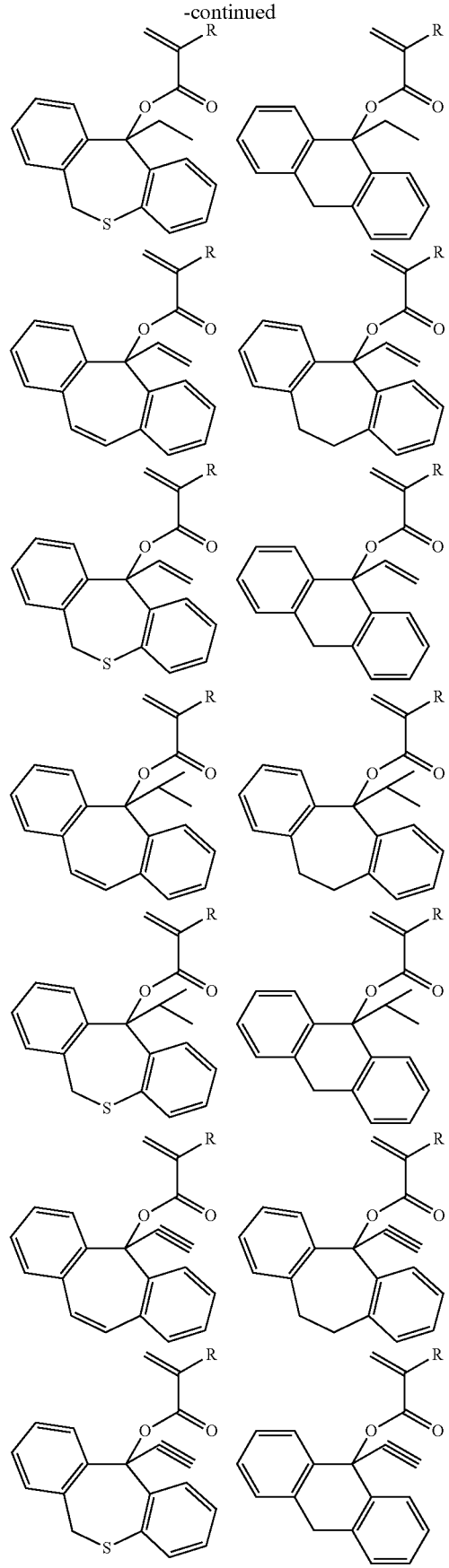
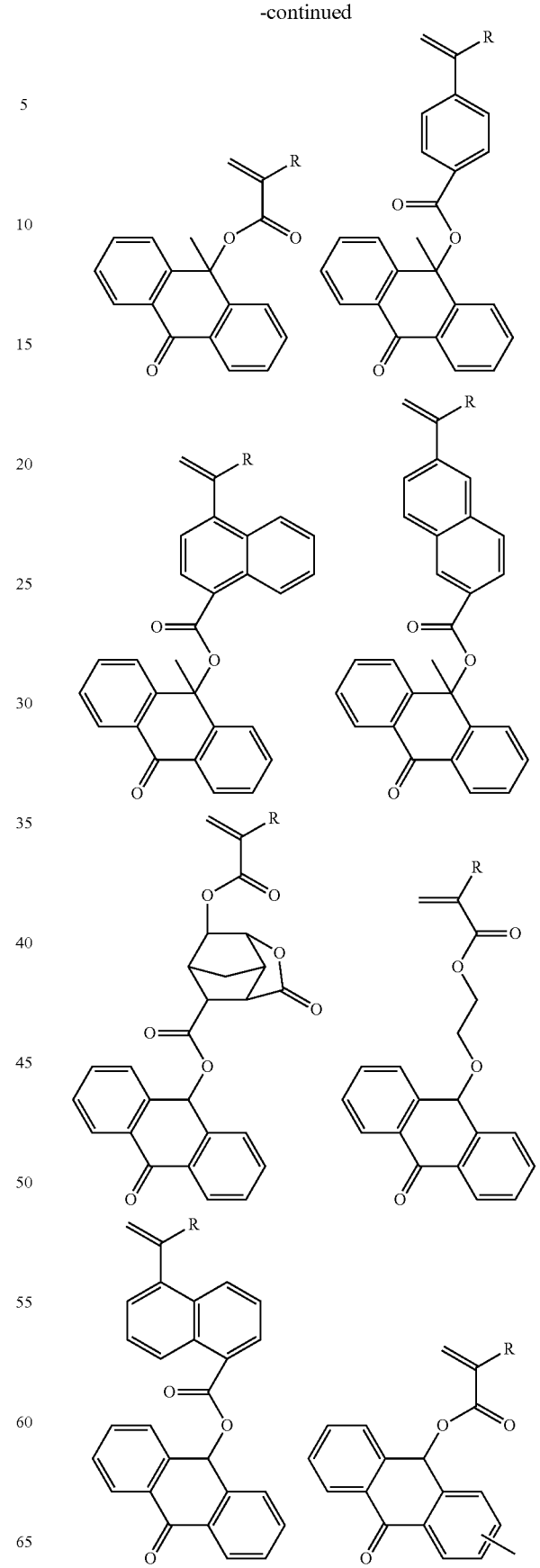

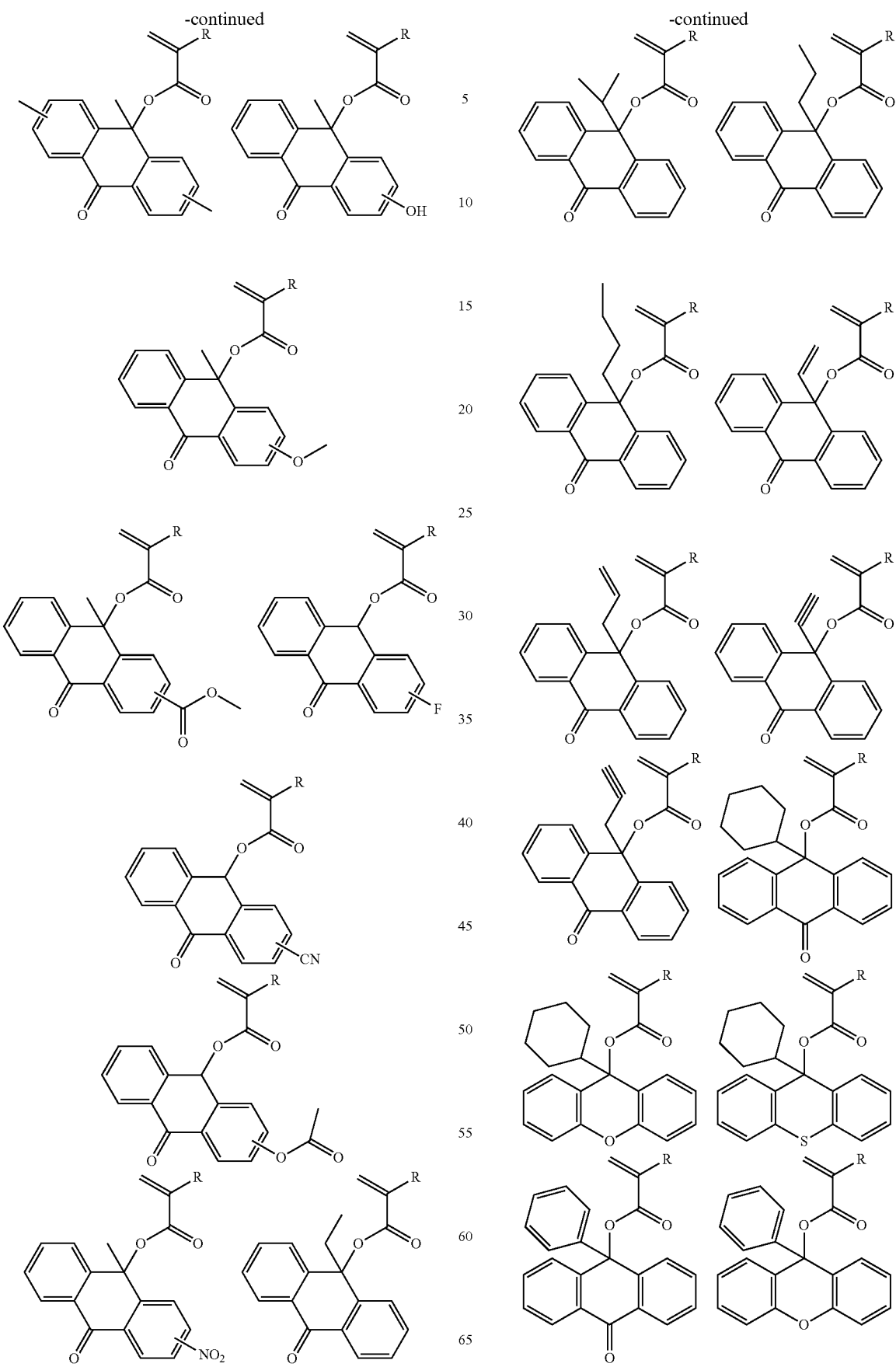

-continued
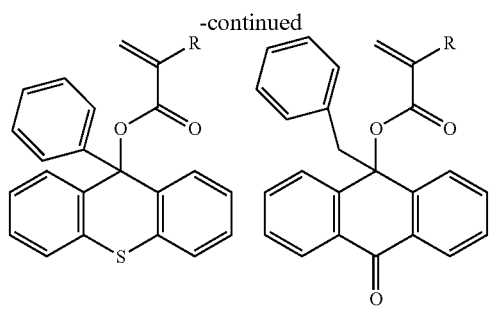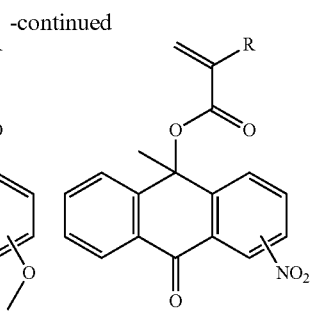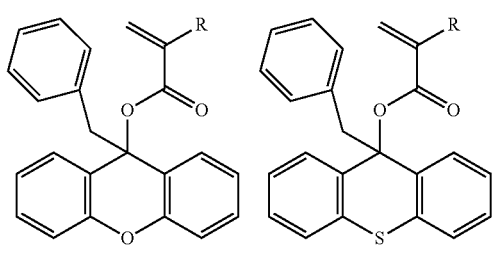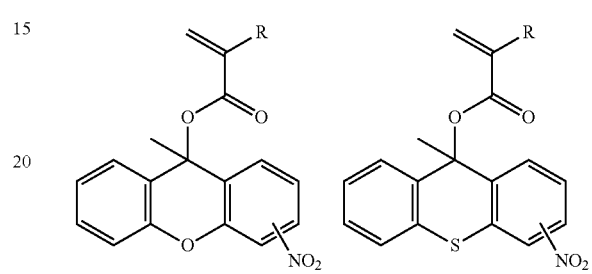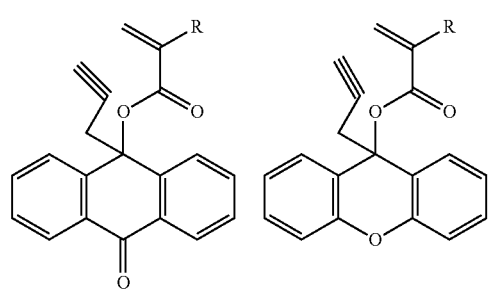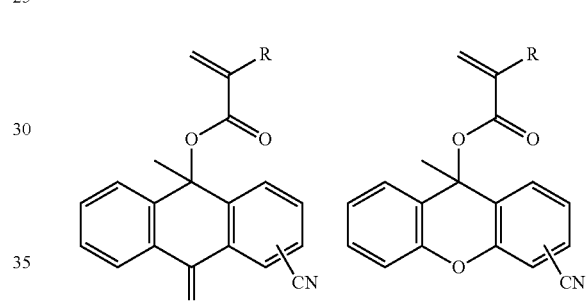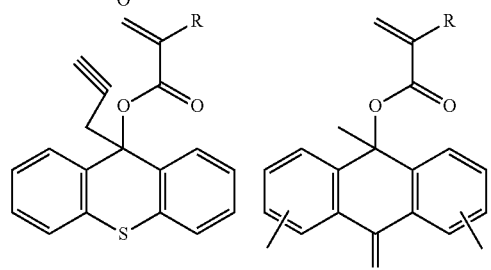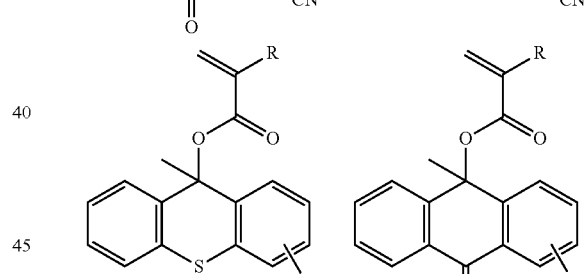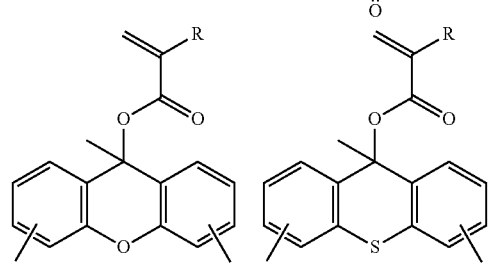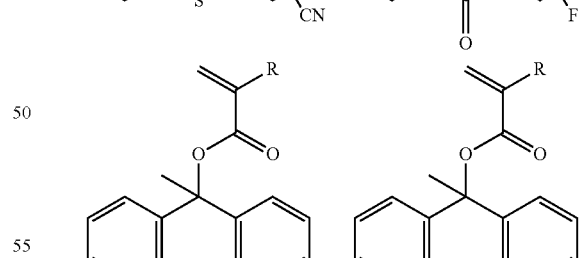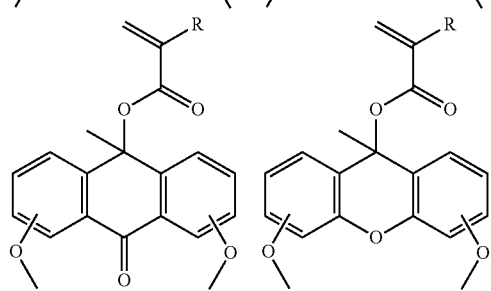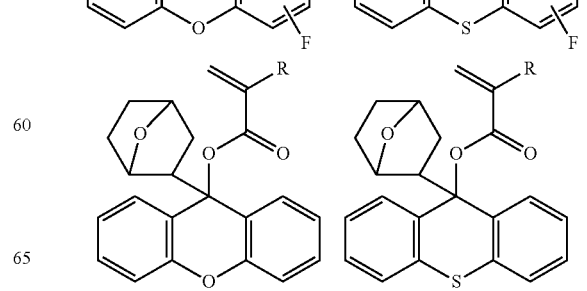

-continued
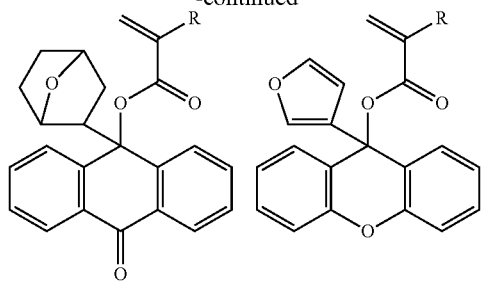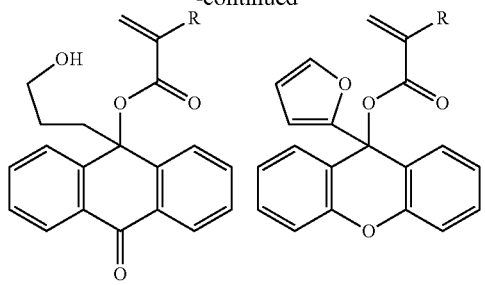
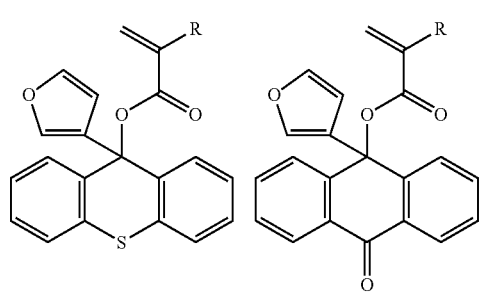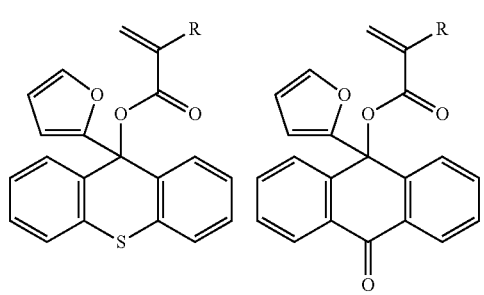
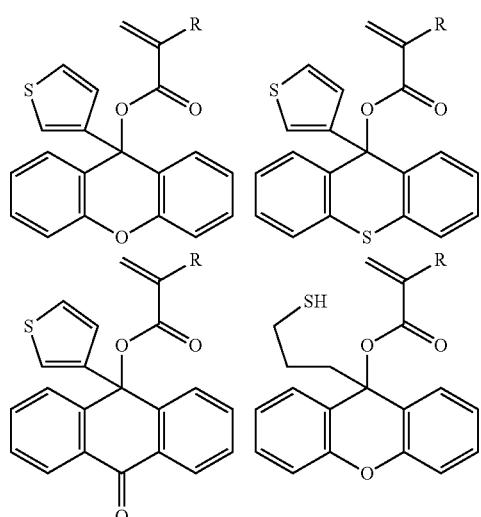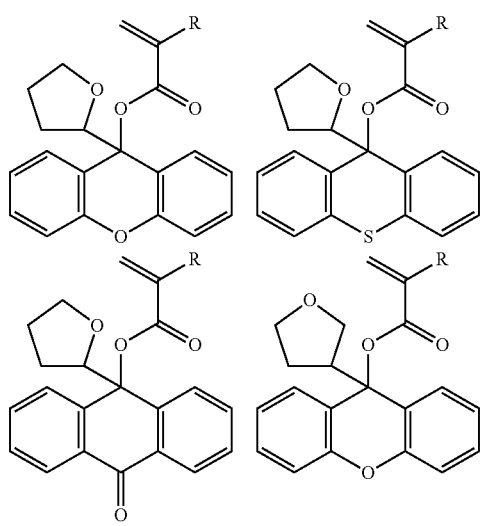
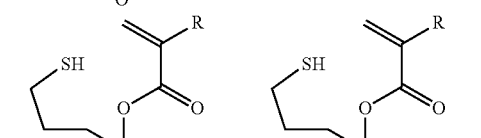
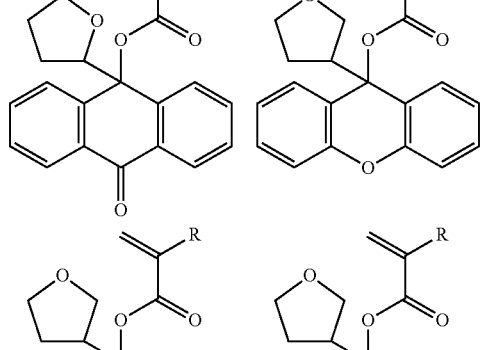
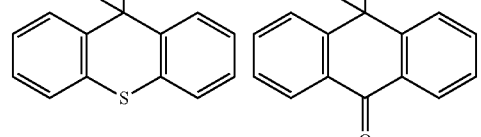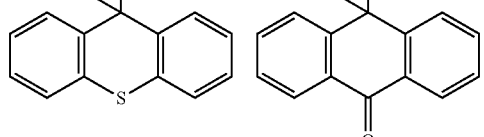
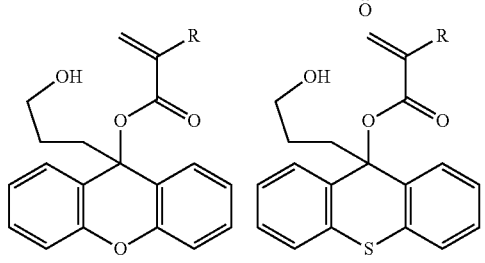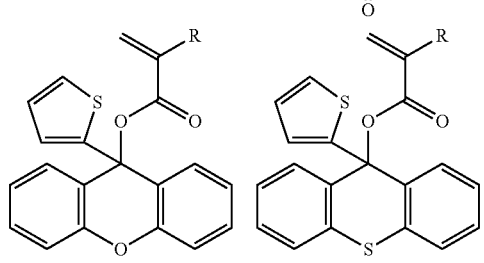

-continued
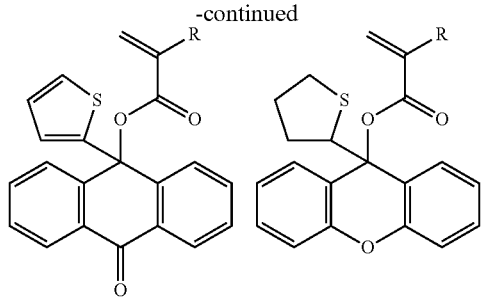
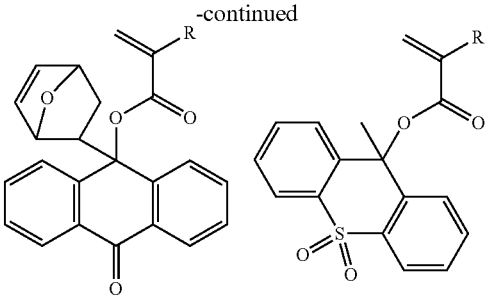

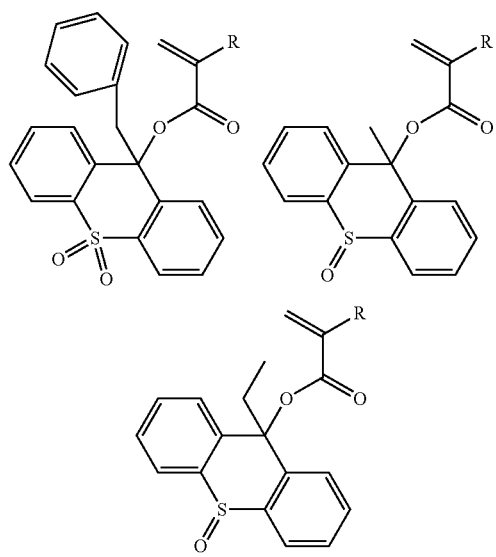
The following are exemplified as a monomer to obtain a repeating unit having a naphthalene structure.
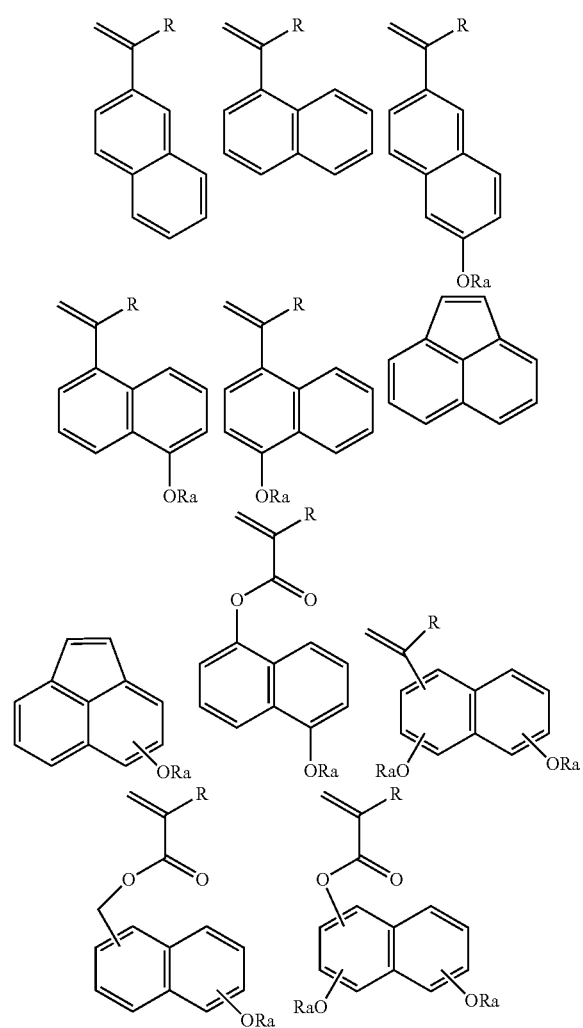
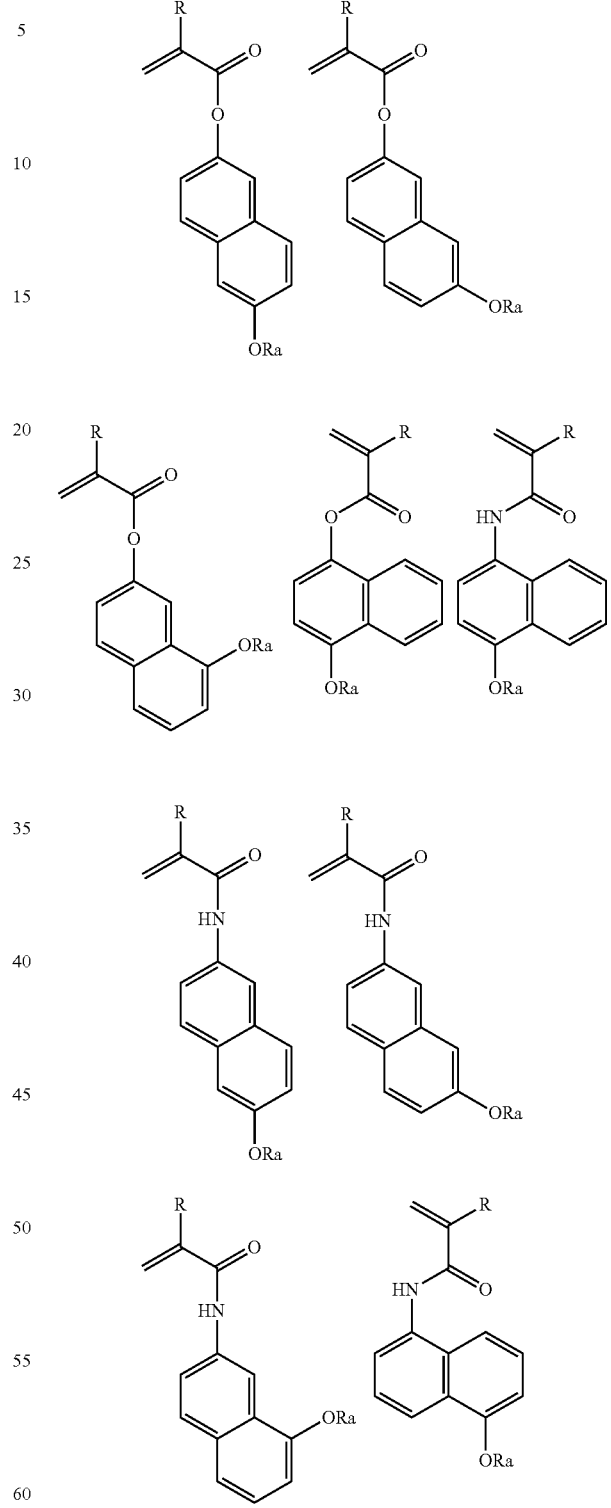
The following are exemplified as a monomer to obtain a repeating unit having any of styrene substituted with iodine or bromine, benzene (meth)acrylate substituted with iodine or bromine, and benzene (meth) acrylamide substituted with iodine or bromine.

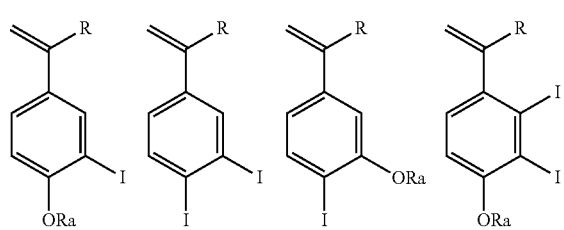
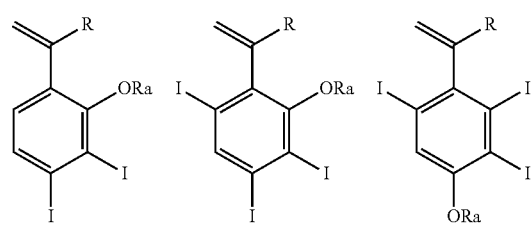
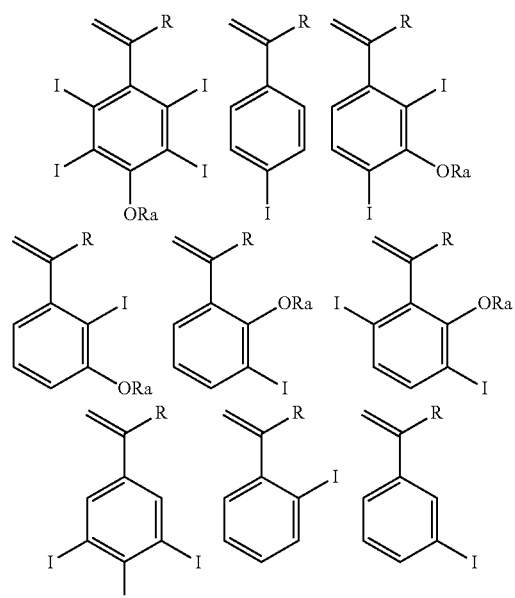
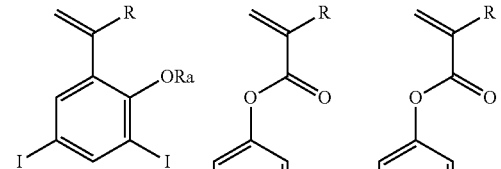
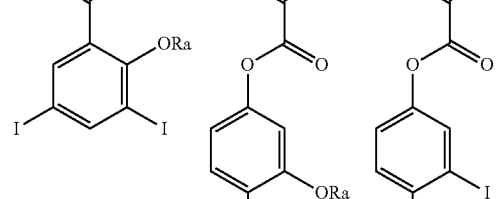
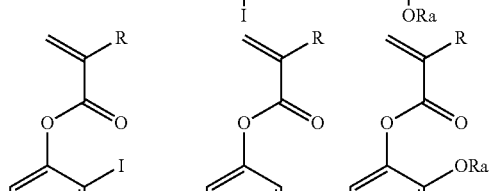
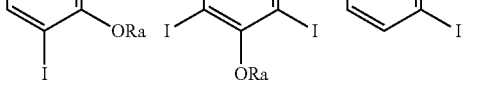
-continued
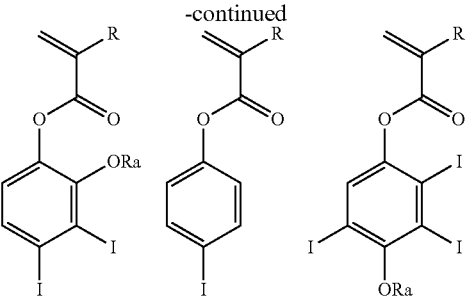
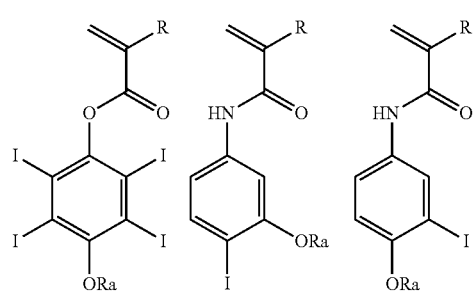
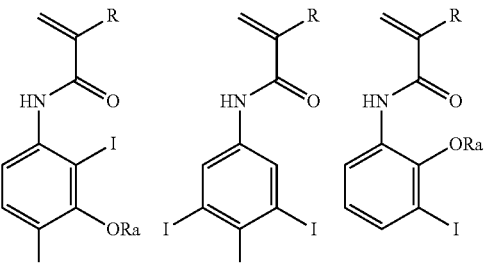
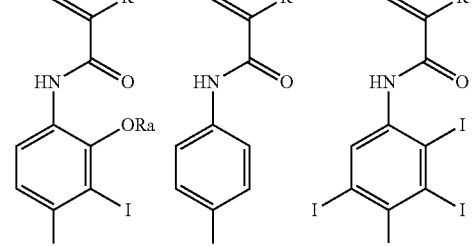
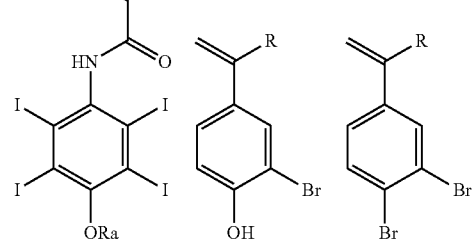
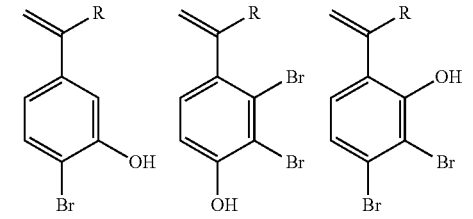

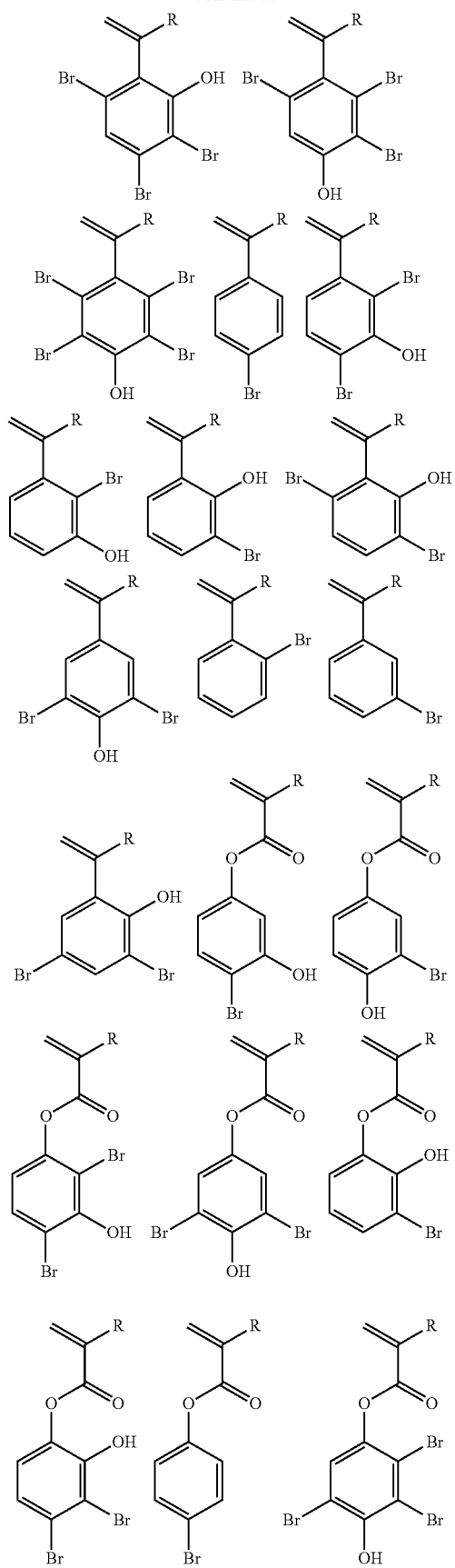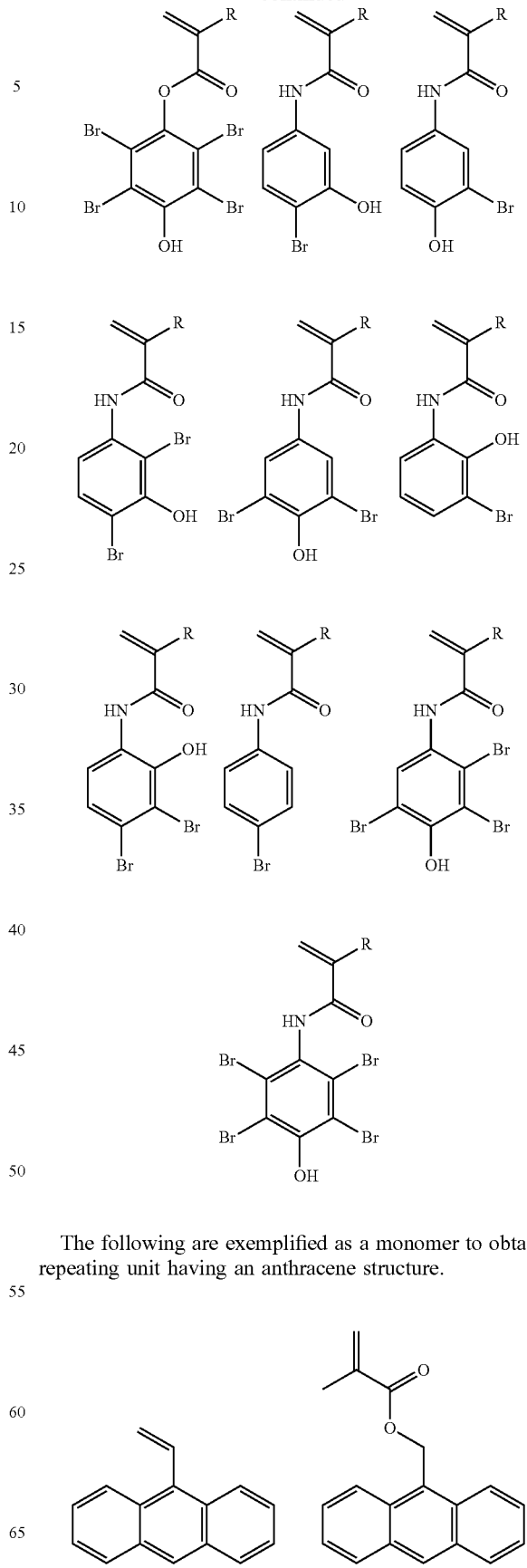
The following are exemplified as a monomer to obtain a repeating unit having an anthracene structure.

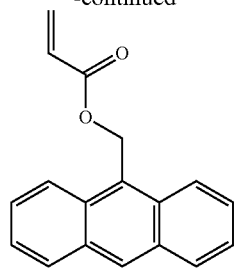
The following are exemplified as a monomer to obtain a repeating unit having a cyclopentadienyl complex. The following cyclopentadienyl complexes are preferably ferrocene.
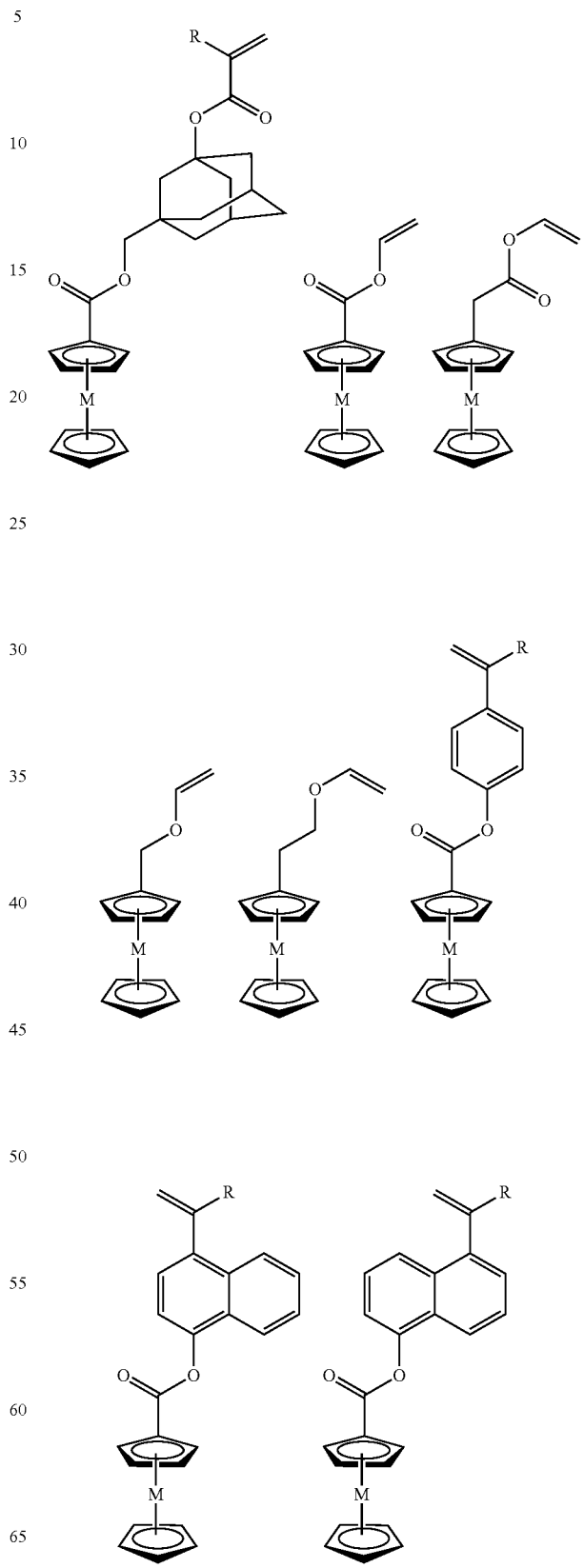

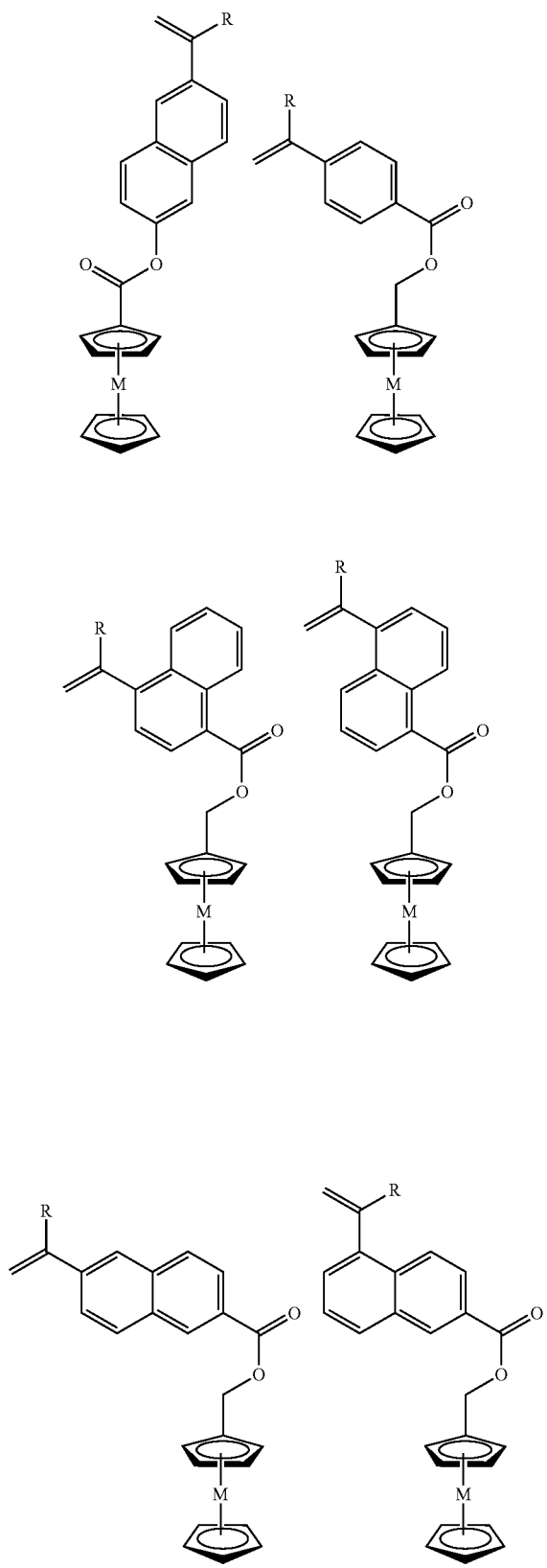

In the formulae, R represents a hydrogen atom or a methyl group, Ra represents a hydrogen atom or an acid-labile group, and M represent any of Fe, Co, Ni, Cr, and Ru.

Among the polymer compounds described above, the photoresist material preferably contains a polymer compound that contains 85% or more of a repeating unit having at least one structure selected from the group consisting of naphthalene, fluorene, anthracene, and cyclopentadienyl complexes.

The photoresist material preferably contains a polymer compound that contains 50% or more of a repeating unit having any of styrene substituted with iodine or bromine, benzene (meth)acrylate substituted with iodine or bromine, and benzene (meth)acrylamide substituted with iodine or bromine.
The following are exemplified as a monomer to obtain a fluorine atom-containing repeating unit with low refractive index.
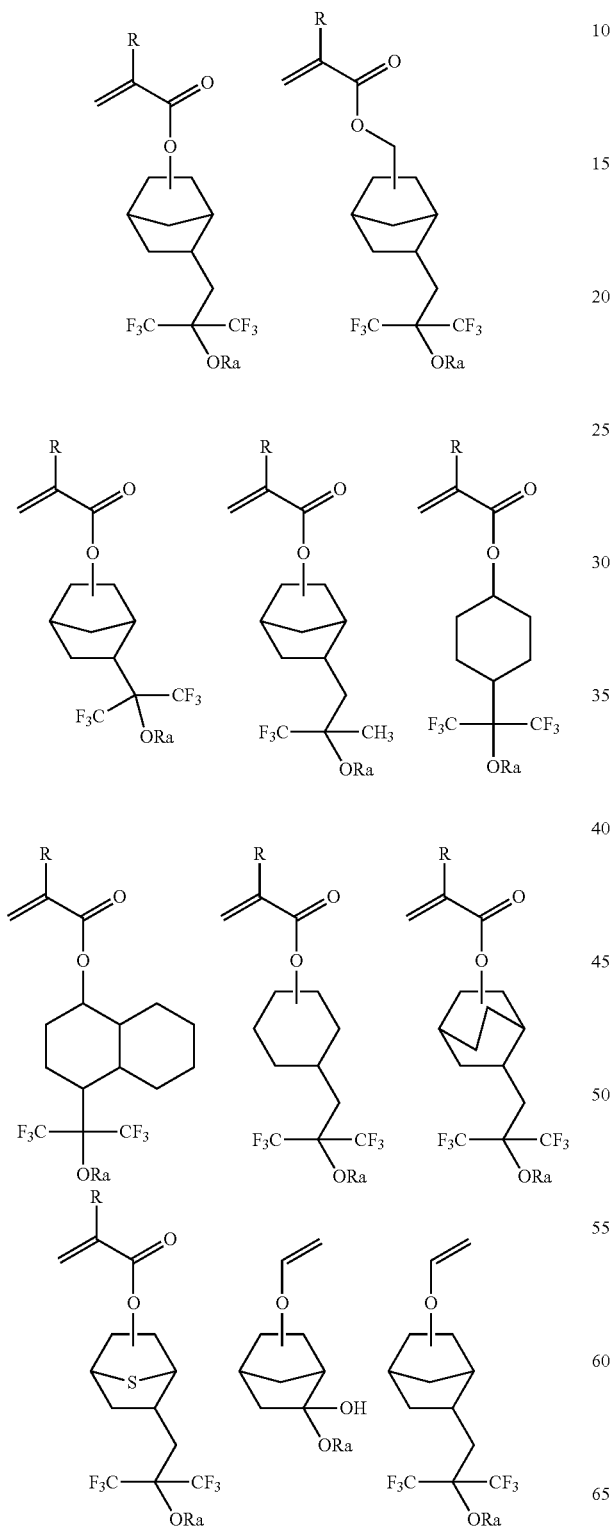
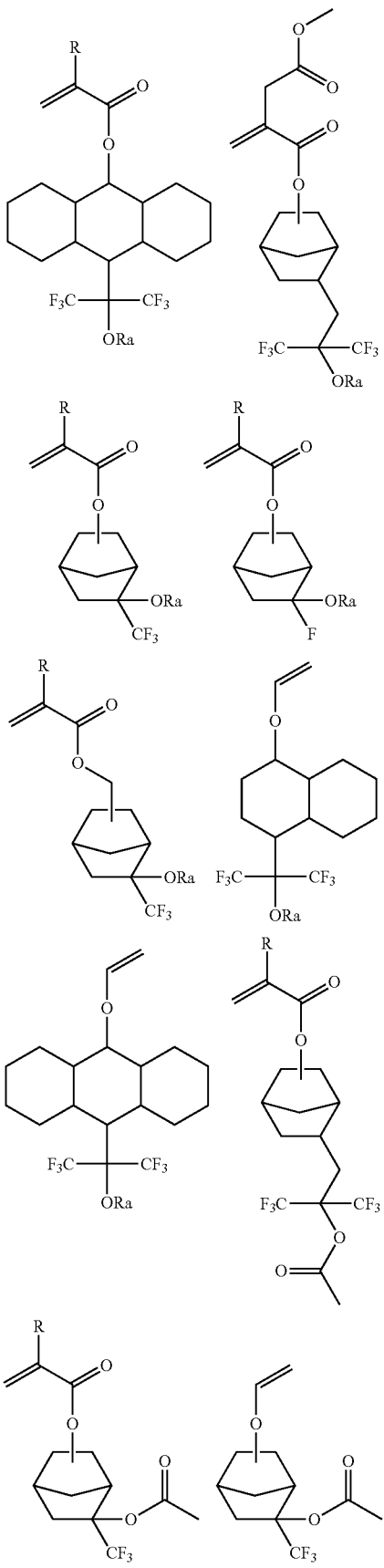

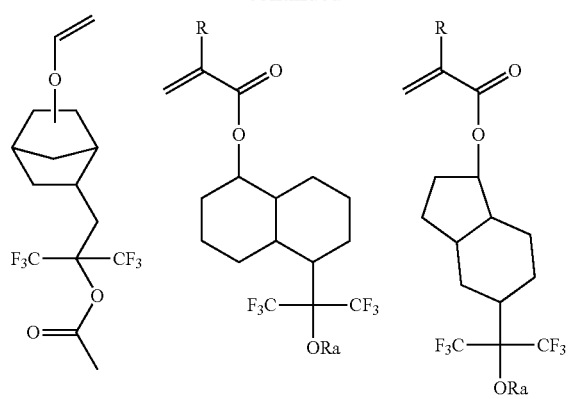
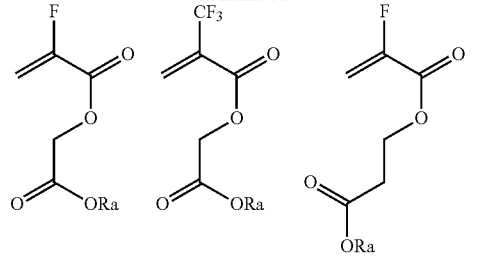
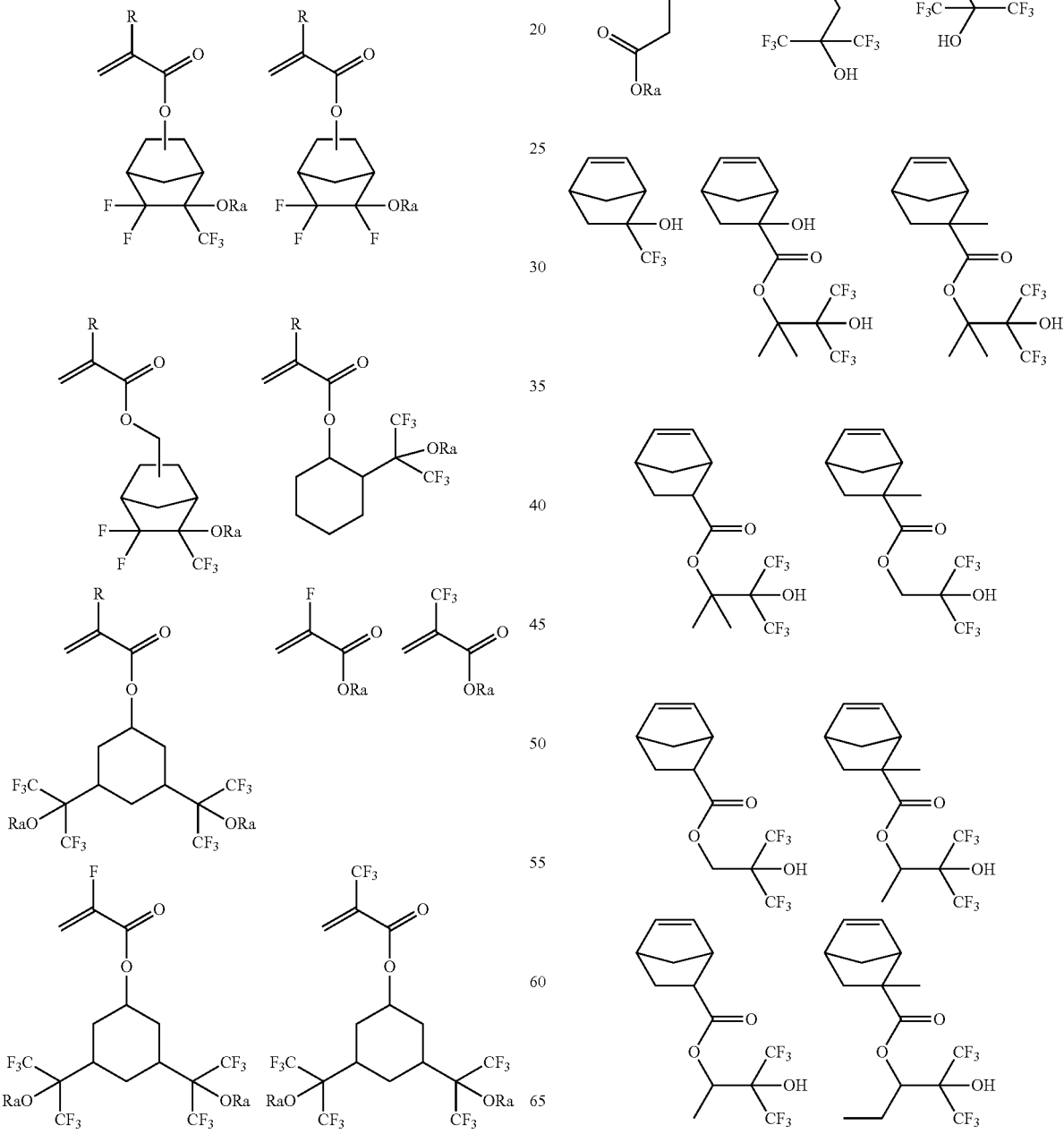

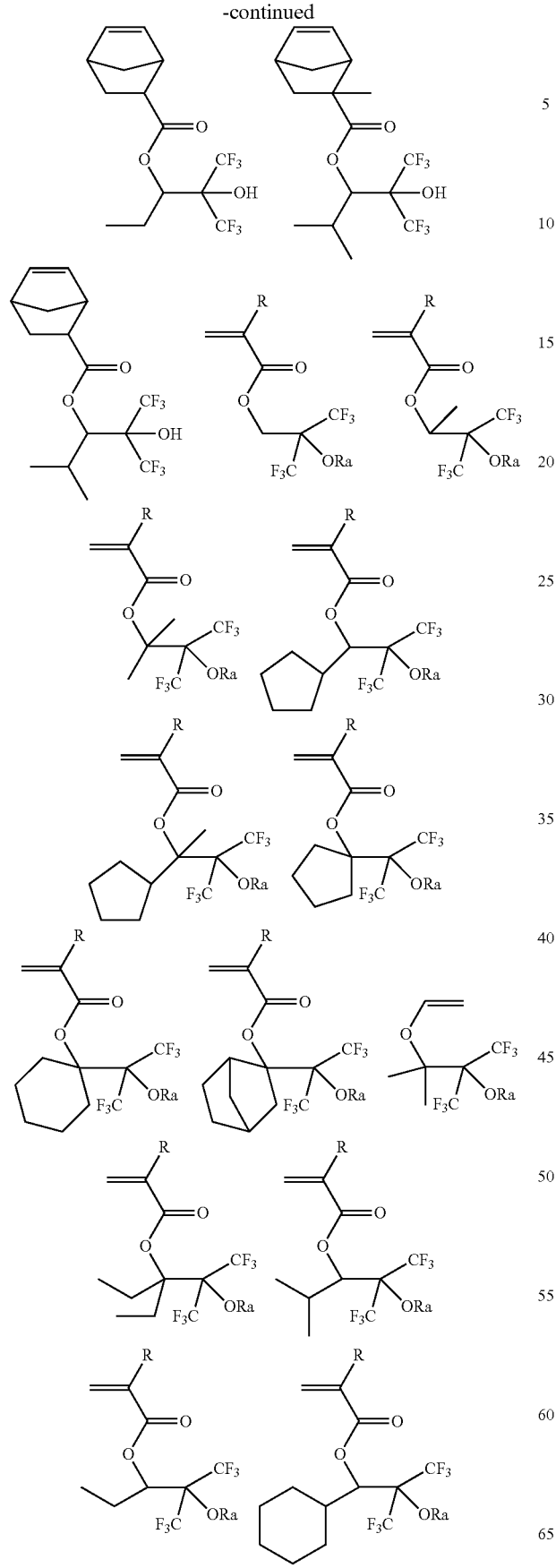
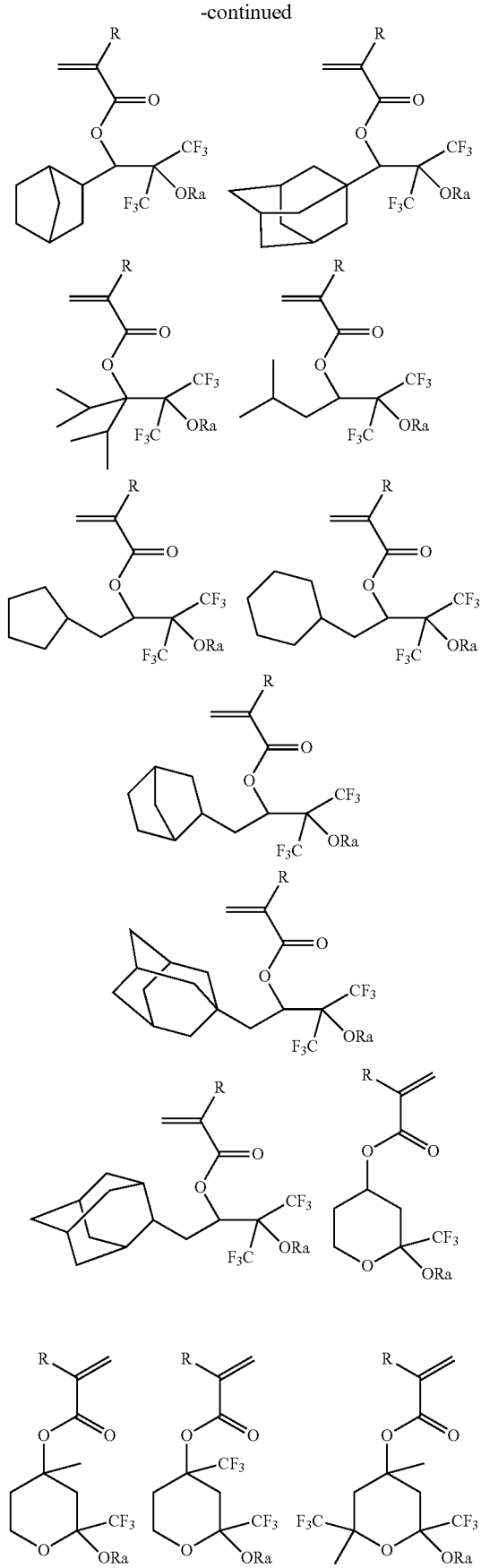

-continued

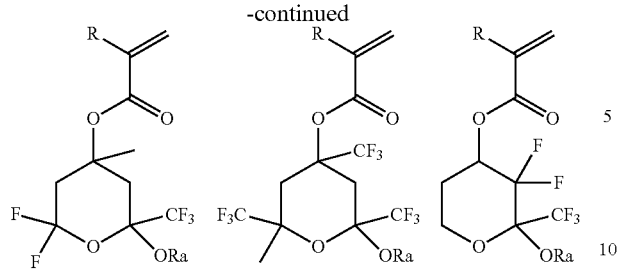
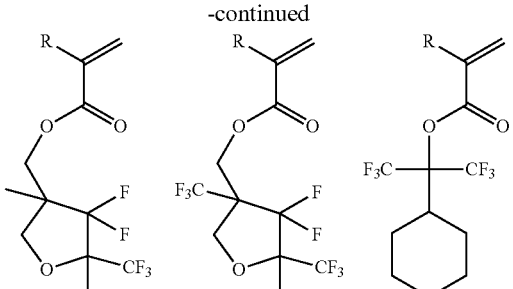
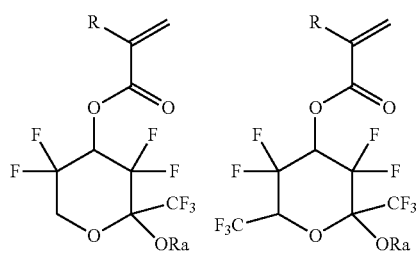
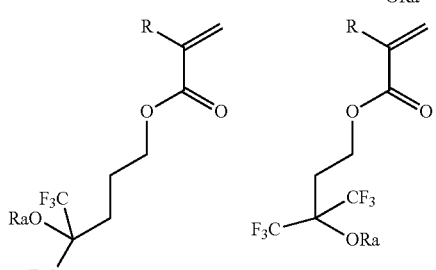
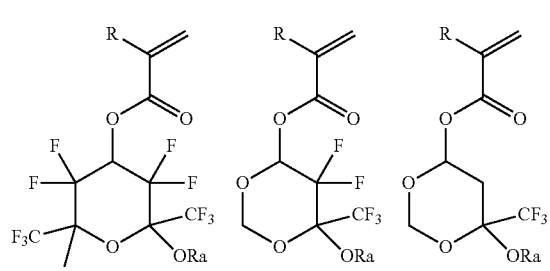
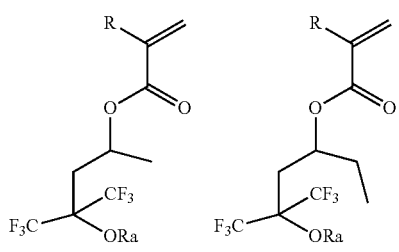
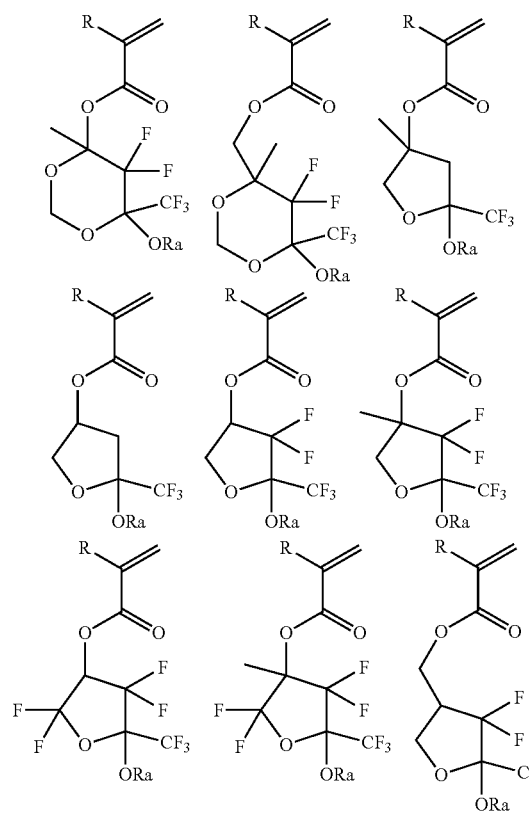

In the formulae, R represents a hydrogen atom or a methyl group, and Ra represents a hydrogen atom or an acid-labile group.

The fluorine-containing polymer compound may be either one having or without having an acid-labile group, but preferably contains an acid-labile group in order to improve the dissolution contrast. The acid-labile group can be introduced by substituting a hydroxy group(s) of the fluorine-containing repeating unit with an acid-labile group(s) or copolymerizing a repeating unit(s) without containing fluorine in which the hydroxyl group(s) or the carboxy group(s) has been substituted with an acid-labile group(s).

The following are exemplified as a monomer to obtain a repeating unit without containing fluorine in which the hydroxyl group or the carboxy group has been substituted with an acid-labile group.

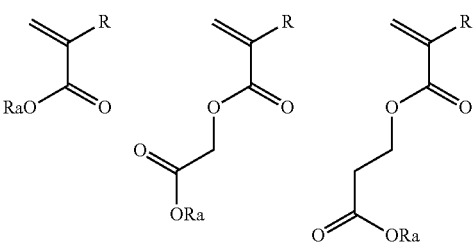

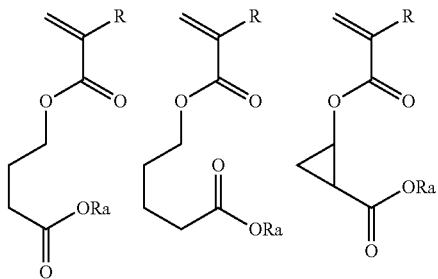

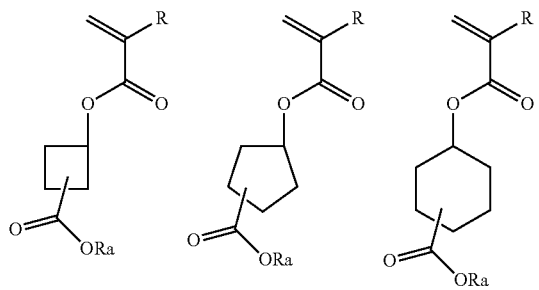

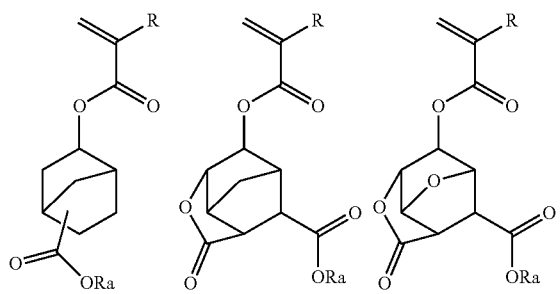

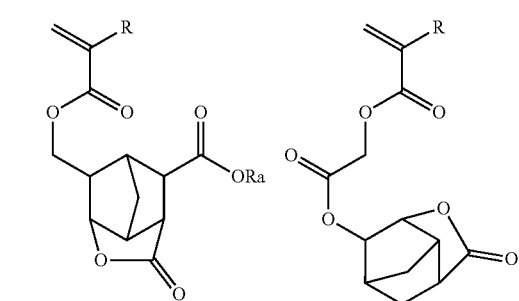

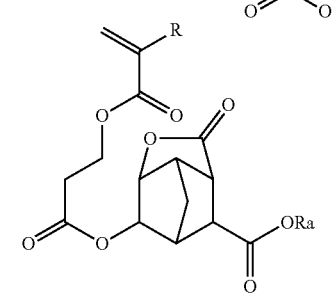

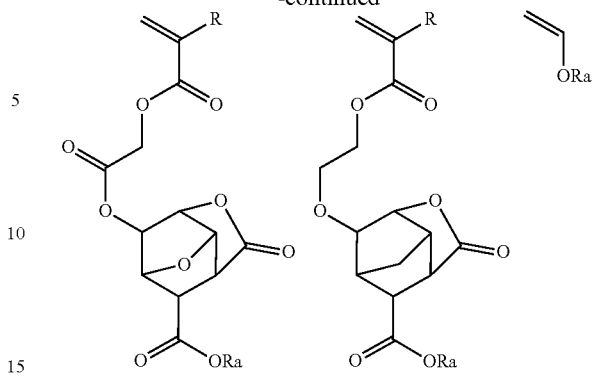

In the formulae, R represents a hydrogen atom or a methyl group, and Ra represents a hydrogen atom or an acid-labile group.

Each acid-labile group Ra may be the same or different and selected from various kinds of groups. Illustrative examples thereof particularly include the group substituted with any of the groups of the following formulae (A-1) to (A-3).

$$\begin{array}{cc} -(CH_2)_{A1}-\overset{O}{\underset{\|}{C}}-O-R^{L30} & \text{(A-1)} \end{array}$$

$$\begin{array}{c} R^{L31} \\ -\overset{|}{\underset{|}{C}}-O-R^{L33} \\ R^{L32} \end{array} \quad \text{(A-2)}$$

$$\begin{array}{c} R^{L34} \\ -\overset{|}{\underset{|}{C}}-R^{L36} \\ R^{L35} \end{array} \quad \text{(A-3)}$$

In the formula (A-1), $R^{L30}$ represents a tertiary alkyl group having 4 to 20, preferably 4 to 15 carbon atoms, a trialkylsilyl group in which each alkyl group has 1 to 6 carbon atoms, an oxoalkyl group having 4 to 20 carbon atoms, or a group shown by the formula (A-3); and illustrative examples of the tertiary alkyl group include a tert-butyl group, a tert-amyl group, a 1,1-diethylpropyl group, 1-ethylcyclopentyl group, 1-butyloyclopentyl group, 1-ethylcyclohexyl group, 1-butylcyolohexyl group, 1-ethyl-2-cyclopentenyl group, 1-ethyl-2-cyclohexenyl group, and 2-methyl-2-adamantyl group; illustrative examples of the trialkylsilyl group include a trimethylsilyl group, a triethylsilyl group, and a dimethyl-tert-butylsilyl group; illustrative examples of the oxoalkyl group include a 3-oxocyclohexyl group, a 4-methyl-2-oxooxane-4-yl group, 5-methyl-2-oxooxolan-5-yl group; and A1 is an integer of 0 to 6.

Illustrative examples of the acid-labile group of the formula (A-1) include a tert-butoxycarbonyl group, a tert-butoxycarbonylmethyl group, a tert-amyloxycarbonyl group, a tert-amyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group, and a 2-tetrahydrofuranyloxycarbonylmethyl group.

Additionally, the substituents shown by the following formulae (A-1)-1 to (A-1)-10 can be exemplified.

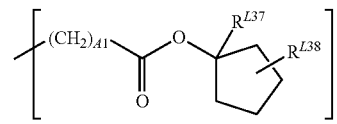
(A-1)-1

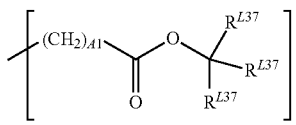
(A-1)-2

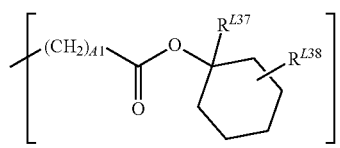
(A-1)-3

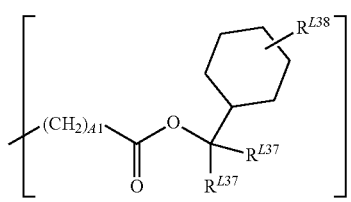
(A-1)-4

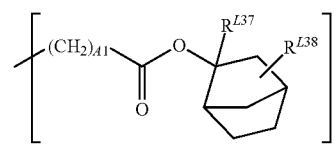
(A-1)-5

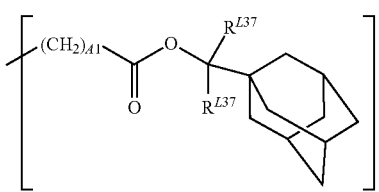
(A-1)-6

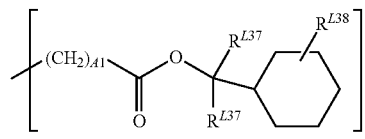
(A-1)-7

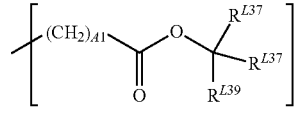
(A-1)-8

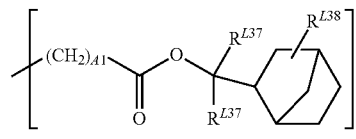
(A-1)-9

-continued

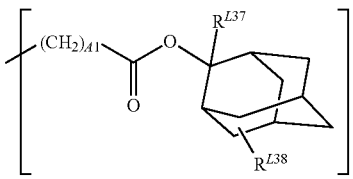
(A-1)-10

Herein, each $R^{L37}$ represents the same or different linear, branched, or cyclic alkyl group having 1 to 10 carbon atoms, or an aryl group having 6 to 20 carbon atoms; and $R^{L38}$ represents a hydrogen atom, or a linear, branched, or cyclic alkyl group having 1 to 10 carbon atoms.

Additionally, each $R^{L39}$ represents the same or different linear, branched, or cyclic alkyl group having 2 to 10 carbon atoms, or an aryl group having 6 to 20 carbon atoms; and A1 is as described above.

Among the acid-labile groups shown by the formula (A-2), the linear or branched ones include the groups of the following formulae (A-2)-1 to (A-2)-69.

$$—CH_2—O—CH_3 \quad (A-2)\text{-}1$$

$$—CH_2—O—CH_2—CH_3 \quad (A-2)\text{-}2$$

$$—CH_2—O—(CH_2)_2—CH_3 \quad (A-2)\text{-}3$$

$$—CH_2—O—(CH_2)_3—CH_3 \quad (A-2)\text{-}4$$

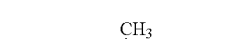
(A-2)-5

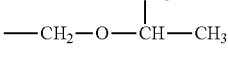
(A-2)-6

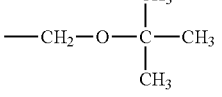
(A-2)-7

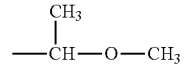
(A-2)-8

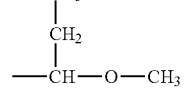
(A-2)-9

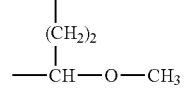
(A-2)-10

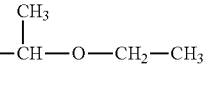
(A-2)-11

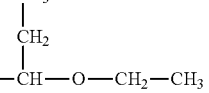
(A-2)-12

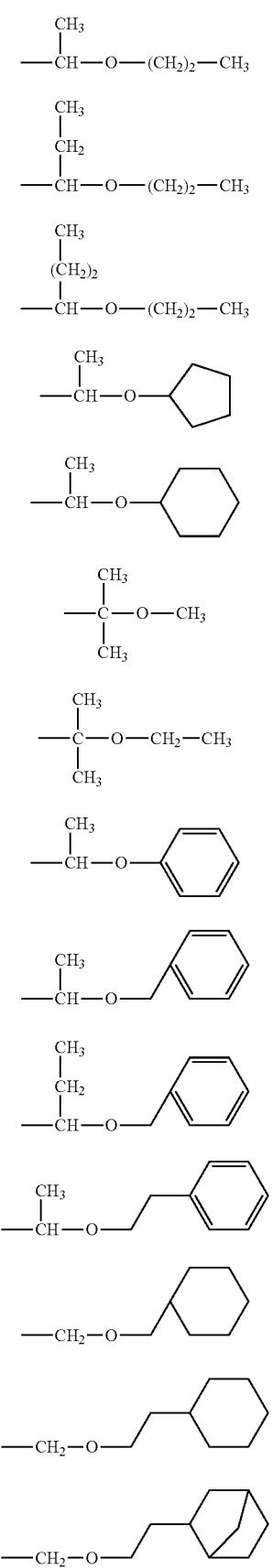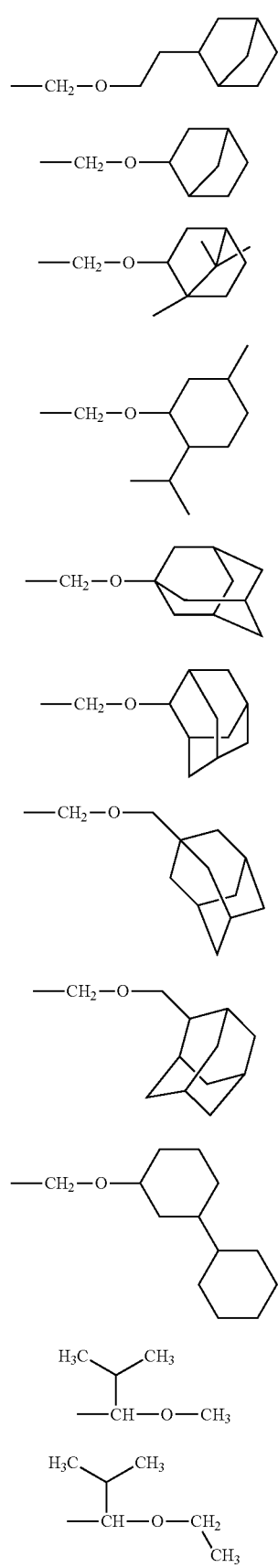

(A-2)-38 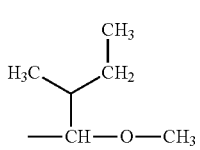
(A-2)-39 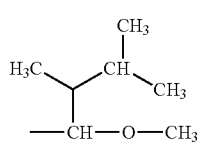
(A-2)-40 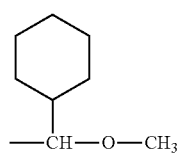
(A-2)-41 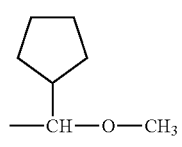
(A-2)-42 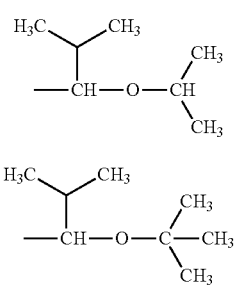
(A-2)-43 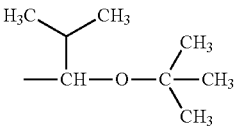
(A-2)-44 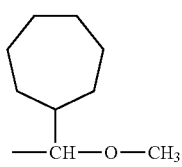
(A-2)-45 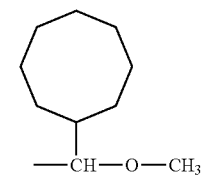
(A-2)-46 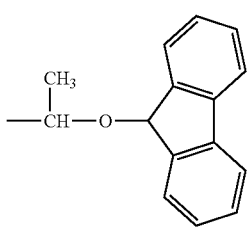
(A-2)-47 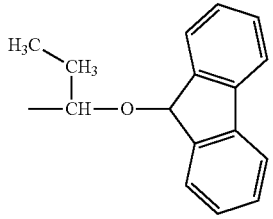
(A-2)-48 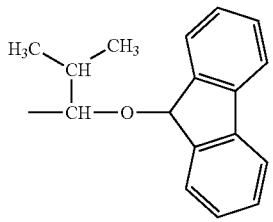
(A-2)-49 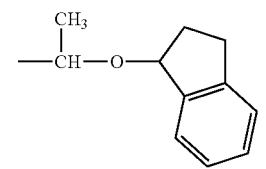
(A-2)-50 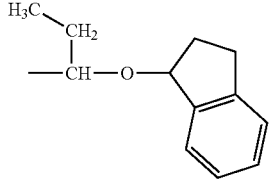
(A-2)-51 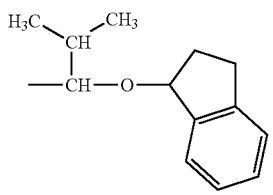
(A-2)-52 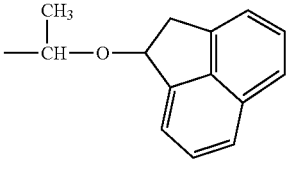
(A-2)-53 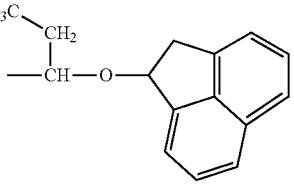
(A-2)-54 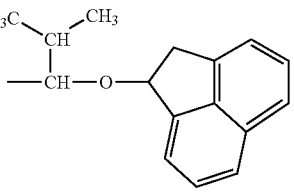

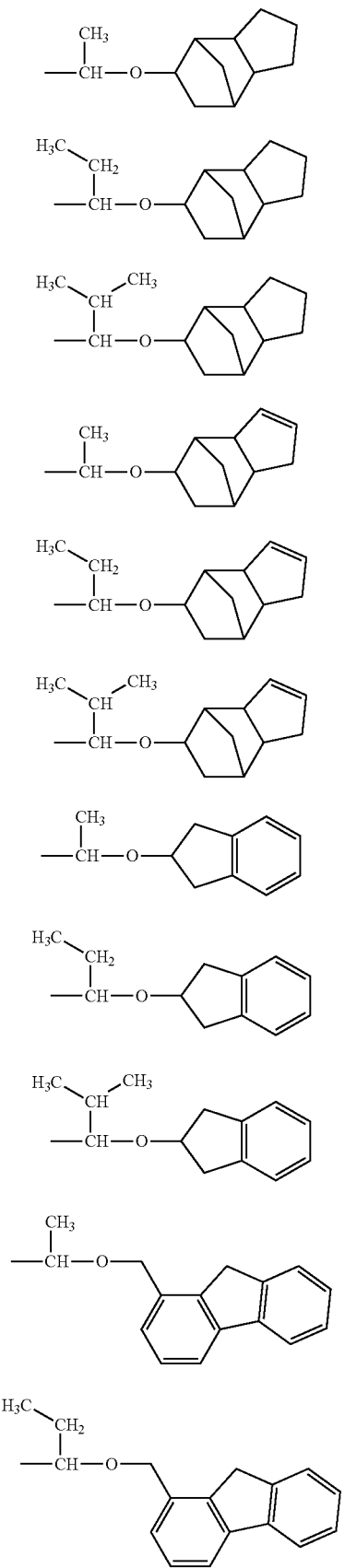
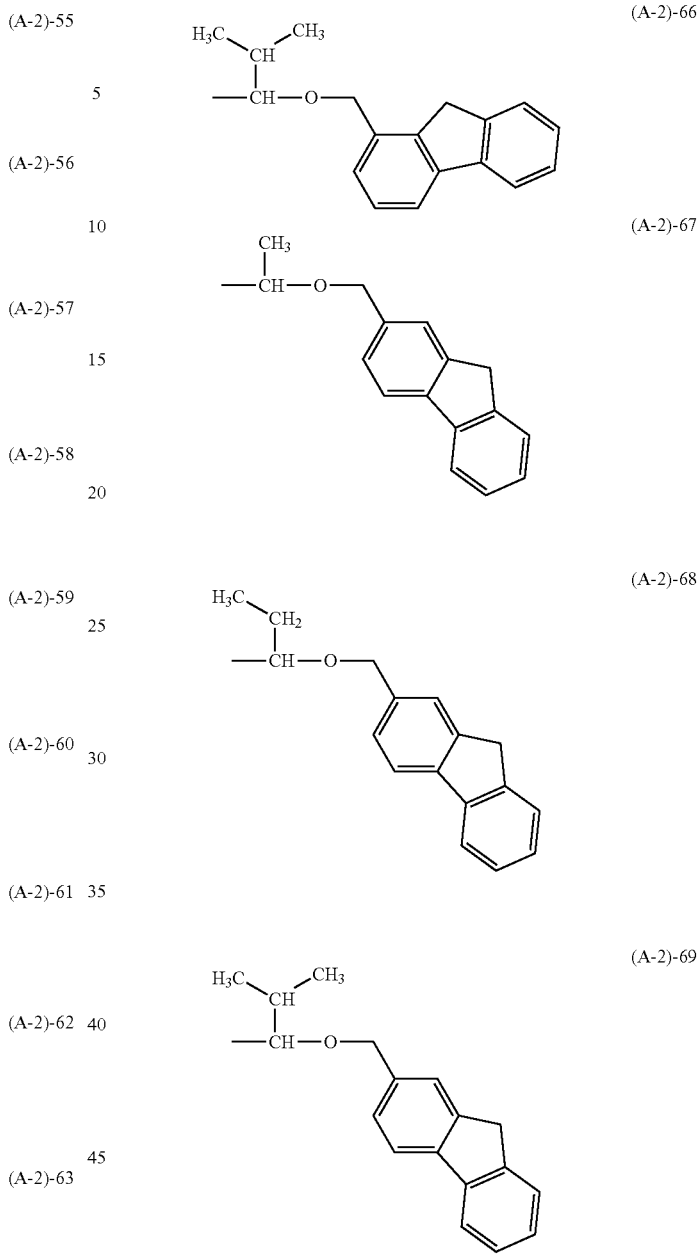

In the formula (A-2), $R^{L31}$ and $R^{L32}$ represent a hydrogen atom, or a linear, branched, or cyclic alkyl group having 1 to 18, preferably 1 to 10 carbon atoms. Illustrative examples thereof include a methyl group, an ethyl group, a propyl group, an isopropyl group, an n-butyl group, a sec-butyl group, a tert-butyl group, a cyclopentyl group, a cyclohexyl group, a 2-ethylhexyl group, and an n-octyl group. $R^{L33}$ represents a monovalent hydrocarbon group having 1 to 18, preferably 1 to 10 carbon atoms that may have a hetero atom(s) such as an oxygen atom. Illustrative examples thereof Include a linear, branched, or cyclic alkyl group, and substitutes thereof in which part of the hydrogen atoms thereof is replaced by a hydroxy group, an alkoxy group, an oxo group, an amino group, and/or an alkylamino group. Illustrative examples thereof include the following substituted alkyl groups.

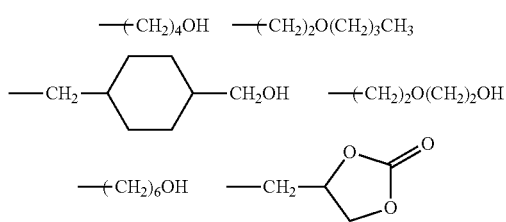

$R^{L31}$ and $R^{L32}$, $R^{L31}$ or $R^{L33}$, or $R^{L32}$ and $R^{L33}$ may be bonded with each other to form a ring together with the carbon atom bonded therewith. When they form a ring, $R^{L31}$, $R^{L32}$, and $R^{L33}$ involved to form the ring each represent a linear or branched alkylene group having 1 to 18, preferably 1 to 10 carbon atoms; and the ring preferably has 3 to 10, particularly 4 to 10 carbon atoms.

Among the acid-labile groups shown by the formula (A-2), the cyclic ones include a tetrahydrofuran-2-yl group, a 2-methyltetrahydrofuran-2-yl group, a tetrahydropyran-2-yl group, and a 2-methyltetrahydropyran-2-yl group.

The polymer may be processed by intermolecular crosslinking or intramolecular crosslinking as shown in the following formula (A-2a) or (A-2b).

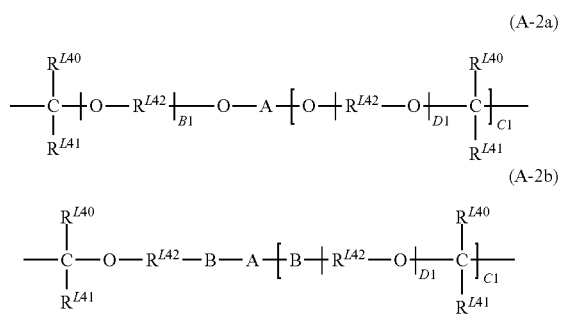

In the formulae, $R^{L40}$ and $R^{L41}$ represent a hydrogen atom, or a linear, branched, or cyclic alkyl group having 1 to 3 carbon atoms. Alternatively, $R^{L40}$ and $R^{L41}$ may be bonded with each other to form a ring together with the carbon atom bonded therewith. When they form a ring, $R^{L40}$ and $R^{L41}$ represent a linear or branched alkylene group having 1 to 8 carbon atoms. $R^{L42}$ represents a linear, branched, or cyclic alkylene group having 1 to 10 carbon atoms; B1 and D1 are integers of 0 or 1 to 10, preferably 0 or 1 to 5; and C1 is an integer of 1 to 7. "A" represents an aliphatic or alicyclic saturated hydrocarbon group having 1 to 50 carbon atoms, an aromatic hydrocarbon group, or a heterocyclic group with (C1+1) valent, and these groups may contain an interposing hetero atom, or part of the hydrogen atom on the carbon atom thereof may be replaced by a hydroxy group, a carboxy group, a carbonyl group, or a fluorine atom. B represents —CO—O—, —NHCO—O—, or —NHCONH—.

In this case, "A" preferably represents a linear, branched, or cyclic alkylene group, an alkyltriyl group, an alkyltetrayl group with di to tetravalent having 1 to 20 carbon atoms, and an arylene group having 6 to 30 carbon atoms, and these groups may contain an interposing hetero atom, or part of the hydrogen atom on the carbon atom thereof may be replaced by a hydroxy group, a carboxy group, an acyl group, or a halogen atom. C1 is preferably an integer of 1 to 3.

Illustrative examples of the crosslinkable acetal group shown by the formulae (A-2a) and (A-2b) include the groups of the following formulae (A-2)-70 to (A-2)-77.

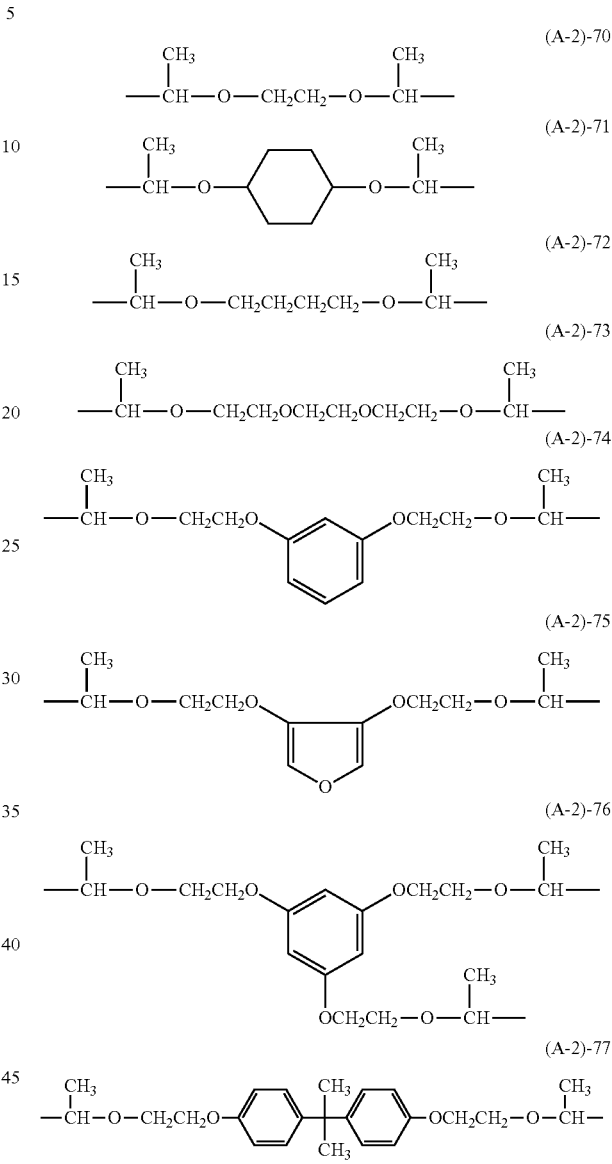

In the formula (A-3), $R^{L34}$, $R^{L35}$, and $R^{L36}$ represent a monovalent hydrocarbon group such as a linear, branched, or cyclic alkyl group having 1 to 20 carbon atoms, or a linear, branched, or cyclic alkenyl group having 2 to 20 carbon atoms; and may contain a hetero atoms, such as an oxygen atom, a sulfur atom, a nitrogen atom, and/or a fluorine atom; and $R^{L34}$ and $R^{L35}$, $R^{L34}$ and $R^{L35}$, or $R^{L35}$ and $R^{L36}$ may be bonded with each other to form an aliphatic ring having 3 to 20 carbon atoms, together with the carbon atom bonded therewith.

Illustrative examples of the tertiary alkyl group shown by the formula (A-3) include a tert-butyl group, a triethylcarbyl group, a 1-ethylnorbonyl group, a 1-methylcyclohexyl group, a 1-ethylcyclopentyl group, a 2-(2-methyl) adamantyl group, a 2-(2-ethyl)adamantyl group, and a tert-amyl group.

Illustrative examples of the tertiary alkyl group include the groups of the following formulae (A-3)-1 to (A-3)-18.

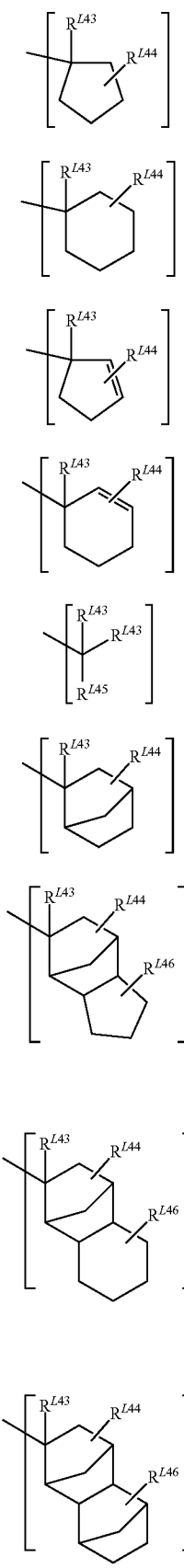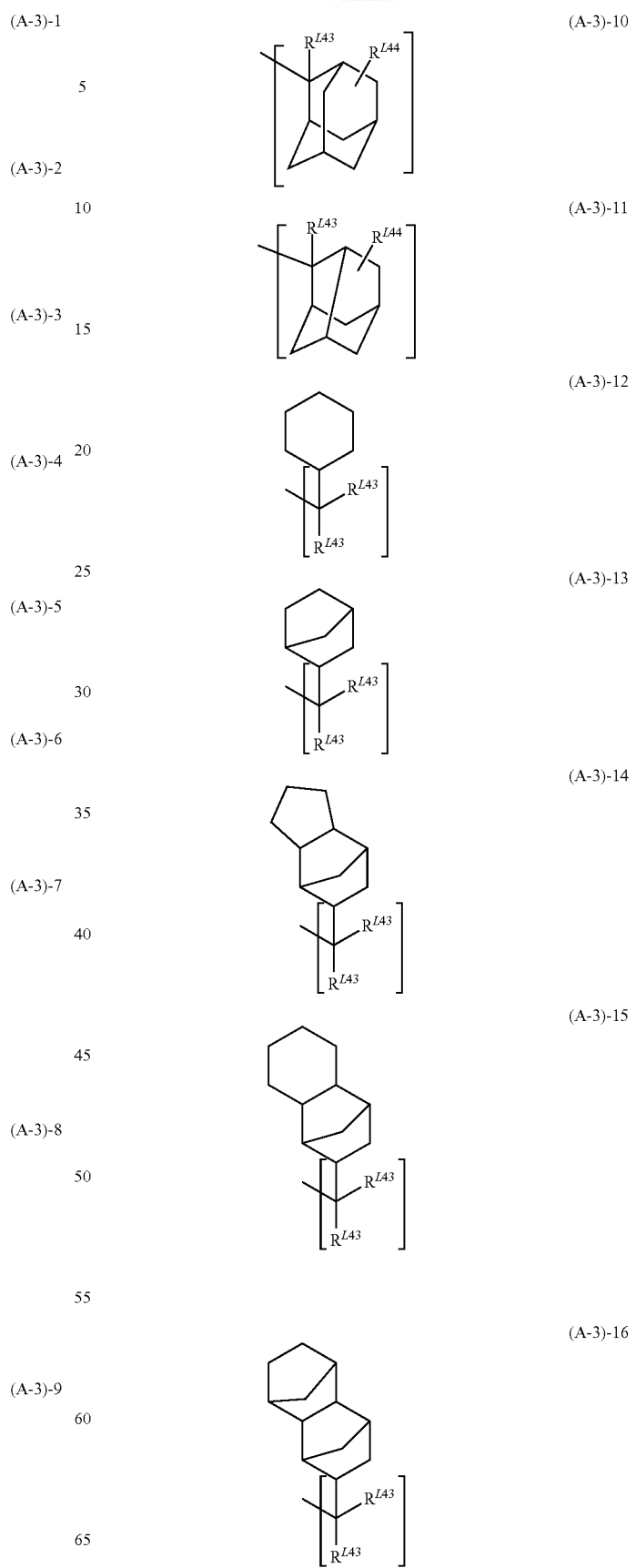

-continued

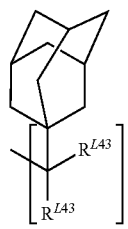
(A-3)-17

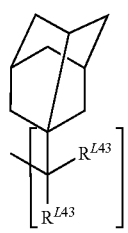
(A-3)-18

In the formulae (A-3)-1 to (A-3)-18, each $R^{L43}$ represents the same or different linear, branched, or cyclic alkyl group having 1 to 8 carbon atoms, or an aryl group having 6 to 20 carbon atoms such as a phenyl group. $R^{L44}$ and $R^{L45}$ represent a hydrogen atom, or a linear, branched, or cyclic alkyl group having 1 to 20 carbon atoms. $R^{L45}$ represents an aryl group having 6 to 20 carbon atoms such as a phenyl group.

Additionally, the polymer may be processed by intramolecular crosslinking or intermolecular crosslinking containing $R^{L47}$, which is a di- or more-valent alkylene group or arylene group, as shown in the following formulae (A-3)-19 and (A-3)-20.

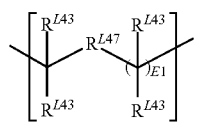
(A-3)-19

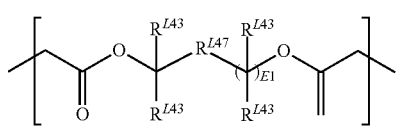
(A-3)-20

In the formulae (A-3)-19 and (A-3)-20, $R^{L43}$ is as described above; and $R^{L47}$ represents a linear, branched, or cyclic alkylene group having 1 to 20 carbon atoms, or an arylene group such as a phenylene group, and may contain a hetero atom(s) such as an oxygen atom, a sulfur atom, and a nitrogen atom. E1 is an integer of 1 to 3.

The high-refractive-index polymer compound and the low-refractive-index polymer compound described above are suitable, particularly for base resins of a positive type resist material for forming a pattern in which the upper part of the pattern has a lower refractive index, and the part at the side of the support base has a higher refractive index. In a positive type resist material composed of these polymer compounds as a base resin, together with organic solvent, an acid, generator, a basic compound, and surfactant formulated thereto being appropriately combined in accordance with needs, the polymer compound dissolves into developer at an accelerated rate in the exposed part due to catalytic reaction, thereby allowing the positive type resist material to have extremely high sensitivity, to form a resist film with high dissolution contrast and resolution, to have exposure margin and an excellent process adaptability, and to form a moth eye pattern in which the refractive index is low at the side away from the support base and enlarging toward the support base with respect to visible light after exposure.

The blend ratio of the high-refractive-index polymer compound and the low-refractive-index polymer compound is preferably in a range of 0.01 or more and 0.5 or less when the weight of the low-refractive-index polymer compound is the numerator and the weight of the high-refractive-index polymer compound is the denominator. The range is more preferably 0.05 or more and 0.4 or less.

Additionally, the resist material is allowed to decrease diffusion rate of acid in the resist film to further improve the resolution by adding a basic compound, and the application property of the resist material is more improved or controllable by adding surfactant.

The resist material may contain an acid generator to activate the chemically amplified positive type resist material used for the patterning process of the production method that will be described later, for example, a compound capable of generating an acid by responding to an active beam or a radiation beam (photo acid generator) may be contained therein. As to the photo acid generator component, any compound capable of generating an acid by exposure to a high energy beam can be used. Examples of the suitable photo acid generator include a sulfonium salt, an iodonium salt, a sulfonyldiazomethane, an N-sulfonyloxyimide, and an oxime-O-sulfonate type acid generator.

Illustrative examples of the acid-generator are described in paragraphs [0122] to [0142] of JP 2008-111103A, for example. These compounds may be used solely or as a mixture of two or more.

Illustrative examples of the components that can be formulated to the resist material include organic solvent, a basic compound (quencher), and surfactant described in paragraphs [0144] to [0145], paragraphs [0164],[0164], and paragraphs [0165] to [0166] of JP 2008-111103A respectively, together with dissolution inhibitor described in paragraphs [0155] to [0178] of JP 2008-122932A. It is also possible to add a polymer type quencher described in JP 2008-239918A. In accordance with needs, acetylene alcohols can be added as an optional component, and illustrative examples thereof include acetylene alcohols described in paragraphs [0179] [0182] of JP 2008-122932A.

These components orient on the resist surface after coating thereof to improve the profile accuracy after the patterning. The polymer-type quencher also has the effects to prevent film loss of the pattern when a top coat for Immersion exposure is formed thereon, as well as rounding of the pattern head.

When the acid generator is formulated, the formulate amount is preferably 0.1 to 50 parts by mass based on 100 parts by mass of the base resin. When the basic compound (quencher) is formulate, the formulate amount is preferably 0.01 to 20 parts by mass, particularly 0.02 to 15 parts by mass based on 100 parts by mass of the base resin. When the dissolution inhibitor is formulated, the formulate amount is preferably 0.5 to 50 parts by mass, particularly 1.0 to 30 parts by mass based on 100 parts by mass of the base resin. When the surfactant is formulated, the formulate amount is preferably 0.0001 to 10 parts by mass, particularly 0.001 to 5 parts by mass based on 100 parts by mass of the base resin. The formulate amount of organic solvent is preferably 100 to 10,000 parts by mass, particularly 200 to 8,000 parts by mass based on 100 parts by mass of the base resin.

[Support Base]

The support base can be any material as far as it can support the moth eye pattern, such as an underlayer film and a substrate without being particularly limited thereto. The underlayer film may be any of an organic film and an inorganic film. It is also possible to form a moth eye pattern directly on a substrate without providing an underlayer film. However, the underlayer film and the substrate are preferable to be highly transparent with respect to visible light. Additionally, it is also preferable that the substrate and the underlayer film each have higher refractive index. When a substrate is used as the support base, it is preferable to use a substrate treated with HMDS (Hexamethyldisilazan).

[Low-Refractive-Index Material]

FIG. 2 is a schematic sectional view showing an example of the inventive antireflective film in which the moth eye patterns 13 are coated with the low-refractive-index material 14. As shown in FIG. 2, the gaps between the moth eye patterns 13, which are formed by exposing and developing photoresist, are buried by the low-refractive-index material 14 to form an antireflective film 111. Since collapsing of the moth eye patterns 13 causes lowering of the antireflection effect, the burying of the moth eye patterns 13 is also effective to prevent the moth eye pattern 13 from collapsing when it is touched.

As the low-refractive-index material for burring the moth eye pattern, a material that is applicable by spin-coating is preferable, and fluorine polymers can be exemplified, for example. Additionally, the low-refractive-index material preferably has a refractive index of 1.45 or less. Teflon (trade mark) type polymer has a refractive index of 1.35 in the area of visible light. Even in methacrylate having a pendant fluoroalkyl group, the refractive index is about 1.42. For example, JP 2008-257188A shows a crosslinkable underlayer film with a lower refractive index having a fluoroalcohol group. As a material with a still lower refractive index, porous silica films can be exemplified. The refractive index is decreased by enlarging the size of the pores or increasing the ratio of the pores, and can be decreased to about 1.25 thereby.

The low-refractive-index material for burring the moth eye pattern is preferably dissolved into a solvent that does not dissolve a resist pattern and applied onto a moth eye pattern by spin-coating. Illustrative examples of the solvent that does not dissolve a resist pattern include alcohol type solvents, ether type solvents, hydrocarbon type solvents, and fluorine type solvents.

The inventive antireflective film, in which a moth eye structure is formed, allows the image projected from a display of liquid crystal, organic EL, or micro LED to emit obliquely with high brightness and high contrast. It is also possible to prevent reflection of oblique incident light from the opposite side of a display not only reflection in which light emitted from the display side returns to the display side.

<Eyeglass Type Display>

The present invention also provides an eyeglass type display, comprising:

a self-emitting display selected from the group consisting of liquid crystal, organic EL, and micro LED installed on a substrate at the side of an eyeball of the eyeglass type display, and a convex lens for focusing installed on the side of an eyeball of the self-emitting display, wherein the inventive antireflective film is formed on a surface of the convex lens.

FIG. 5 is a schematic sectional view shoving an example of the case of wearing the inventive eyeglass type display. The self-emitting display 2 is provided at the side of an eyeball of the eyeglass type display 1. The self-emitting display 2 is made of any of liquid crystal, organic EL, or micro LED. The convex lens 3 is provided on the side of an eyeball of the self-emitting display 2. Each convex lens 3 is provided for focusing light emitted from the self-emitting display 2 on the eye 5. The inventive antireflective film 101 is provided at the side of an eyeball of the convex lens 3. The antireflective film 101 is as described above. It is also possible to use the antireflective film 111 instead of the antireflective film 101.

The inventive eyeglass type display makes it possible to realize an eyeglass type display, which is substantially light in weight and thin compared to previous head mount displays.

<Method of Producing Antireflective Film>

The present invention also provides a method of producing an antireflective film, comprising:

coating a support base with a photoresist material that contains an aromatic group-containing polymer compound and a fluorine-containing polymer compound, baking the photoresist material to segregate the fluorine-containing polymer compound at a film surface, and subsequently exposing and developing the photoresist material to form a pattern having a larger size and a larger refractive index at a point closer to the support base.

As a support base, an aromatic group-containing polymer compound, and a fluorine-containing polymer compound used in this process, it is possible to use ones described in the explanation of the inventive antireflective film.

The inventive method of producing an antireflective film preferably includes a step of applying the photoresist material described above onto a support base, a step of heat treatment followed by exposure to high energy beam, and a step of development using developer.

In the step of exposure to high energy beam, it is possible to use a light source such as ArF excimer laser at a wavelength of 193 nm, KrF excimer laser at a wavelength of 248 nm, i-beam at a wavelength of 365 nm, and accelerated electron beam.

For example, the photoresist material described above is applied onto a substrate for manufacturing an integrated circuit or a layer to be processed on the substrate (Si, $SiO_2$, SiN, SiON, TiN, WSi, BPSG, SOG, an organic antireflective film; a flexible substrate of thin film glass, PEN, PET, or polyimide; or a device on which an organic EL, liquid crystal, or micro LSD have been formed) by appropriate coating method such as spin-coating, roll coating, flow-coating, dip coating, spray coating, and doctor coating to have a thickness of coating film of 0.1 to 2.0 μm. This is pre baked on a hot plate at 60 to 150° C. for 10 seconds to 30 minutes, preferably at 80 to 120° C. for 30 seconds to 20 minutes. This enables the fluorine-containing polymer compound to be segregated at the surface side. Accordingly, it is possible to form a photoresist film in which the refractive index is higher at the side of the support base and is lower at the opposite side.

Then, this is exposed to a high energy beam using a light source selected from ultraviolet beam, a far ultraviolet beam, an electron beam, an X-ray, a soft X-ray, an excimer laser, a γ-ray, a synchrotron radiation ray, and EUV to form an intended pattern through a certain mask or directly. The exposure is preferably performed to have an exposure dose of about 1 to 200 mJ/cm², particularly 10 to 100 mJ/cm², or about 0.1 to 100 μC/cm², particularly 0.5 to 50 μC/cm². Subsequently, this is subjected to PEB on a hot plate, preferably at 60 to 150° C. for 10 seconds to 30 minutes, more preferably at 80 to 120° C. for 30 seconds to 20 minutes.

Additionally, this is developed by ordinary method such as a dip method, a puddle method, and a spray method preferably using a developer of aqueous alkaline solution such as 0.1 to 5 mass %, more preferably 2 to 3 mass % of tetramethylammonium hydroxide (TMAH), choline hydroxide, tetraethylammonium hydroxide (TEAH), tetrapropylammonium hydroxide (TPAH), tetrabutylammonium hydroxide (TBAH), benzyltrimethylammonium hydroxide, and benzyltriethylammonium hydroxide, preferably for 3 seconds to 3 minutes, more preferably 5 seconds to 2 minutes. Through this development, the part irradiated with light is dissolved into the developer, and the part that have not been exposed is not dissolved, thereby forming the intended positive type pattern on the substrate.

As the mask pattern used for exposure to form a moth eye pattern, it is possible to use the one shown in JP 2010-186064A, for example. That is, it is possible to use a line-and-space pattern arranged in the Y direction and the X direction, a latticed pattern, and a dot pattern. As for the illumination, illustrative examples thereof include a method of performing dipole illumination in the X direction and the Y direction twice, and a method of performing one exposure with a cross pole illumination or annular illumination.

The inventive method of producing an antireflective film like this makes it possible to easily manufacture an antireflective film that exhibits antireflection effect with lower reflection of visible light even to incident light and emitted light with a shallow angle.

EXAMPLE

Hereinafter, the present invention will be explained specifically by showing Examples and Comparative Examples, but the present invention is not limited thereto.

As the high refractive index material and the low refractive index material for forming a moth eye pattern, High refractive index resist polymers-1 to 8 and Low refractive index resist polymers-1 to 5 obtained by radical polymerization as described below were prepared. Additionally, Underlayer film resist polymer-1 was prepared for forming an underlayer film as a support base.

High refractive index resist polymer-1
weight average molecular weight (Mw)=6,800
molecular weight distribution (Mw/Mn)=1.91

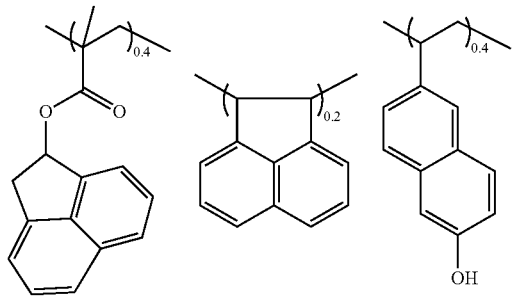

High refractive index resist polymer-1

High refractive index resist polymer-2
weight average molecular weight (Mw)=7,100
molecular weight distribution (Mw/Mn)=1.61

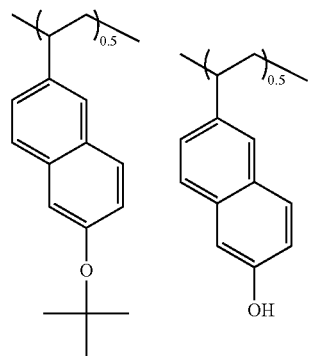

High refractive index resist polymer-2

High refractive index resist polymer-3
weight average molecular weight (Mw)=7,900
molecular weight distribution (Mw/Mn)=1.67

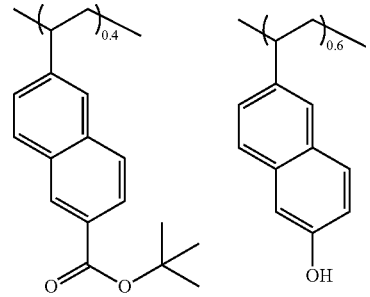

High refractive index resist polymer-3

High refractive index resist polymer-4
weight average molecular weight (Mw)=8,800
molecular weight distribution (Mw/Mn)=1.77

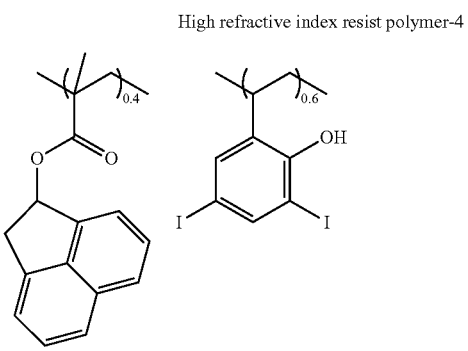

High refractive index resist polymer-4

High refractive index resist polymer-5
weight average molecular weight (Mw)=8,800
molecular weight distribution (Mw/Mn)=1.77

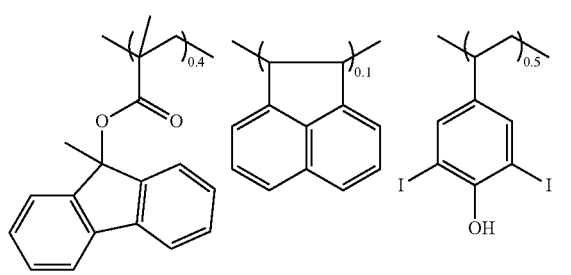

High refractive index resist polymer-5

High refractive index resist polymer-6
weight average molecular weight (Mw)=8,800
molecular weight distribution (Mw/Mn)=1.77

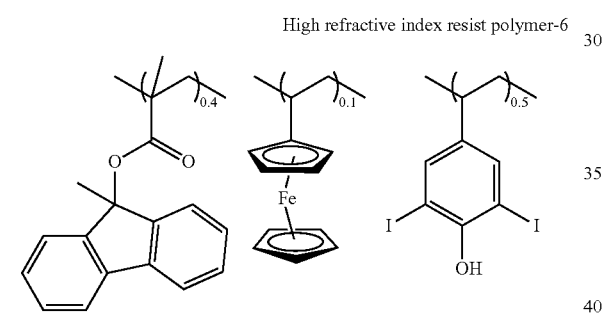

High refractive index resist polymer-6

High refractive index resist polymer-7
weight average molecular weight (Mw)=7,600
molecular weight distribution (Mw/Mn)=1.63

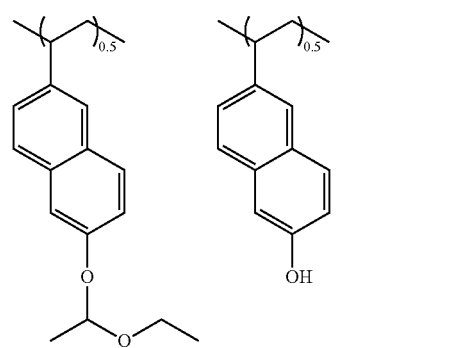

High refractive index resist polymer-7

High refractive index resist polymer-8
weight average molecular weight (Mw)=8,800
molecular weight distribution (Mw/Mn)=1.77

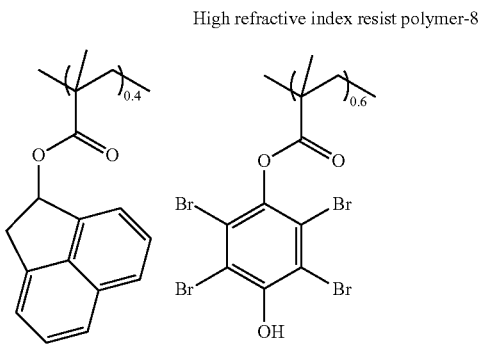

High refractive index resist polymer-8

Low refractive index resist polymer-1
weight average molecular weight (Mw)=9,300
molecular weight distribution (Mw/Mn)=1.69

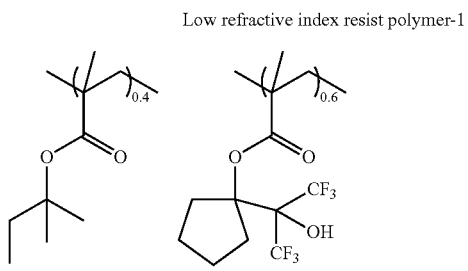

Low refractive index resist polymer-1

Low refractive index resist polymer-2
weight average molecular weight (Mw)=9,300
molecular weight distribution (Mw/Mn)=1.69

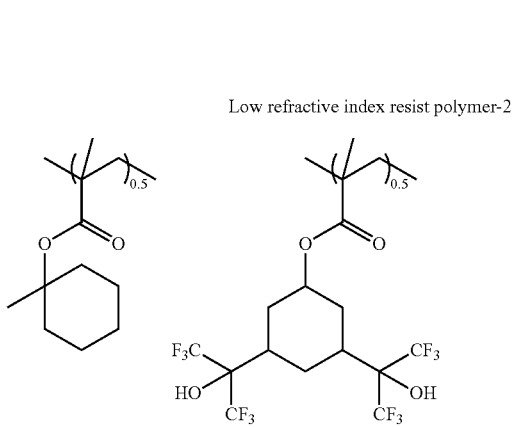

Low refractive index resist polymer-2

Low refractive index resist polymer-3
weight average molecular weight (Mw)=5,100
molecular weight distribution (Mw/Mn)=1.59

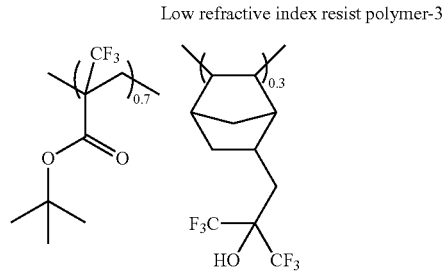

Low refractive index resist polymer-3

Low refractive index resist polymer-4
weight average molecular weight (Mw)=5,300
molecular weight distribution (Mw/Mn)=1.54

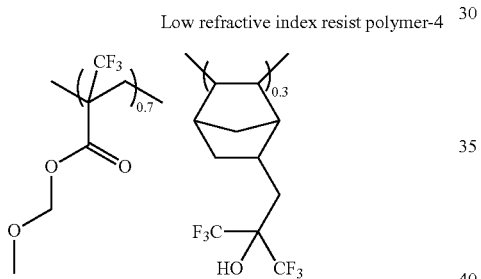

Low refractive index resist polymer-4

Low refractive index resist polymer-5
weight average molecular weight (Mw)=9,600
molecular weight distribution (Mw/Mn)=1.75

Low refractive index resist polymer-5

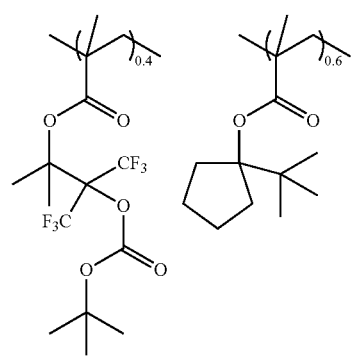

Underlayer film resist polymer-1
weight average molecular weight (Mw)=8,400
molecular weight distribution (Mw/Mn)=1.98

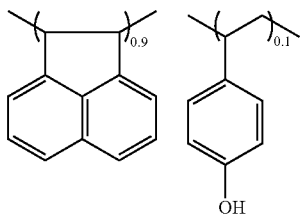

Underlayer film resist polymer-1

Photo-acid generators: PAG1, PAG2, PAG3 (see the following structural formulae)

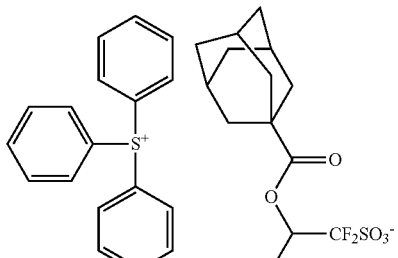

PAG 1

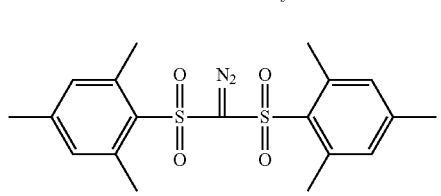

PAG 2

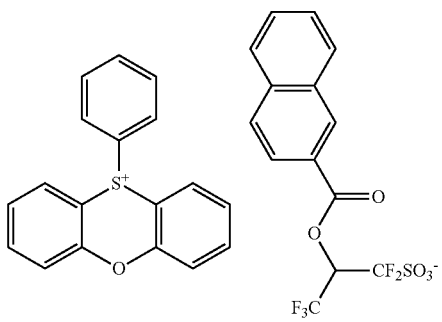

PAG 3

Basic compounds: Quenchers 1 and 2 (see the following structural formulae)

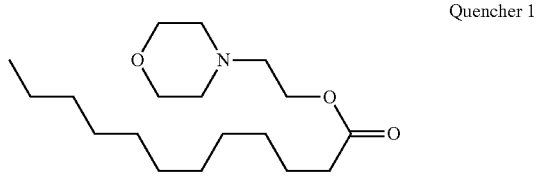

Quencher 1

Quencher 2

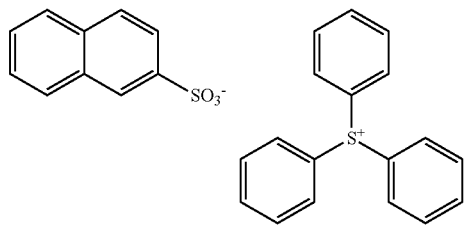

Acid generator: AG1 (see the following structural formula)

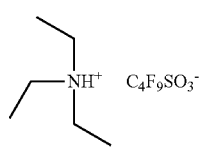

Crosslinking agent: CR1 (see the following structural formula)

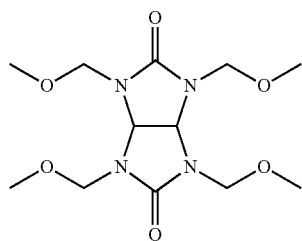

Organic Solvents:
propylene glycol monomethyl ether acetate (PGMEA)
cyclohexanone (CyH)

High refractive index resist polymer and Low refractive index resist polymer were blended with solvent containing 100 ppm of FC-4430, which is surfactant manufactured by 3M, in the composition of Table 1, spin coated onto a silicon wafer, and baked at 110° C. for 60 seconds to form a photoresist film with the film thickness of 250 nm. The refractive index of this film was measured by spectroscopic ellipsometry. The results are shown in Table 1.

TABLE 1

| Resist polymer | Solvent | Refractive index at wavelength of 600 nm | |
|---|---|---|---|
| (parts by mass) | (parts by mass) | n value | k value |
| High refractive index resist polymer-1 (15.0) | PGMEA (100) | 1.67 | 0.0 |
| High refractive index resist polymer-2 (15.0) | PGMEA (100) | 1.68 | 0.0 |
| High refractive index resist polymer-3 (15.0) | PGMEA (100) | 1.68 | 0.0 |
| High refractive index resist polymer-4 (15.0) | PGMEA (100) | 1.63 | 0.0 |
| High refractive index resist polymer-5 (15.0) | PGMEA (100) | 1.64 | 0.0 |
| High refractive index resist polymer-6 (15.0) | PGMEA (70) CyH (30) | 1.70 | 0.0 |
| High refractive index resist polymer-7 (15.0) | PGMEA (100) | 1.64 | 0.0 |
| High refractive index resist polymer-8 (15.0) | PGMEA (100) | 1.62 | 0.0 |
| Low refractive index resist polymer-1 (15.0) | PGMEA (100) | 1.48 | 0.0 |
| Low refractive index resist polymer-2 (15.0) | PGMEA (100) | 1.47 | 0.0 |
| Low refractive index resist polymer-3 (15.0) | PGMEA (100) | 1.45 | 0.0 |
| Low refractive index resist polymer-4 (15.0) | PGMEA (100) | 1.45 | 0.0 |
| Low refractive index resist polymer-5 (15.0) | PGMEA (100) | 1.44 | 0.0 |

High refractive index resist polymer, Low refractive index resist polymer. Photo-acid generator, Basic compound, and solvent containing 100 ppm of FC-4430, which is surfactant manufactured by 3M, were blended in the composition of Table 2, spin coated onto a silicon wafer, and baked at 110° C. for 60 seconds to form a photoresist film with the film thickness of 250 nm.

TABLE 2

| Resist | Resist polymers (parts by mass) | Acid generator (parts by mass) | Basic compound (parts by mass) | Solvent (parts by mass) |
|---|---|---|---|---|
| Resist-1 | High refractive index resist polymer-1 (10.0) Low refractive index resist polymer-1 (5.0) | PAG 1 (1.8) | Quencher 1 (0.5) | PGMEA (100) |
| Resist-2 | High refractive index resist polymer-2 (15.0) Low refractive index resist polymer-1 (5.0) | PAG 1 (1.8) | Quencher 1 (0.5) | PGMEA (100) |
| Resist-3 | High refractive index resist polymer-3 (15.0) Low refractive index resist polymer-1 (5.0) | PAG 1 (1.8) | Quencher 1 (0.5) | PGMEA (100) |
| Resist-4 | High refractive index resist polymer-4 (15.0) Low refractive index resist polymer-1 (5.0) | PAG 1 (1.8) | Quencher 1 (0.5) | PGMEA (100) |
| Resist-5 | High refractive index resist polymer-5 (15.0) Low refractive index resist polymer-1 (5.0) | PAG 1 (1.8) | Quencher 1 (0.5) | PGMEA (100) |
| Resist-6 | High refractive index resist polymer-6 (15.0) Low refractive index resist polymer-1 (5.0) | PAG 1 (1.8) | Quencher 1 (0.5) | PGMEA (70) CyH (30) |
| Resist-7 | High refractive index resist polymer-7 (15.0) Low refractive index resist polymer-4 (5.0) | PAG 2 (1.5) | Quencher 1 (0.5) | PGMEA (100) |
| Resist-8 | High refractive index resist polymer-1 (12.0) Low refractive index resist polymer-2 (3.0) | PAG 3 (2.0) | Quencher 2 (0.8) | PGMEA (100) |
| Resist-9 | High refractive index resist polymer-1 (13.0) Low refractive index resist polymer-3 (2.0) | PAG 3 (2.0) | Quencher 2 (0.8) | PGMEA (100) |

TABLE 2-continued

| Resist | Resist polymers (parts by mass) | Acid generator (parts by mass) | Basic compound (parts by mass) | Solvent (parts by mass) |
|---|---|---|---|---|
| Resist-10 | High refractive index resist polymer-1 (13.0) Low refractive index resist polymer-5 (2.0) | PAG 3 (2.0) | Quencher 2 (0.8) | PGMEA (100) |
| Resist-11 | High refractive index resist polymer-8 (10.0) Low refractive index resist polymer-1 (5.0)) | PAG 1 (1.8) | Quencher 1 (0.5) | PGMEA (100) |

Underlayer film polymer, Crosslinking agent, thermal-acid generator, and solvent containing 100 ppm of FC-4430, which is surfactant manufactured oy 3M, were blended in the composition of Table 3, spin coated onto a silicon wafer, and crosslinked by baking at 200° C. for 60 seconds to form an underlayer film with the film thickness of 200 nm. The refractive index of this film was measured by spectroscopic ellipsometry. The results are shown in Table 3.

TABLE 3

| Underlayer film | Polymer (parts by mass) | Crosslinking agent (parts by mass) | Acid generator (parts by mass) | Solvent (parts by mass) | Refractive index at wavelength of 600 nm | |
|---|---|---|---|---|---|---|
| | | | | | n value | k value |
| UDL-1 | Underlayer film resist polymer-1 (15.0) | CR 1 (2.0) | AG 1 (0.5) | PGMEA (100) CyH (100) | 1.69 | 0.0 |

Teflon (registered trade mark) AF polymer manufactured by Du Pont-Mitsui Fluorochemicals Co., Ltd. and solvent were blended in the composition of Table 4, spin coated onto a silicon wafer, and crosslinked by baking at 100° C. for 60 seconds to form a low refractive index-over coat film with the film thickness of 250 nm. The refractive index of this film was measured by spectroscopic ellipsometry. The results are shown in Table 4.

TABLE 4

| Top coat film | Polymer (parts by mass) | Solvent (parts by mass) | Refractive index at wavelength of 600 nm | |
|---|---|---|---|---|
| | | | n value | k value |
| TCL-1 | Teflon AF1600 (10.0) | Perfluorotributyl-amine (200) | 1.35 | 0.0 |

Onto a synthesis quartz substrate, an underlayer film solution was applied to form UDL-1 film with the film thickness of 200 nm by the same spin coat method and baking conditions as described above. The solution of photoresist was applied thereonto under the same conditions and baked at 110° C. for 60 seconds to form a photoresist film with the film thickness of 250 nm. This was exposed using KrF excimer laser scanner S-206D manufactured by Nikon Corporation (NA: 0.82, dipole illumination) and 6% half-tone phase shift mask to form a pattern in the X direction of 130 nm line-and-space and a pattern in the Y direction of 130 nm line-and-space at the same position so as to intersect with the pattern in the X direction. After the exposure, this was baked, at a temperature described in Table 5 for 60 seconds (PEB) and developed with 2.38 mass % aqueous tetramethylammonium hydroxide (TMAH) solution for 60 seconds to form a pillar pattern on the intersecting part of the line-and-space pattern.

The cross section of the developed pattern was observed and photographed to observe that a pillar pattern with the pitch of 260 nm was formed in a tapered profile with the side wall angle of 70 to 80°.

In Comparative Examples 2 and 3, the resist films were not subjected to patterning exposure.

In Example 12, a low refractive index-over coat film was formed under the same conditions as described above after a pattern was formed to bury the gaps between the patterns in TCL-1 as in FIG. 2. In Comparative Example 3, a TCL-1 film was formed on the photoresist film under the same conditions.

As shown in FIG. 6, on the antireflective film 101, the illumination intensity at the angle of 60° thereof was measured by the method in which a slit with the width of 1 mm was formed in the shielding film 103 on the back side of the synthesis quartz substrate on which the antireflective film 101 was not formed, and this slit was used as a point light source, which was illuminated with the LED illumination 104 of 1200 lumen white light in a fluorescent type attached thereto. In Comparative Examples 1 to 3, the same measurement was conducted. The results are shown in Table 5.

TABLE 5

| | Underlayer film | Resist film | Over coat film | Exposure dose (mJ/cm$^2$) | PEB temperature (° C.) | Candela (cd/m$^2$) |
|---|---|---|---|---|---|---|
| Example 1 | UDL-1 | Resist-1 | — | 41 | 120 | 16 |
| Example 2 | UDL-1 | Resist-2 | — | 24 | 110 | 17 |
| Example 3 | UDL-1 | Resist-3 | — | 28 | 110 | 16 |

TABLE 5-continued

|  | Underlayer film | Resist film | Over coat film | Exposure dose (mJ/cm$^2$) | PEB temperature (° C.) | Candela (cd/m$^2$) |
|---|---|---|---|---|---|---|
| Example 4 | UDL-1 | Resist-4 | — | 39 | 120 | 17 |
| Example 5 | UDL-1 | Resist-5 | — | 22 | 100 | 17 |
| Example 6 | UDL-1 | Resist-6 | — | 23 | 100 | 18 |
| Example 7 | UDL-1 | Resist-7 | — | 21 | 90 | 17 |
| Example 8 | UDL-1 | Resist-8 | — | 65 | 110 | 18 |
| Example 9 | UDL-1 | Resist-9 | — | 69 | 110 | 19 |
| Example 10 | UDL-1 | Resist-10 | — | 63 | 100 | 19 |
| Example 11 | — | Resist-1 | — | 32 | 110 | 15 |
| Example 12 | UDL-1 | Resist-1 | TCL-1 | 41 | 110 | 14 |
| Example 13 | UDL-1 | Resist-11 | — | 43 | 120 | 17 |
| Comparative Example 1 | — | — | — | — | — | 4 |
| Comparative Example 2 | UDL-1 | Resist-1 | — | — | — | 8 |
| Comparative Example 3 | UDL-1 | Resist-1 | TCL-1 | — | — | 9 |

As shown in Table 5, each inventive antireflective film produced in Examples 1 to 13 showed higher illumination of the transmitted light. On the other hand, Comparative Examples 1 to 3 showed lower illumination of the transmitted light than that of the inventive antireflective film.

From the foregoing, it was revealed that the inventive antireflective film successfully gave antireflection effect to bring lower reflection of light.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. An antireflective film, comprising:
   a support base, and
   a pattern composed of a photoresist material formed on the support base, the pattern having a larger size and a larger refractive index at a point closer to the support base,
   wherein the photoresist material contains an aromatic group-containing polymer compound and a fluorine-containing polymer compound, and the fluorine-containing polymer compound is segregated at the distant side from the support base.

2. The antireflective film according to claim 1, wherein the pattern has a pitch of 400 nm or less.

3. The antireflective film according to claim 2, wherein the aromatic group-containing polymer compound has a refractive index of 1.6 or more with respect to visible light having a wavelength of 590 to 610 nm, and the fluorine-containing polymer compound has a refractive index of 1.5 or less with respect to visible light having a wavelength of 590 to 610 nm.

4. The antireflective film according to claim 2, wherein the photoresist material contains a polymer compound that contains 85% or more of a repeating unit having at least one structure selected from the group consisting of naphthalene, fluorene, anthracene, and cyclopentadienyl complexes.

5. The antireflective film according to claim 1, wherein the aromatic group-containing polymer compound has a refractive index of 1.6 or more with respect to visible light having a wavelength of 590 to 610 nm, and the fluorine-containing polymer compound has a refractive index of 1.5 or less with respect to visible light having a wavelength of 590 to 610 nm.

6. The antireflective film according to claim 1, wherein the photoresist material contains a polymer compound that contains 85% or more of a repeating unit having at least one structure selected from the group consisting of naphthalene, fluorene, anthracene, and cyclopentadienyl complexes.

7. The antireflective film according to claim 1, wherein the photoresist material contains a polymer compound that contains 50% or more of a repeating unit having any of styrene substituted with iodine or bromine, benzene (meth) acrylate substituted with iodine or bromine, and benzene (meth)acrylamide substituted with iodine or bromine.

8. The antireflective film according to claim 1, wherein the pattern is covered with a low-refractive-index material having a refractive index of 1.45 or less with respect to visible light having a wavelength of 590 to 610 nm.

9. The antireflective film according to claim 1, wherein the transmittance of visible light having a wavelength of 400 to 800 nm is 80% or more.

10. An eyeglass type display, comprising:
    a self-emitting display selected from the group consisting of liquid crystal, organic EL, and micro LED installed on a substrate at the side of an eyeball of the eyeglass type display, and
    a convex lens for focusing installed on the side of an eyeball of the self-emitting display,
    wherein the antireflective film according to claim 1 is formed on a surface of the convex lens.

11. A method of producing an antireflective film, comprising:
    coating a support base with a photoresist material that contains an aromatic group-containing polymer compound and a fluorine-containing polymer compound,
    baking the photoresist material to segregate the fluorine-containing polymer compound at a film surface, and subsequently
    exposing and developing the photoresist material to form a pattern having a larger size and a larger refractive index at a point closer to the support base.

12. The method of producing an antireflective film according to claim 11, wherein the pattern has a pitch of 400 nm or less.

13. The method of producing an antireflective film according to claim 11, wherein the aromatic group-containing polymer compound has a refractive index of 1.6 or more with respect to visible light having a wavelength of 590 to 610 nm, and the fluorine-containing polymer compound has a refractive index of 1.5 or less with respect to visible light having a wavelength of 590 to 610 nm.

14. The method of producing an antireflective film according to claim 11, wherein the photoresist material contains a polymer compound that contains 85% or more of a repeating unit having at least one structure selected from the group consisting of naphthalene, fluorene, anthracene, and cyclopentadienyl complexes.

15. The method of producing an antireflective film according to claim 11, wherein the photoresist material contains a polymer compound that contains 50% or more of a repeating unit having any of styrene substituted with iodine or bromine, benzene (meth)acrylate substituted with iodine or bromine, and benzene (meth)acrylamide substituted with iodine or bromine.

16. The method of producing an antireflective film according to claim 11, further comprising, after forming the pattern, covering the pattern with a low-refractive-index material having a refractive index of 1.45 or less with respect to visible light having a wavelength of 590 to 610 nm.

\* \* \* \* \*